United States Patent [19]
Imai et al.

[11] Patent Number: 5,502,311
[45] Date of Patent: Mar. 26, 1996

[54] METHOD OF AND APPARATUS FOR DETECTING PLANE POSITION

[75] Inventors: Yuji Imai, Ohmiya; Yasuaki Tanaka, Chigasaki; Shinji Wakamoto, Tokyo, all of Japan

[73] Assignee: Nikon Corporation, Tokyo, Japan

[21] Appl. No.: 421,026

[22] Filed: Apr. 13, 1995

Related U.S. Application Data

[63] Continuation of Ser. No. 113,815, Aug. 31, 1993, which is a continuation-in-part of Ser. No. 3,451, Jan. 12, 1993, abandoned.

[30] Foreign Application Priority Data

| Jan. 17, 1992 | [JP] | Japan | 4-006407 |
| Mar. 2, 1992 | [JP] | Japan | 4-044723 |
| Mar. 25, 1992 | [JP] | Japan | 4-067345 |
| Sep. 2, 1992 | [JP] | Japan | 4-233987 |
| Sep. 4, 1992 | [JP] | Japan | 4-237163 |

[51] Int. Cl.⁶ .................................................. G01N 2/86
[52] U.S. Cl. .................................. 250/548; 250/557
[58] Field of Search .................................. 250/548, 557; 356/400, 401

[56] References Cited

U.S. PATENT DOCUMENTS

| 4,699,515 | 10/1987 | Tanimoto et al. | 356/40 |
| 4,853,745 | 8/1989 | Kamiya et al. | 355/43 |
| 4,902,900 | 2/1990 | Kamiya et al. | 250/548 |
| 4,962,318 | 10/1990 | Nishi | 356/401 |
| 5,015,866 | 5/1991 | Hayashi | 250/548 |
| 5,153,678 | 10/1992 | Ota | 250/557 |
| 5,241,188 | 8/1993 | Mizutani | 356/401 |
| 5,323,016 | 6/1994 | Yamada et al. | 356/401 |

OTHER PUBLICATIONS

*SPIE Optical/Laser Microlithography V*, vol. 1674, 1992, pp. 741–752.

*Primary Examiner*—William L. Sikes
*Assistant Examiner*—James A. Dudek
*Attorney, Agent, or Firm*—Shapiro and Shapiro

[57] ABSTRACT

A plane positioning apparatus comprises a projector for projecting beams to a given portion on the surface of a substrate in a diagonal direction, a light receiving device to receive beams reflected from the substrate surface and output photoelectric signals in accordance with variation of the light receiving position, a calculating circuit to output deviation signals in accordance with the deviation amount of the substrate surface with respect to a predetermined fiducial plane based on the deviation signals, a substrate shifting device to shift and set the substrate at a given position in a direction perpendicular to the fiducial plane in accordance with the deviation signals, a level variation detecting device to detect level variation of the deviation signals generated when the substrate surface and the fiducial plane are displaced interrelatedly, an inclination calculating device to calculate, in accordance with the level variation characteristics, the value of the inclination of the level variation characteristics at a point where the substrate surface and the fiducial plane are substantially matched, and a correction device to correct the allowable range set for the level variation characteristics in order to control the substrate shifting device in accordance with the difference between the inclination value and the fiducial value thus calculated.

29 Claims, 30 Drawing Sheets

| FIG. 22A |
| FIG. 22B |

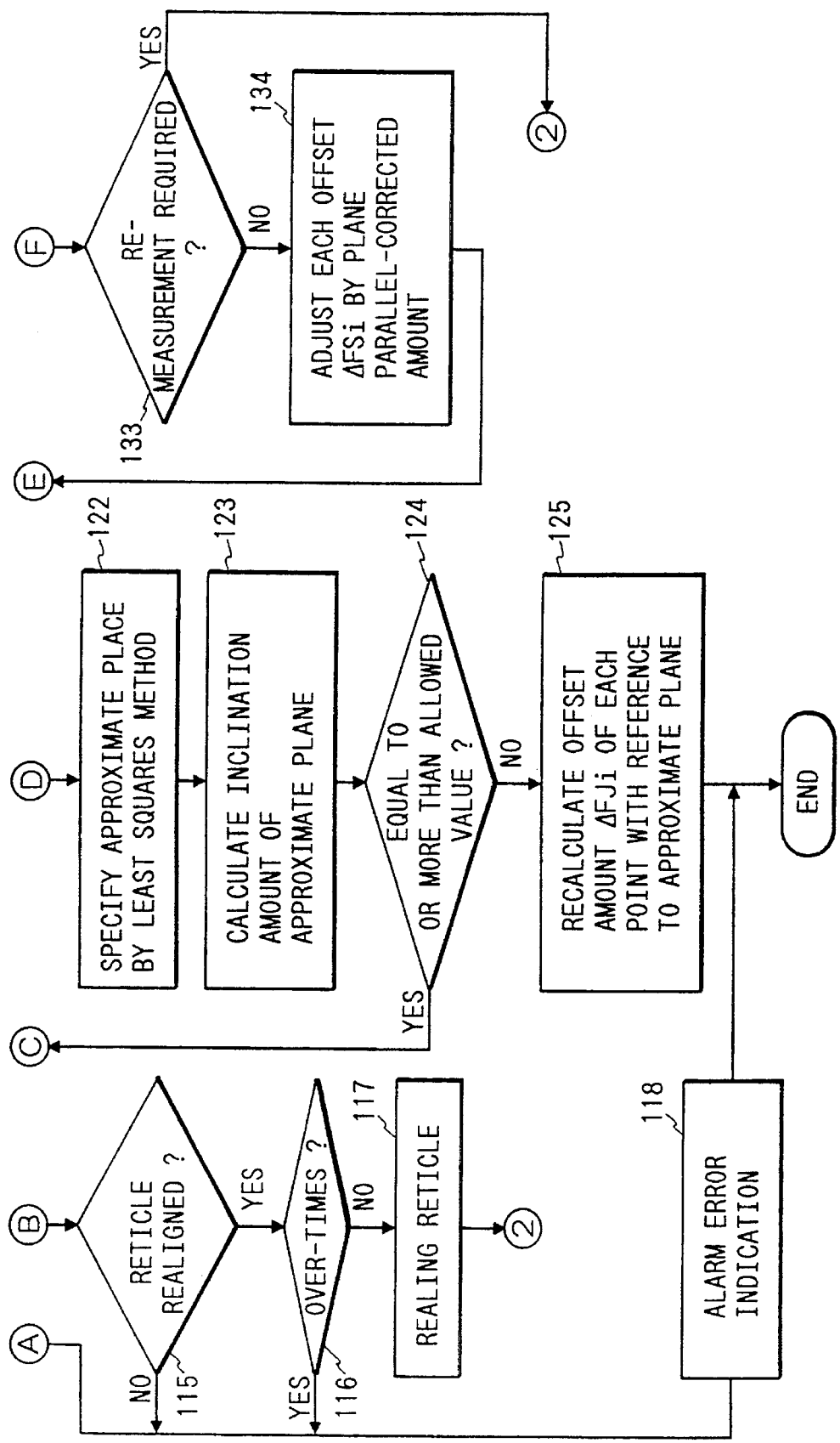

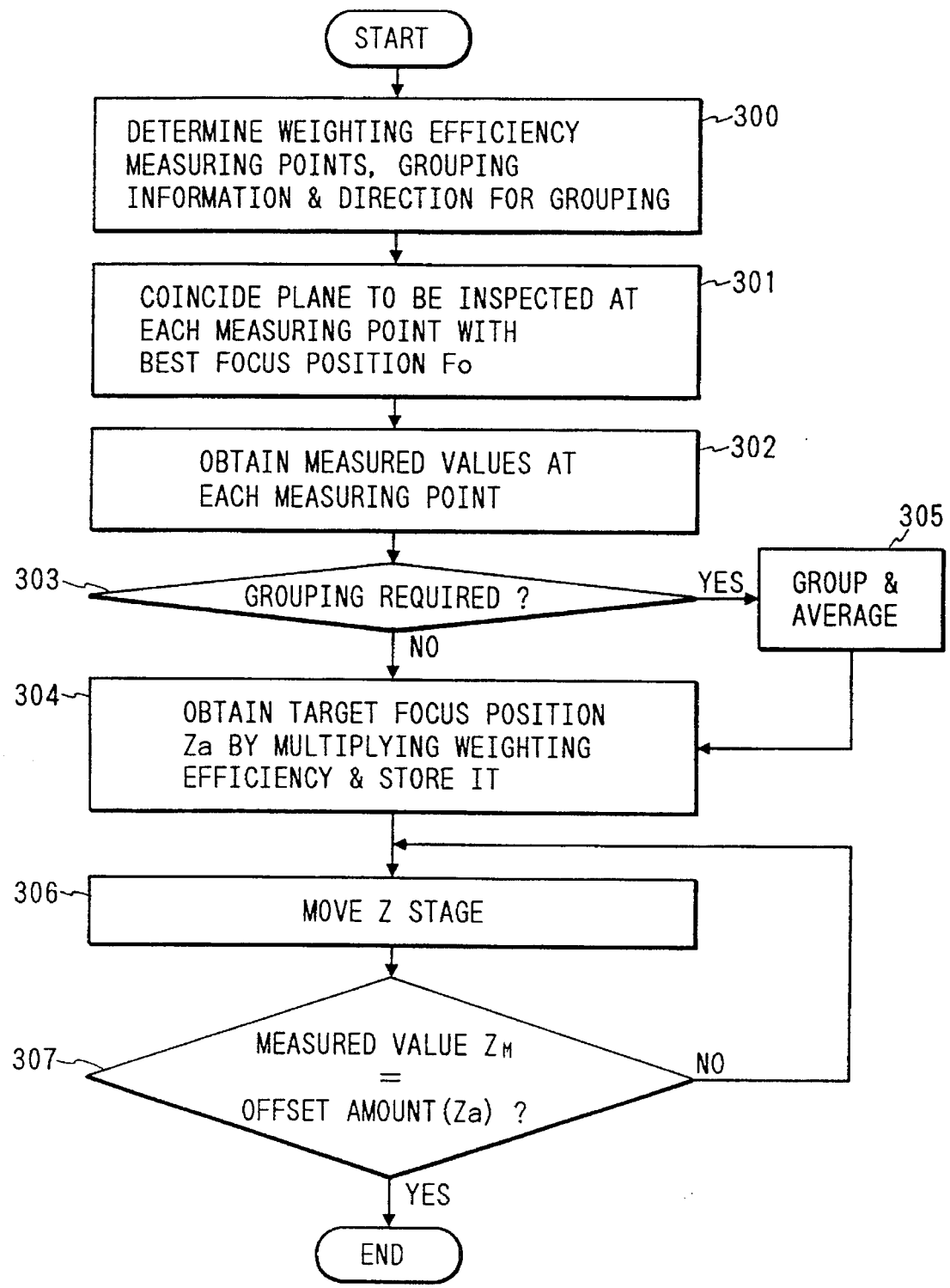

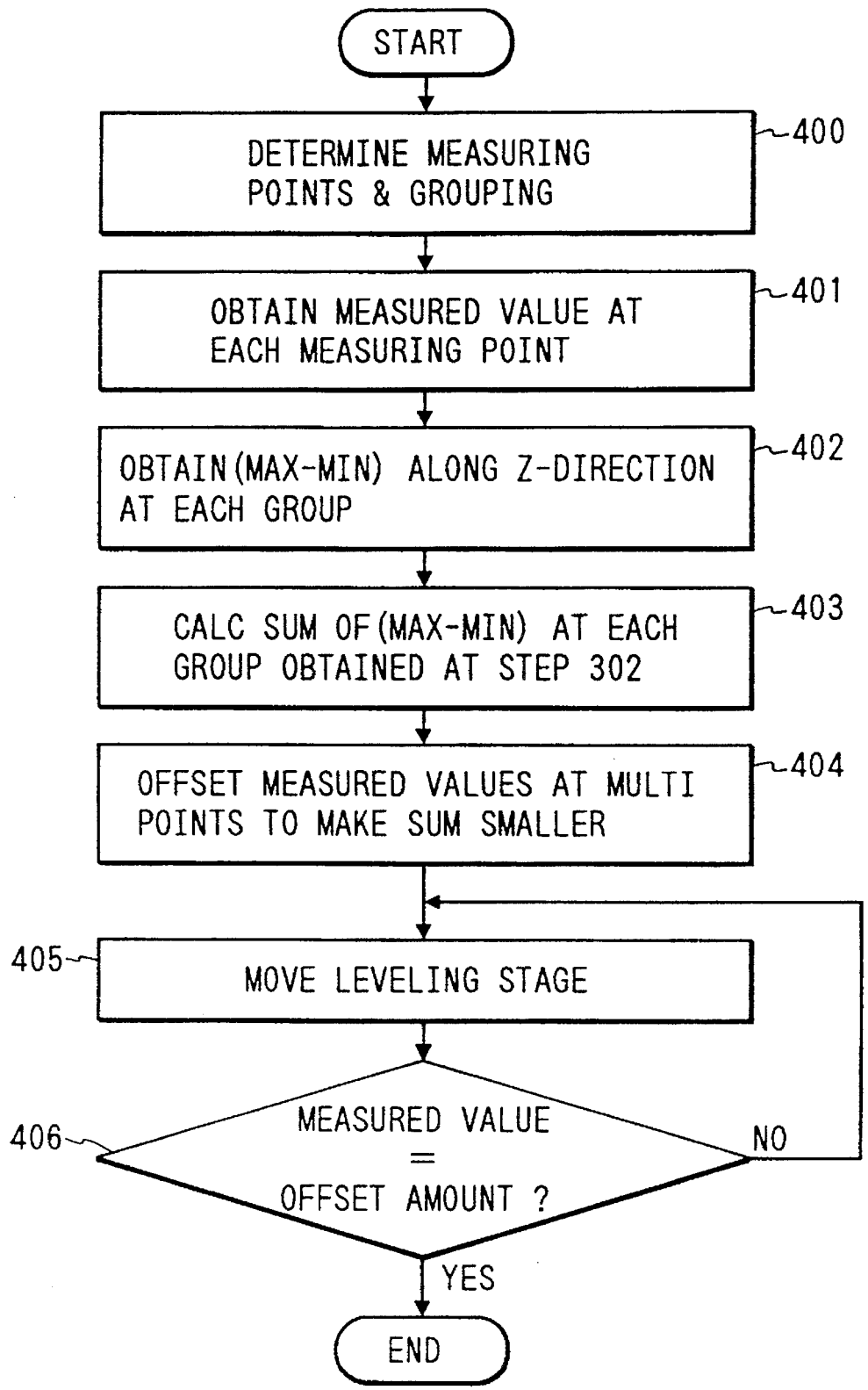

METHOD OF AND APPARATUS FOR DETECTING PLANE POSITION

This is a continuation of application Ser. No. 08/113,815 filed Aug. 31, 1993, now abandoned, which is a continuation-in-part of application Ser. No. 08/003,451 filed Jan. 12, 1993 (abandoned).

BACKGROUND OF THE INVENTION

1. Field of the Invention

The present invention relates to an apparatus for detecting plane positions of a substrate (a mask, reticle, semiconductor wafer, glass plate, and others which are used in the process of fabricating semiconductor devices or liquid crystal devices, for example). More particularly, the invention relates to an apparatus for positioning the surface of a substrate with respect to a given fiducial plane, a method of detecting plane positions preferably usable for a projection exposure apparatus (stepper, for example) which transfers the image of circuit patterns to a photosensitive substrate, for example, and an apparatus therefor.

2. Related Background Art

A plane detecting apparatus has hitherto been used widely in setting up proximity gaps, focusing, leveling, and the like, and often incorporated in an aligner which transfers to a given area on a photosensitive substrate the patterns on a mask or reticle (hereinafter referred to collectively as reticle) in the process, particularly in the lithography process, of fabricating semiconductor devices, liquid crystal devices, or the like. Especially in a stepper, when the reticle patterns are projected onto a photosensitive substrate (a wafer or a glass plate with photoresist being coated thereon) for exposure through an optical projection system having a high resolution, it is prerequisite to conduct an operation to match the surface of the photosensitive substrate exactly with the imaging plane of the reticle patterns, that is, a focusing adjustment.

In recent years, the focal depth of projection optical systems has increasingly become narrower and now it is only possible to obtain a focal depth of approximately ±0.7 μm even with i rays having its wavelength of 365 nm as an exposure illuminating light. In addition, the projection field of the projection optical systems tends to have increasingly become greater year after year. Therefore, it becomes difficult to design and manufacture a projection system with which to obtain an extremely great focal depth over a wide exposure field (an angle of 22 mm, for example) entirely. In this respect, there have been proposed several methods whereby to expand the focal depth.

However, in order to attain a desirable focusing over a wide exposure field entirely, it is necessary to secure the flatness of an area on the photosensitive substrate locally within such an exposure field as well as the flatness of the imaging plane in any case. In other words, both the so-called curvature and inclination of the field should desirably be arranged. While the curvature and inclination of the field depend largely on the optical performance of the projection optical system itself, the flatness and parallelism of a reticle may cause them in some cases. On the other hand, the local area of the photosensitive substrate, that is, the flatness per stepper area (shot area) differs depending on the photosensitive substrate to be used, but it is possible to establish the parallelism between the surface of the shot area on the photosensitive substrate and the imaging plane by inclining the holder which holds the photosensitive substrate just minutely.

As a method to adjust focusing including a consideration given to the inclination of the surface of each one of shot areas on the photosensitive substrate such as described above, techniques are known as disclosed in U.S. Pat. No. 4,558,949, U.S. Pat. No. 4,383,757, and others, for example. Particularly, in U.S. Pat. No. 4,383,757, there is disclosed a technique wherein the spots of light beams are projected onto four points on a photosensitive substrate through a projection optical system in order to photoelectrically detect the spotted images by the reflective rays of light for the focusing adjustment as well as the calibration of the inclination (leveling) of the photosensitive substrate.

However, according to the two conventional techniques disclosed as above, the detection is made only to determine the displacement of the surface of the photosensitive substrate in the axial direction of the projection from a fiducial plane which is hypothetically set up (where it is matched with the imaging plane as much as possible). It is not a method to detect the displacement between the imaging plane and the surface of the photosensitive substrate directly. As a result, if the hypothetically established fiducial plane serving as the base on which to measure the positional displacement of the photosensitive substrate in the axial direction should be displaced from the imaging plane of the projection optical system due to drift or the like, such a displaced portion becomes a residual focus offset at the time of stepping the patterns to the photosensitive substrate.

In this respect, therefore, there are methods to reduce such a residual focus offset as disclosed in U.S. Pat. No. 4,650,983 and U.S. Pat. No. 4,629,313, for example. In the U.S. Pat. No. 4,650,983, a fiducial pattern is arranged on a stage (holder) to stack a photosensitive substrate thereon, and this fiducial pattern is inversely projected on a specific pattern on a reticle through a projection optical system. Then, the height of the stage is adjusted so that the contrast of the image of the fiducial pattern to be formed on the specific pattern becomes the greatest. Subsequently, a focus detection system (inclined incident type) for the focus adjustment of the photosensitive substrate is calibrated so that the surface where the fiducial pattern is formed can be detected as the best focus plane (the optimal imaging plane). Also, in the U.S. Pat. No. 4,629,313, a fiducial pattern on a stage serves as a slit type photosensor, and the best focus plane is specified by detecting the contrast of the pattern images formed by a projection optical system when the slit pattern on a reticle is projected.

Also, as another method, there is known a technique as disclosed in U.S. Pat. No. 4,952,815 wherein a luminescent mark which emits slit rays of light is arranged on a stage, and the image of this luminescent mark is inversely projected onto a specific mark on a reticle. Then, the stage is shifted in the XY directions, and the best focus plane is detected by photoelectrically detecting the light which is transmitted above the reticle when the reticle mark is scanned with the image of the luminescent mark.

Also, as a method which is developed from the inclined incident type focus detection system disclosed in the U.S. Pat. No. 4,558,949, there is known a multipoint inclined incident type focus detection system as disclosed in U.S. Pat. No. 5,118,957, for example, wherein a pinhole image is projected by an inclined incident system onto each of plural points (five points, for example) in a shot area on a photosensitive substrate, respectively, without any intervention of projection optical systems, and each of the reflective images therefrom is collectively received by a two dimensional position detecting device (CCD). This method disclosed as a prior art is the so-called multipoint AF system of an inclined incident type whereby to implement both a highly precise focus detection and inclination detection. However, there is no disclosure or suggestion in this prior art at all as to the calibration of the focus offset with respect to the best focus plane at the time of stepping.

In each of the above-mentioned prior arts, any one of the systems to detect the positional displacement (focus displacement) in the axial direction of the projection light on the surface of a photosensitive substrate at the time of actual pattern alignment is simply to detect only the positional displacement of the photosensitive substrate in the axial direction and not to detect any focusing state of the reticle patterns and the photosensitive substrate directly. Ideally, therefore, calibration is conducted occasionally in consideration of drift and the like on the apparatus. Furthermore, with the flatness and parallelism of the photosensitive substrate taken into consideration, the multipoint AF system is superior because it performs the focus detections at plural points in a shot area individually and almost simultaneously.

Nevertheless, when a multipoint AF system is employed and a calibration is needed for such an AF system, it is found difficult to apply any of the conventional methods of calibration as it is. In other words, for the conventional calibration method, it is always necessary to detect a specific pattern on the reticle by some detection system. Accordingly, it is required to inscribe such a specific pattern in the circumference of the circuit pattern area or in the street line area of the target reticle at all times. As a result, the plural positions of the measuring points in the projection field determined by the multipoint AF system are completely different from the position of the specific pattern on the reticle which is to be detected at the time of calibration. Naturally, there is a problem that any accurate calibration is possible by the calibration as it is due to the aberration of the projection optical system, warping of reticle, or the like unless such a difference in the measuring position is taken into account. Besides the multipoint AF systems, the same problem is encountered in using a fixed point AF system in which the focus measurement point on the photosensitive substrate for the inclined incident method is set in the center of its projection field, that is, only one point in the center of the shot area.

Here, in FIG. 34, there is illustrated the conventional structure of a focus detecting system (plane position detecting system) of an inclined incident type in which the plane position of one shot area on a photosensitive substrate is detected as an amount of deviation with respect to the fiducial plane (the imaging plane of a projection optical system, for example). The focus detecting system shown in FIG. 34 is equivalent to the fixed AF system which has been described above. In FIG. 34, a projection optical system PL projects the reticle pattern to be imaged on a wafer W. The pattern image of the reticle is formed in the optimal imaging plane (best focus plane) which is perpendicular to the optical axis AX in a state where the contrast becomes greatest. A Z stage 20 with the wafer W stacked thereon is minutely moved on an XY stage 21 in the axial direction AX (in the direction Z) to enable the surface of a specific shot area on the wafer W to be matched with the best focus plane.

Now, in order to detect the height position of the surface of the wafer W, that is, the deviation amount of the shot area surface in the direction Z with respect to the best focus plane, there are provided a light projector LSU, an imaging lens system $L_1$ for the light projector, an imaging lens system $L_2$ for a light receiver, and the light receiver RVU as the focus detection system of an inclined incident type. The light projector LSU projects imaging beams onto the surface of the wafer W in the diagonal direction through the lens system $L_1$, and the light receiver RVU receives the positively reflective beams from the wafer W through the lens system $L_2$. Then, the light receiver RVU outputs to a focus error detecting circuit FD the photoelectric signals which vary in accordance with the positions where the reflective beams are received. Usually, the imaging beams from the light projector LSU are projected to the vicinity of the position where the optical axis AX of the projection optical system PL exists, and the arrangement is made so that the surface of the wafer W (a local plane where the beams from the light projector LSU are being projected, to be exact) is allowed to match the best focus plane when the positively reflected beams are received to match the detection center of the light receiver RVU.

Also, the error detecting circuit FD calculates the level deviation signal proportional to the positional deviation amount of the wafer surface in the direction Z with respect to the best focus plane on the basis of the signal from the light receiver RVU, and transmits it to a driving portion (hereinafter referred to as Z-DRV) 18 of the Z stage 20. The Z-DRV 18 servo controls the Z stage 20 in order to make the level of the deviation signal a predetermined target value (zero or a given value). Here, in this case, there is provided in the Z-DRV 18, a circuit to detect the difference between the deviation signal level and the target value and determine whether such a difference is within an allowable range or not. This circuit is needed to define the allowable range significantly narrow against the target value thereby to make it possible to implement a stabilized servo control at a high speed.

In the apparatus shown in FIG. 34, the level variation of the deviation signals output from the focus error detecting circuit FD is proportional to the positional variation of the surface of the wafer W in the direction Z in the vicinal range of the best focus plane. Its proportional constant corresponds to the detection sensitivity for plane positions by the focus detection system of the inclined incident type shown in FIG. 34, and given the positional deviation amount of the wafer in the direction Z as $\Delta Z$ (μm) and the amount of the level variation of the deviation signal as $\Delta V$ in terms of a voltage at that time, the detection sensitivity (inclination) can be defined as $\Delta V/\Delta Z$. The greater the value $\Delta V/\Delta Z$, the higher becomes the detection sensitivity. Thus, the response of the Z stage 20 is enhanced. On the other hand, however, the stability of the servo system may be affected. Also, a problem is encountered that if the detection sensitivity is lowered on the contrary, the accuracy of the servo system pursuance is reduced.

In a servo system of the kind, the response, stability, and pursuance accuracy are optimally set, but the detection sensitivity itself is not necessarily uniform among focus detection systems when a plurality of aligners are examined. In other words, it often depends on an individual apparatus. Therefore, even if the allowable range against a target value at the time of a servo control is set equal in terms of the deviation signal level, the amplitude of the actual allowable range for the positional deviation in the direction Z may differ per apparatus due to difference in detection sensitivity (inclination and rate of change). Consequently, even when the result of exposure is desirable after the focus adjustment by a certain aligner, there may occur a problem that the conditions obtainable from the focusing parameters at that time are not reproduced as they are in another aligner. This presents a serious problem in terms of the accuracy management in fabricating devices in the manufacturing lines using a number of aligners.

The description has been made of a fixed point AF system so far, but when the foregoing multipoint AF system is employed, it is necessary to output deviation signals by the focus error detecting circuit for each of many numbers of the measuring points which are set in the shot area. Therefore, unless the detection sensitivity ($\Delta V/\Delta Z$) is uniform at each of the measuring points, the allowable positional deviation range for the servo system control at each of the measuring points becomes different. A problem is likewise encountered that the advantages obtainable in using the multipoint AF system are reduced by half.

Also, when a step exists in one shot area, it is conceivable to detect the height positions at the upper and lower portions of such a step using a multipoint AF system and set up the surface of the shot area to the fiducial plane in accordance with an averaged value of the respective results of the detections. However, it is impossible for this method to detect the height positions at one point of the plural measuring points, or if the detection results are questionable (the detection errors are great), there is encountered a problem that it is impossible to obtain the height position of the entire shot area exactly. Now, it is obvious that the focal depth of the projection optical system has increasingly become smaller year after year and that the step in the shot area has been greater on the contrary. For any of steppers, this is an extremely serious problem because it brings about another problem that the shot area cannot be set up accurately to the fiducial plane over all. Moreover, although it is possible to obtain the inclination of the shot area surface with respect to the fiducial plane from the detection results of the multipoint AF system, the error component in the amount of such inclination is great if only the shot area inclination is obtained simply from the set up positions of the plural measuring points in the shot area and the height positions of the respective measuring points when any step exists in the shot area as described above. Hence, there is a problem that the surface of the shot area cannot be set up exactly in parallel to the fiducial plane.

Also, with a fixed point AF system and a multipoint AF system, a levelling sensor of the collimator type as disclosed in U.S. Pat. No. 4,558,949 is in some cases provided in a projection exposure apparatus. This levelling sensor, however, only detects how much the surface of a wafer is inclined with respect to an imaginarily preset fiducial plane, and is not of a type which directly detects the inclination of the surface of the wafer with respect to the imaging plane of a projection optical system. Therefore, if the imaginary fiducial plane and the imaging plane deviate from each other, the amount of that deviation will become residual levelling offset as in the aforedescribed multipoint AF system. This residual levelling offset can be reduced by finding the imaging plane of the projection optical system by the use of the technique disclosed in U.S. Pat. No. 4,650,983, U.S. Pat. No. 4,629,313 or U.S. Pat. No. 4,952,815, and calibrating the levelling sensor so that the imaging plane may coincide with the imaginary fiducial plane. However, to find the imaging plane of the projection optical system accurately in the above-described technique, use must be made of a reticle exclusively for measurement having a number of particular marks (slit patterns). This leads to a problem that much time is required for the calibration of the levelling sensor and the throughput of the apparatus is greatly reduced.

Further, in the projection exposure apparatus, the position of a particular mark on the reticle is detected by the use of a light emitting mark provided on a stage, to thereby effect reticle alignment, the measurement of a base line or the measurement of the imaging characteristics (such as projection magnification and distortion) of the projection optical system. An apparatus of this type is disclosed in U.S. Pat. No. 4,853,745, wherein light transmitted through a reticle is directed to a photoelectric detector through a bending mirror disposed above a particular mark or a beam splitter disposed in an illuminating optical system. However, when the positions of a plurality of particular marks on the reticle are to be detected, it is necessary to dispose the bending mirror and the photoelectric detector relative to each particular mark or make the bending mirror and the photoelectric detector movable, and this leads to a problem that the apparatus becomes bulky. Also, the beam splitter disposed in the illuminating optical system gives rise to a problem that the illuminating optical system becomes bulky and complicated.

SUMMARY OF THE INVENTION

It is a first object of the present invention to provide an apparatus for setting up plane positions capable of maintaining a constant allowable deviation range at all times even when the detection sensitivity (inclination and rate of change) of the plane position detecting system (focus detection system) differs or the detection sensitivity varies by the elapsed time.

It is a second object of the present invention to provide a projection exposure apparatus capable of performing the exact focus calibration at measuring points even when the measuring points of the plane position detecting system are set at arbitrary positions in a projection field and thus improving the precision, reproducibility, stability, and the like of the plane position detecting system.

It is a third object of the present invention to provide a method of and an apparatus for detecting plane positions capable of detecting the height position and inclination of the surface of a substrate with a desirable precision and stability even when a step exists on the substrate.

It is a fourth object of the present invention to provide a projection exposure apparatus in which a levelling sensor can be calibrated highly accurately and rapidly and the surface of a substrate and the imaging plane of a projection optical system can always be set parallel to each other.

It is a fifth object of the present invention to provide a projection exposure apparatus which is capable of measuring the position of a particular mark on a reticle without being made bulky.

Now, for the plane position set up apparatus to achieve the first object, there are provided means to calculate the sensitivity of the deviation signals obtainable from the plane position detecting system of an inclined incident type, that is, the sensitivity such as the rate of change and inclination of the deviation signal level against the actual amount of the positional deviation, and means to correct the allowable value with respect to the variation of the deviation signal level in accordance with the rate of change or inclination previously calculated. Further, in the plane position detecting system having plural measuring points, the functions of the foregoing calculating means and correcting means are made applicable to each of the measuring points.

In the above-mentioned plane position set up apparatus, the level changing characteristics of the deviation signals which represent the positional deviation of the plane are detected to obtain the inclination (rate of change) of the level variation by calculation. Therefore, it is always possible to obtain the accurate inclination (rate of change) even if there are fluctuations due to the elapsed time. Moreover, in order to make constant the allowable deviation range which varies in accordance with the fluctuation of the inclination (detection sensitivity of the plane position detecting system), an arrangement is made to correct the allowable range in terms of the level changing characteristics of the deviation signals. Accordingly, it becomes possible to unify the focus pursuance at an identical accuracy for any one of the aligners without being affected by the difference attributable to different apparatuses of a same manufacture. In other words, it is possible to perform the establishment of plane positions including the focus adjustment with the same degree of accuracy among different apparatuses. Also, it is possible to constantly maintain the allowable deviation range at all times against errors due to the drift or the like resulting from the elapsed time. Therefore, for an apparatus which requires its alignment operation for long hours, it is possible to perform such an operation under the focus set up conditions intended by an operator with a desirable reproducibility.

Furthermore, in a plane position detecting system (multipoint AF system) having plural measuring points, the allowable deviation ranges can be unified for each of the measuring points. Hence, it becomes possible to provide the focus adjustment wherein the focus offset given individually to each of the measuring points, that is, an optimal focus adjustment with an image plane inclination and image plane curvature being taken into consideration, for example, or the leveling adjustment.

Also, for the stepper to achieve the second object, there are provided a first focus detecting means to detect the positional deviation on the surface of the photosensitive substrate in the optical axis direction at each of the plural measuring points predetermined in the projection field of an optical projection system; a second focus detecting means to detect the positional relations of a fiducial board in the optical axis direction with the imaging plane as its reference in such a manner that when the light emitting portion formed on the fiducial board on a Z stage is positioned at an arbitrary point in the projection field, the rays of light reflected by a mask to return to the fiducial board through the optical projection system, among those rays of light which have reached the mask from the light emitting portion through the optical projection system, are detected photoelectrically by moving the Z stage; specifying means to specify the coordinate positions of an XY stage so that the light emitting portion is positioned in turn at each of the positions of the plural measuring points or of the positions in the extreme vicinity thereof detected by the first focus detecting means; and calibrating means to calibrate individually or averagely the detection errors at each of the plural measuring points detected by the first focus detecting means in accordance with each of the positional relations detected by operating the second focus detecting means at each of the coordinate positions thus specified.

In the above-mentioned stepper, using the light which has the same wavelength as or close to the exposure light through the device mask actually used for exposure and the optical projection system, it is possible to detect the absolute position of imaging plane by the second focus detecting means at each of the plural points arbitrarily set in the projection field. Therefore, it becomes possible to perform the focus calibration at the measuring point of the first focus detection system which detects the height position of the surface of the photosensitive substrate. Hence, the enhancement of the calibrating accuracy can be anticipated. Also, in a case of a multipoint AF system where the first focus detection system has a plurality of measuring points, a highly precise calibration is possible at each of the measuring points. Consequently, even when there exists a stepping structure on the photosensitive substrate and a focusing is desired at a specific stepping portion thereof, it is possible to select the measuring points corresponding to such a specific stepping portion from the plural measuring points and focus the projected image of the mask patterns exactly by the use of the detecting signals obtainable from the measuring point thus selected.

Moreover, according to the second focus detection system, an optimal imaging plane can be specified at plural points in the projection field. It is thus possible to obtain the image plane curvature, image plane inclination, and the like of the optical projection system accurately. Therefore, by the vertical movement of a mask, the leveling of a mask (tilting), the partial shifting of optical elements in the optical projection system, or by the leveling of a holder (stage) to hold the photosensitive substrate, it is possible to counteract the above-mentioned image plane curvature, image plane inclination, and the like.

Also, for the plane position detecting apparatus to achieve the third object, there are provided selecting means to selectively detect at least two parts of a pattern image by dividing the pattern image formed on an inspecting surface into plural parts; a first height position detecting means to output first detecting signals corresponding to the height position of the inspecting surface with respect to each of the pattern images selected by the selecting means; weighting means to multiply each of the first detecting signals by a weighting coefficient; and a second height position detecting means to output second detecting signals corresponding to the height of the inspecting surface by averaging the sum of the weighted signals by the sum of the weighting coefficients.

In the above-mentioned plane position detecting means, the height positions are detected at plural points to multiply the detected value at each point by the weighting coefficient even when a step exists on the inspecting surface; hence making it possible to obtain the averaged height of the entire inspecting surface accurately. Further, by adjusting the weighting coefficient, it is possible to make an arbitrary height position within the inspecting surface a target focus position (focusing point).

Also, the plural measuring points are grouped in accordance with the stepping structure in the inspecting surface. Then, the detected result (averaged value) per group is multiplied by the weighting coefficient subsequent to having averaged the detected values at each of the measuring points in the group. The measuring points set at substantially the same height in the inspecting surface are made as a group, for example. In this way, the height detection accuracy is enhanced. Also, even when the detection is disabled at a certain measuring point by some cause, it is still possible to detect the height by arranging the foregoing groups. In other words, if only the height detection is possible at least at one measuring point in a group, it is possible to perform the height detection in such a local area corresponding to the group in the inspecting surface; hence enabling the averaged height position in the entire inspecting surface to be obtained with a desirable precision.

Moreover, in detecting the inclination of the inspecting surface, the inclination is obtained by the detected value at each of the measuring points in one and the same group. Therefore, the degree of the dependency of the inclination detecting precision on the set-up positions is significantly reduced; thus making it possible to detect the inclination of the inspecting surface with a height precision and stability.

Also, in a projection exposure apparatus for achieving the fourth object, provision is made of a pattern board provided on a portion of a substrate stage and having a fiducial pattern of a predetermined shape, illuminating means for applying illuminating means for applying illuminating light of substantially the same wavelength as illuminating light for exposure from the underside of the pattern plate to the fiducial pattern, photoelectric detecting means for receiving light transmitted through the fiducial pattern, applied through the projection optical system to the pattern surface of a mask, further reflected from the pattern surface and returned through the projection optical system and the fiducial pattern, focal position detecting means for detecting the imaging characteristic of the projection optical system on the basis of a detection signal output from the photoelectric detecting means when the pattern board and the imaging plane of the projection optical system are moved relative to each other in the direction of the optical axis of the projection optical system, calculating means for calculating the inclined state of the imaging plane of the projection optical system on the basis of the focal position at each of at least three different positions in the image field of the projection optical system, control means for controlling the inclination of the substrate stage in conformity with the calculated inclined state of the imaging plane so that the imaging plane of the projection optical system and the surface of the pattern board may substantially coincide with each other, and means for calibrating inclination detecting means so that the inclination detecting means may detect the surface of the pattern board as a reference surface when the imaging plane of the projection optical system and the surface of the pattern plate are made substantially coincident with each other by the control means.

In the above-described projection exposure apparatus, any special mask exclusively for measurement need not be used and further, any particular mask for measurement need not be formed on a mask for exposure having a device pattern. That is, with the mask for use for exposure mounted in the apparatus, the in-focus point (the best focus position) at any position in the image field of the projection optical system can be measured rapidly and highly accurately. Moreover, it becomes possible to effect said measurement at any timing, for example, even immediately before the exposing operation. Also, by finding the in-focus position at each of a plurality of positions in the image field of the projection optical system, the imaging characteristic, for example, the curvature of image field or the like, of the projection optical system can also be calculated.

Further, the imaging plane of the projection optical system may be fluctuated by a temperature change or the like of the projection optical system caused by the absorption of exposure light, but the calibration of the inclination detecting means can be sequentially effected in conformity with the inclined state (including the inclination or the like of the image plane) of the imaging plane of the projection optical system calculated as described above. Accordingly, it becomes possible to always make the imaging plane of the projection optical system and the exposed surface (the front surface) of a photosensitive substrate accurately coincident with (parallel to) each other. Therefore, the whole surface of a short area on the photosensitive substrate can be set within the depth of focus of the projection optical system.

In a projection exposure apparatus for achieving the fifth object, provision is made of a pattern plate provided on a portion of a substrate stage and having a reference pattern of a predetermined shape, illuminating means for applying illuminating light of substantially the same wavelength as illuminating light for exposure from the underside of the pattern board to the reference pattern, light receiving means for receiving a light beam transmitted through the fiducial pattern, applied to the pattern surface of a mask through a projection optical system, reflected from said pattern surface and returned through the projection optical system and the fiducial pattern, and position detecting means for detecting the position of a fiducial mark on the mask on the basis of a detection signal output from the light receiving means when the projected image of a fiducial pattern formed on the pattern surface of the mask by the illuminating means and the fiducial mark on the mask are moved relative to each other.

In the above-described projection exposure apparatus, there is adopted a construction in which the illuminating light is sent and received through the fiducial pattern placed on the substrate stage and therefore, the position of the fiducial mark formed at any position on the mask can be detected without an illuminating optical system being made bulky. Also, the detection of the mark position of an alignment sensor can be accomplished by the use of the fiducial pattern and therefore, the control of the base line of the alignment sensor becomes possible. Further, even the imaging characteristics, particularly the distortion and projection magnification, of the projection optical system can be simply measured. Also, the best focus position at any point in the projection field (image field) of the projection optical system can be detected on the basis of a detection signal output from the light receiving means when the fiducial pattern is moved in the direction of the optical axis of the projection optical system. Thus, there is obtained an advantage that the apparatus can be simplified to thereby achieve reduced costs.

BRIEF DESCRIPTION OF THE DRAWINGS

FIG. 30 is a flowchart illustrating a variation of the operation to enable the target focus position to be matched with the best focus plane.

FIG. 32 is a view showing the operation to correct the inclination of an inspecting surface according to a sixth embodiment of the present invention.

DETAILED DESCRIPTION OF THE PREFERRED EMBODIMENTS

Figure 1:
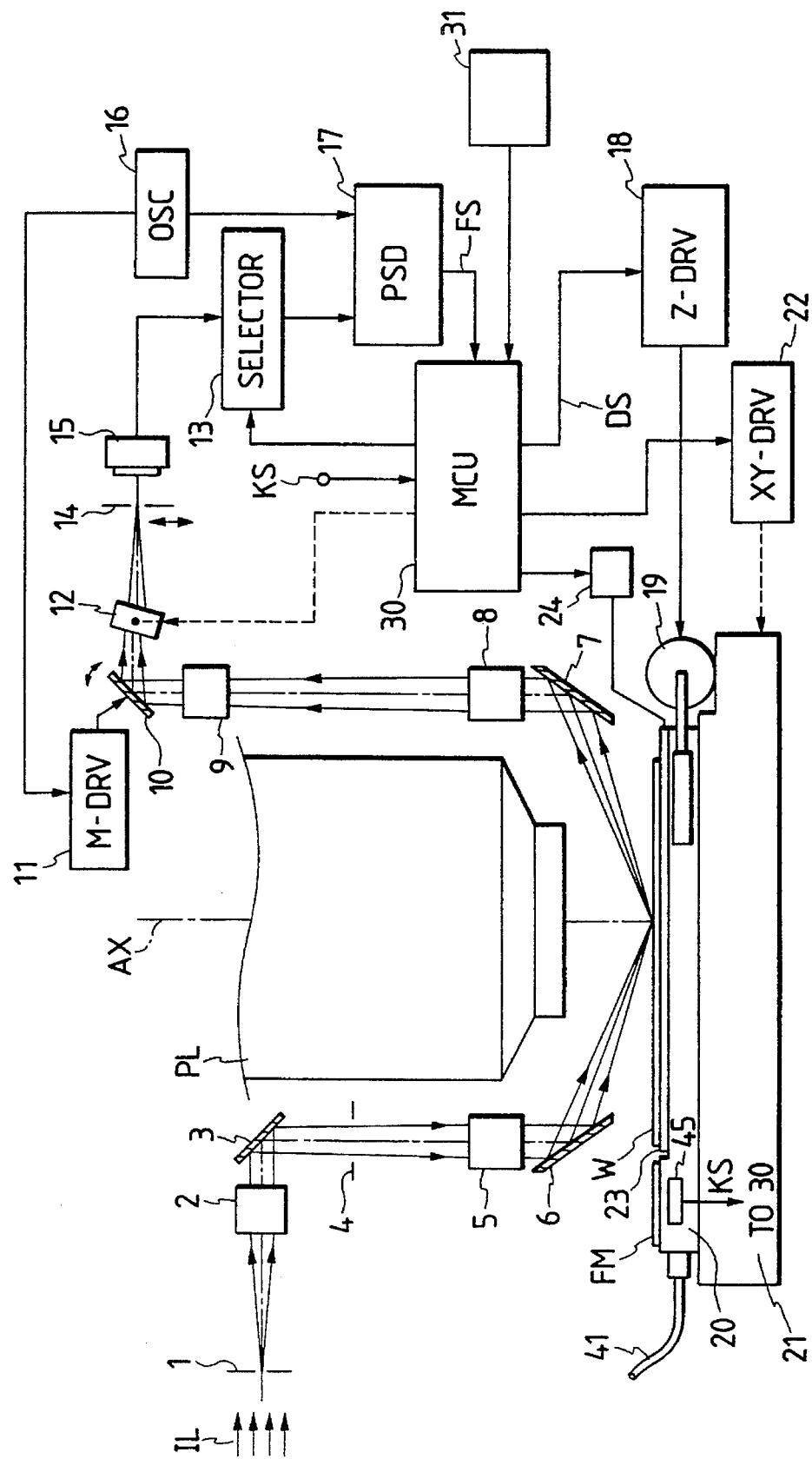
FIG. 1 is a view illustrating the entire structure of an AF system of an inclined incident type according to an embodiment of the present invention.
Figure 34:
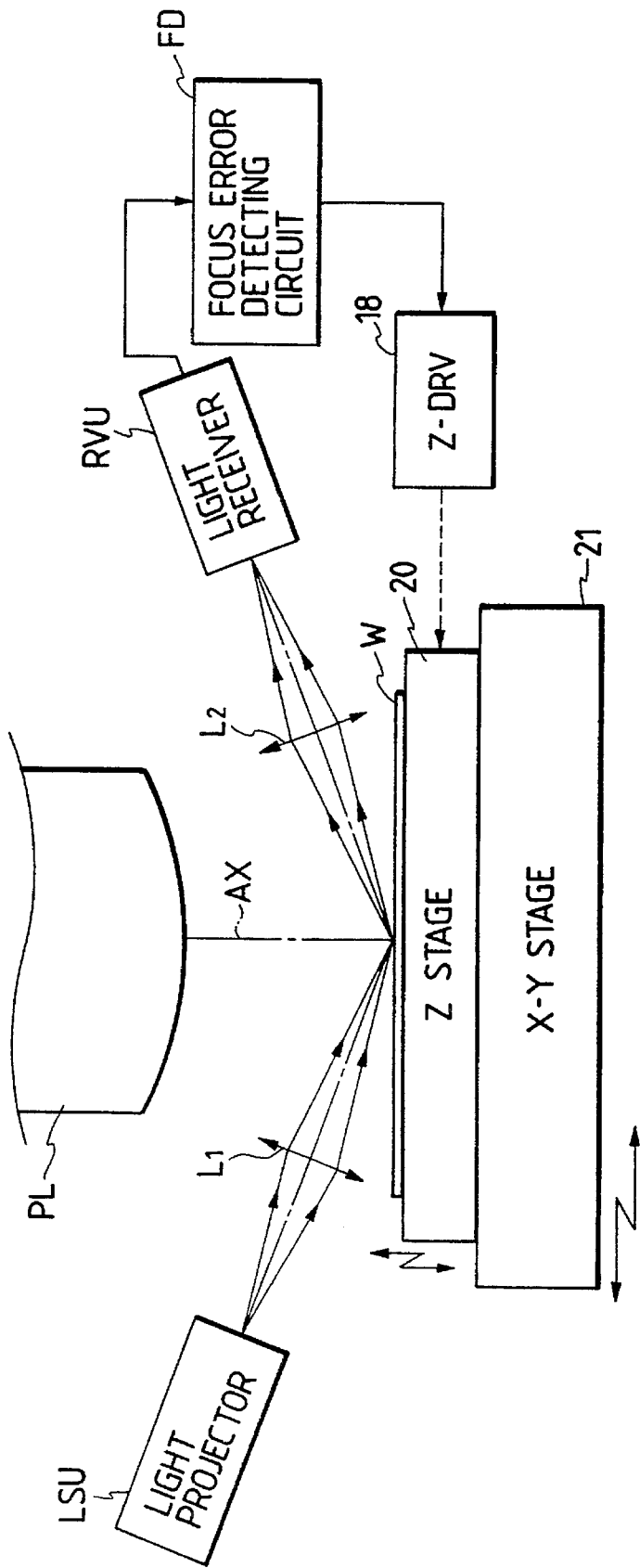
FIG. 34 is a view illustrating the structure of a conventional plane position detecting apparatus (an AF system of an inclined incident type).

With reference to FIG. 1, an embodiment of the present invention will be described. In the embodiment set forth below, a focus detection system (AF system) of an inclined incident type installed in a stepper is exemplified for description in order to simplify the comparison with a prior art shown in FIG. 34. While the description will be made hereinafter of the AF system of an inclined incident type illustrated in FIG. 1, it is assumed here that a multipoint AF system is employed. The multipoint AF system is a system wherein measuring points are set up in plural locations in the projection field of a optical projection system PL to measure the positional deviation (the so-called focus displacement) in the direction AX of the optical axis of a wafer W.

In FIG. 1, the illuminating light IL which is not photosensitive to the photoresist of the wafer W illuminates a slit board 1. The light which is transmitted through the slits of the slit board 1 irradiates the wafer W diagonally through a lens system 2, a mirror 3, a diaphragm 4, a projection objective lens 5, and a mirror 6. At this juncture, if the surface of the wafer W is positioned at the optimal imaging plane Fo of the optical projection system PL, the slit image of the slit board 1 is imaged on the surface of the wafer W by the lens system 2 and objective lens 5. Also, the angle formed by the optical axis of the objective lens 5 and the wafer surface is set at approximately 5° to 12°, and the center of the slit image of the slit board 1 is positioned at a point where the optical axis AX of the optical projection system PL intersects the wafer W.

Now, the slit image beam reflected by the wafer W is reimaged on a light receiving slit board 14 through a mirror 7, a light receiving objective lens 8, a lens system 9, a vibrating mirror 10, and an inclinable plane parallel board 12. The vibrating mirror 10 causes the slit image formed on the light receiving slit board 14 to be minutely vibrated in the direction perpendicular to its longitudinal direction. Also, the plane parallel 12 serves to shift the interrelated relationship between the slits on the slit board 14 and the reflective slit image from the wafer W in the direction orthogonal to the longitudinal direction of the slits. Further, the vibrating mirror 10 is vibrated by a mirror driver (M-DRV) 11 to be driven by the driving signals from an oscillator (OSC.) 16.

Thus, when the reflective slit image is being vibrated on the light receiving slit board 14, the beam which is transmitted through the slits of the slit board 14 is received by the array sensor 15. The array sensor 15 is such that the longitudinal direction of the slits of the slit board 14 is divided into plural minute areas, and an individual photoelectric cell is arranged in each of such minute areas. Here, it is assumed that an array sensor of silicon photodiodes or phototransistors is employed. The signal from each of the light receiving cells in the array sensor 15 is selected or grouped through a selector circuit 13 and is inputted into a synchronous detection circuit (PSD) 17.

To the PSD 17, an a.c. signal of the same phase as the driving signal from the OSC. 16 is inputted and synchronously rectified on the basis of the phase of this a.c. signal as reference. In this case, each output signal from the plural light receiving cells, which is selected from the array sensor 15, is synchronously detected. To this end, a plurality of detection circuits are provided for the PSD 17, and each of the detection output signals FS is output to a main control unit (MCU) 30. The detection output signal FS is the so-called S curve signal. It shows the zero level when the slit center of the light receiving slit board 14 and the vibration center of the reflective slit image from the wafer W are matched. The level becomes positive when the wafer W is displaced above from such a state and negative when the wafer W is displaced below. Therefore, the height position of the wafer W is detected as a focusing point when the level of the output signal FS becomes zero.

However, there is no assurance in an inclined incident type of the kind that the height position of the wafer W which presents a focusing point (its output signal FS being at the zero level) is always matched with the optimal imaging plane Fo under any circumstances. In other words, the inclined incident type has a fiducial plane which is hypothetically determined by the system itself, and the detection output signal FS shows its zero level when the wafer surface is matched with such fiducial plane. Thus, although the fiducial plane and the optimal imaging plane Fo are arranged to match each other at the time of assembling the apparatus, it cannot be assured that these planes will match over a long period of time. Therefore, the plane parallel 12 shown in FIG. 1 is inclined to displace the hypothetical fiducial plane in the optical axis direction AX for the implementation of the matching of the fiducial plane and the optimal imaging plane Fo (or the regulation of the positional relationship between them).

Also, the MCU 30 shown in FIG. 1 is provided with a function to receive the output signal KS from the photoelectric sensor 45 for the calibration of a multipoint AF system of an inclined incident type; a function to set up the inclination of the plane parallel 12; a function to output instruction signals DS to the circuit (Z-DRV) 18 to drive the driving motor 19 for the Z stage 20 in accordance with each of the output signals FS of the multipoint AF system; a function to output instructions to a driving unit (including a motor and its control circuit) 22 to drive the XY stage 21, and others. Further, in FIG. 1, a leveling stage 23 is arranged above the Z stage 20. The MCU 30 is also provided with a function to output instructions to a leveling stage driving unit (including a motor and its control circuit) 24 to drive the leveling stage 23 in accordance with each of the output signals FS from the multipoint AF system.

Figure 2:
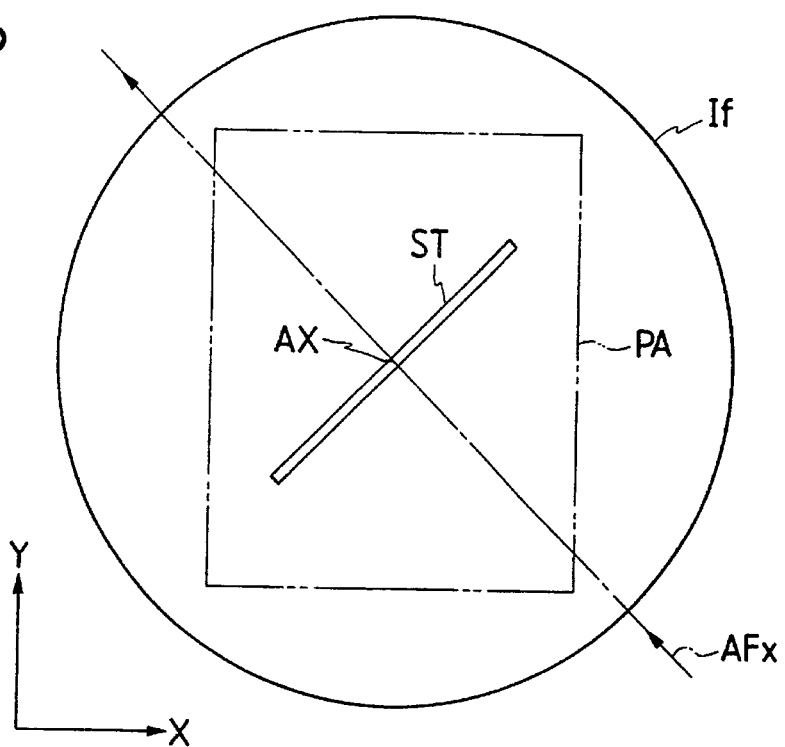
FIG. 2 is a plan view showing the projected state of a slit image by an AF system of an inclined incident type.

FIG. 2 is a plan view showing the positional relationship between the projection field If of a optical projection system PL and the projected slit image ST of a multipoint AF system. The projection field If is generally circular while the pattern area PA of a reticle is rectangular within such a circle. The slit image ST is formed on a wafer with an inclination of approximately 45° to each of the shifting coordinate axes X and Y of the XY stage 21. Therefore, the both optical axes AFx of the projecting objective lens 5 and light receiving objective lens 8 extend on the wafer surface in the direction orthogonal to the slit image ST. Further, the center of the slit image ST is arranged to match substantially with the optical axis AX. With a structure such as this, the slit image ST is set in the pattern area PA to be extended as long as possible.

In general, on the wafer surface where the pattern area PA is projected, the shot area which is superposed therewith has already been formed. In the shot area, the variation of uneven portions becomes increasingly greater as the processes of device fabrication progress. As a result, the significant variation of unevenness may be present also in the longitudinal direction of the slit image ST. Particularly, when a plurality of chips are arranged in one shot area, the scribe lines should be formed in the shot area in the direction X or direction Y in order to separate the chips, respectively, and in an extreme case, a step of as much as more than 2 μm may be generated between the points on the scribe line and chip. In this respect, however, the position where the scribe line is present in the slit image ST can be predicted beforehand from the designed shot arrangement, the chip size in the shot, and the like. The optimal selection of the reflective rays of light from the slit image ST in its longitudinal direction on the array sensor 15 can readily be predicted accordingly.

Figure 3:
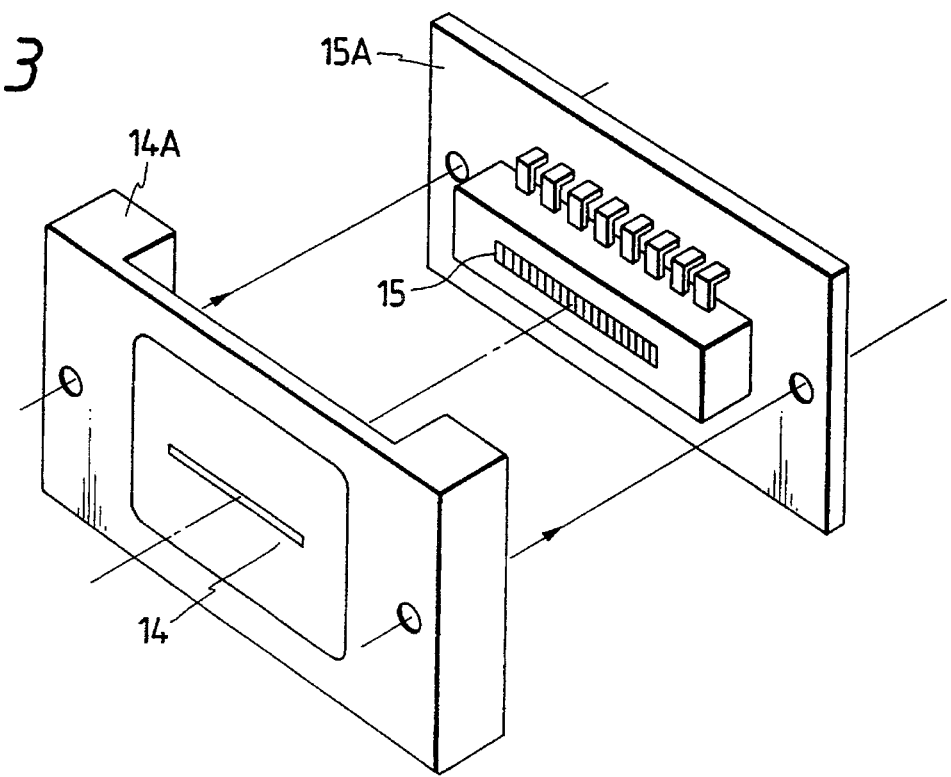
FIG. 3 is a perspective view illustrating the structure of an array sensor serving as a photoelectric detector for an AF system of an inclined incident type.

FIG. 3 illustrates an example of the specific structure of the light receiving slit board 14 and array sensor 15. The slit board 14 is formed by depositing a chrome layer (light shield) over a glass substrate and then by etching a part thereof to produce transparent slits. This slit board 14 is fixed to a supporting metal 14A. The metal 14A is fixed to a printed circuit board 15A made of ceramics and others which holds the array sensor 15. Thus, the slits of the slit board 14 are closely in contact in parallel with the one dimensional array of the light receiving cells in the array sensor 15. While it is desirable to arrange the slit board 14 and array sensor 15 as close or adjacent as possible to each other as described above, it may be possible to provide an imaging lens between the slight board 14 and array sensor 15 to make the slit board 14 and array sensor 15 to be optically conjugate. In this respect, as shown in FIG. 2, the length of the slit image ST on the wafer differs depending on the diameter of the projection field If, but to be optically conjugate. In this respect, as shown in FIG. 2, the length of the slit image ST on the wafer differs depending on the diameter of the projection field If, but it is desirable to make the length approximately 1 to ⅓ times its diameter when the diameter of the field If is approximately 32 mm by a ⅕ reduction optical projection system.

Figure 4:
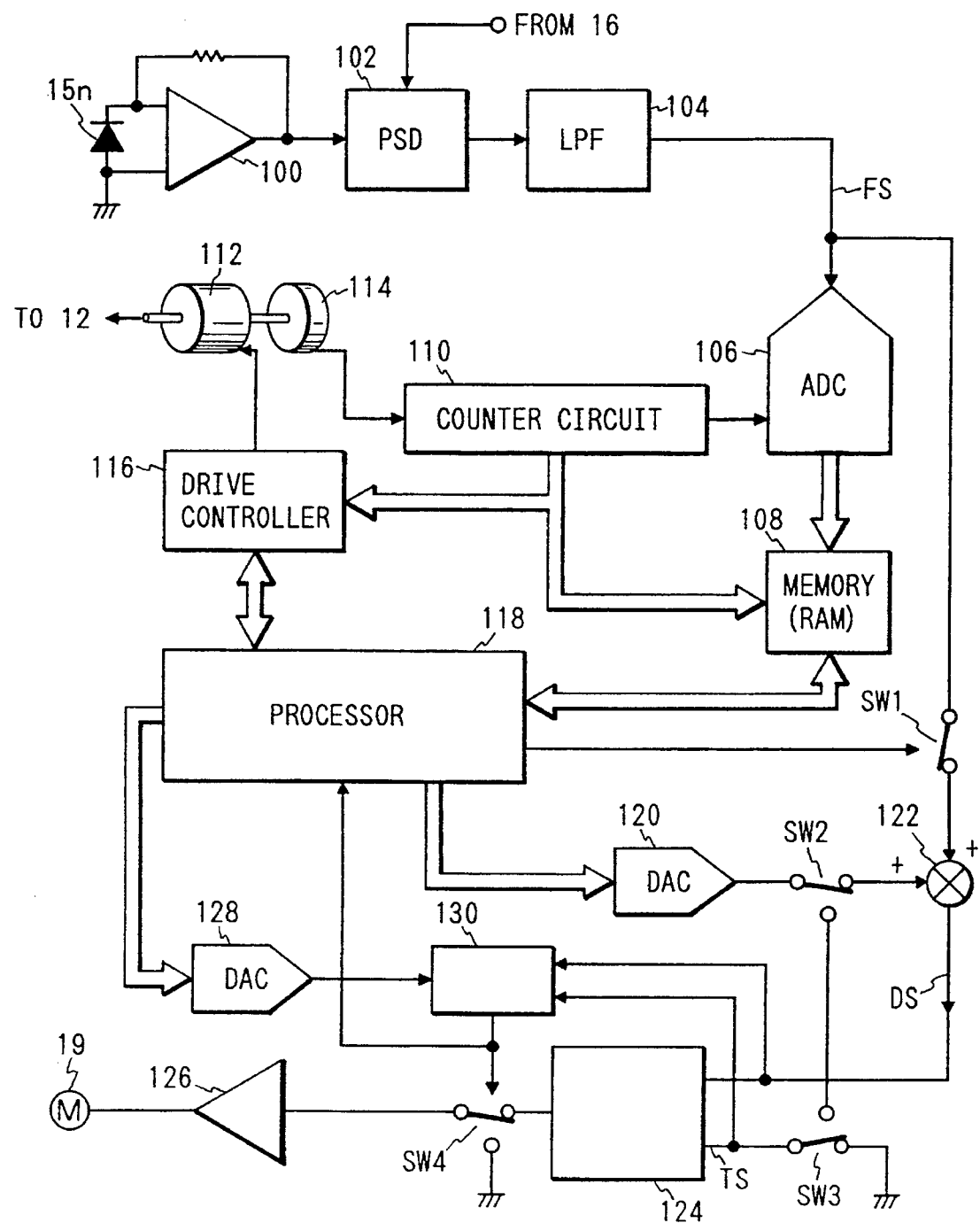
FIG. 4 is a block diagram showing the signal processing system for an AF system of an inclined incident type according to a first embodiment of the present invention.

Subsequently, with reference to FIG. 4, the description will be made of a first embodiment according to the present invention. FIG. 4 is a view showing the circuit blocks used for the apparatus shown in FIG. 1, representing a processing of the photoelectric signal from one of the light receiving cells on the array sensor 15 corresponding to one of the measuring points of a multipoint AF system. Therefore, the selector 13 shown in FIG. 1 is omitted in the circuit shown in FIG. 4.

Now, the photoelectric signal (a.c.) from one of the light receiving cells 15n on the array sensor 15 is converted into a voltage by an I-V converting amplifier 100 and then, inputted into a PSD 102 (one of the circuits in the PSD 17 shown in FIG. 1) for the synchronous detection with a signal having a standard frequency (vibration frequency) from the OSC 16. The output signal from the PSD 102 contains the component of the standard frequency. Therefore, it is smoothed by the next low pass filter (LPF) 104 which cuts the standard frequency component; hence obtaining a detection signal (S curve signal) FS.

The level of the detection output signal FS is converted into a digital value by an analogue-digital converter (ADC) 106 to be stored in a memory (RAM) 108. The conversion timing of the ADC 106 and the address formation for the memory 108 are performed by a counter circuit 110. The counter circuit 110 counts the up–down pulses from an encoder 114 coupled to a motor 112 which controls the inclination of the plane parallel 12 shown in FIG. 1. The motor 112 is controlled by a drive controller 116 which reads the counted value of the counter circuit 110. The driving amount of the motor 112, that is, the information required to determine the degree at which to change the current position (the counted value of the counter circuit) of the plane parallel 12, is provided by a processor 118.

The processor 118 reads the level variation characteristics (S curve waveform) of the detection signal SF stored in the memory 108 to calculate the inclination or set up an allowable range. Furthermore, the processor 118 is provided with a function to output to a digital-analogue converter (DAC) 120 the digital value of an offset voltage to be added to the detection signal FS as well as a function to open or close a switch $SW_1$ with which to apply the detection signal FS to an adder 122. The adder 122 outputs a voltage in which the offset voltage from the DAC 120 and the detection signal FS are added as a signal DS to the Z-DRV 18. In this respect, a switch $SW_2$ between the DAC 120 and the adder 122 does not add any offset to the detection signal FS itself, but it is switched over from the state shown in FIG. 4 when an offset is to be added to a pursuance target value in the Z-DRV 18 of the Z stage 20.

Now, in the Z-DRV 18, a differential amplifier 124, a power amplifier 126 for driving a motor 19, and others are practically incorporated to calculate the difference between the signal DS from the adder 122 and the target value TS by the differential amplifier 124. The output from the differential amplifier 124 is transmitted to the power amplifier 126 through a switch $SW_4$ to drive the motor 19. When the switch $SW_4$ is switched over from the state shown in FIG. 4, the output of the power amplifier 126 becomes zero. The Z movement of the Z stage 20 is suspended. Also, the target value TS shows its zero level through the switch $SW_3$ in the state shown in FIG. 4. Therefore, if no offset is added to the detection signal FS, the motor 19 is driven to make the detection signal FS zero level (zero point of the S curve) in such a state. When both the switches $SW_2$ and $SW_3$ are switched over from the state shown in FIG. 4, the offset voltage from the DAC 120 becomes a target value TS. Then, the motor 19 is driven to make the level of the detection signal FS identical to the offset voltage of the target value TS.

Now, the switch $SW_4$ is such that it is open when the level of the signal DS is within a given allowable range $\pm \Delta V$ with respect to the target value TS. It is always actuated to be closed outside the allowable range. As it is operated in this way, a window comparator 130 and a DAC 128 are provided. The DAC 128 receives from the processor 118 a digital value corresponding to the value $\Delta V$ of an allowable range to convert such a value into the analogue voltage and transmits it to the window comparator 130. In the window comparator 130, there is provided a circuit to generate a value (TS+$\Delta V$) obtained by adding the target value TS and an allowable value $\Delta V$, and a value (TS−$\Delta V$) obtained by subtracting an allowable value $\Delta V$ from the target value TS as two reference voltages. Consequently, the window comparator 130 generate a signal to cause the switch $SW_4$ to be switched over from the state shown in FIG. 4 to open it when the level of an inputted signal DS is between the two values, (TS+$\Delta V$) and (TS−$\Delta V$). This signal is also transmitted to the processor 118 simultaneously and used as a notice that the servo shifting of the Z stage 20 is completed.

Now, with reference to FIG. 1 to FIG. 4, the description will be made of the operation of an apparatus according to the first embodiment of the present invention. As clear from the structure shown in FIG. 4, the first embodiment is also applicable in the same manner to a conventional apparatus shown in FIG. 34.

At first, in the structure shown in FIG. 1, a fiducial board FM which is arranged in a position different from the wafer W on the Z stage 20 is positioned in a place where the beam from the focus detection system (multipoint AF system) is projected. The fiducial board FM has a size substantially the same or larger than the projection field of the optical projection system PL and is mounted in such a manner that its surface is as much perpendicular as possible to the optical axis AX of the optical projection system PL.

Then, the switch $SW_1$ in FIG. 4 is in the closed state as shown in FIG. 4; the switch $SW_2$, in a state where it is switched over from the position in FIG. 4; and the switch $SW_3$, set in the position shown in FIG. 4. Thus, the fiducial board FM is provisionally focused with respect to the measuring point corresponding to the light receiving cell 15*n* of the multipoint AF system of an inclined incident type. When the focus adjustment is completed for the fiducial board FM, the surface of the fiducial board FM is matched with the hypothetical fiducial plane determined by the multipoint AF system having the measuring points regulated by the light receiving cell 15*n*.

Subsequently, the processor 118 causes the switch $SW_1$ to be opened to output the detection signal FS to the Z-DRV 18. Hence, the switch $SW_4$ also remains to be opened as a matter of course and the shifting of Z stage 20 in the direction Z is prohibited.

Then, the processor 118 outputs an instruction to the drive controller 116 so that the plane parallel 12 is caused to constantly change its inclination angle by a minute amount gradually within a given range. However, the variable range of the inclination angle of the plane parallel 12 must be defined before and after the angle position of the plane parallel 12 as its center at the time of the completion of the focus adjustment with respect to the fiducial board FM.

In this way, the motor 112 is driven by the drive controller 116, and when the plane parallel 12 is inclined by a given minute amount, the counted value of the counter circuit 110 at that time (a value corresponding to the angle position of the plane parallel 12) is read and stored in the memory 108. Further, the counter circuit 110 instructs to the ADC 106 a conversion timing several times (designated as m times). The ADC 106 converts the level of the detection signal FS into a digital value at each conversion timing, and in turn stores it in the memory 108. Consequently, for one angle position data obtainable from the counter circuit 110, there are stored in the memory 108 the m pieces of data which are obtained by digitally sampling the level of the detection signal FS for m times at given timing intervals (of μs or ms order).

Figure 5:
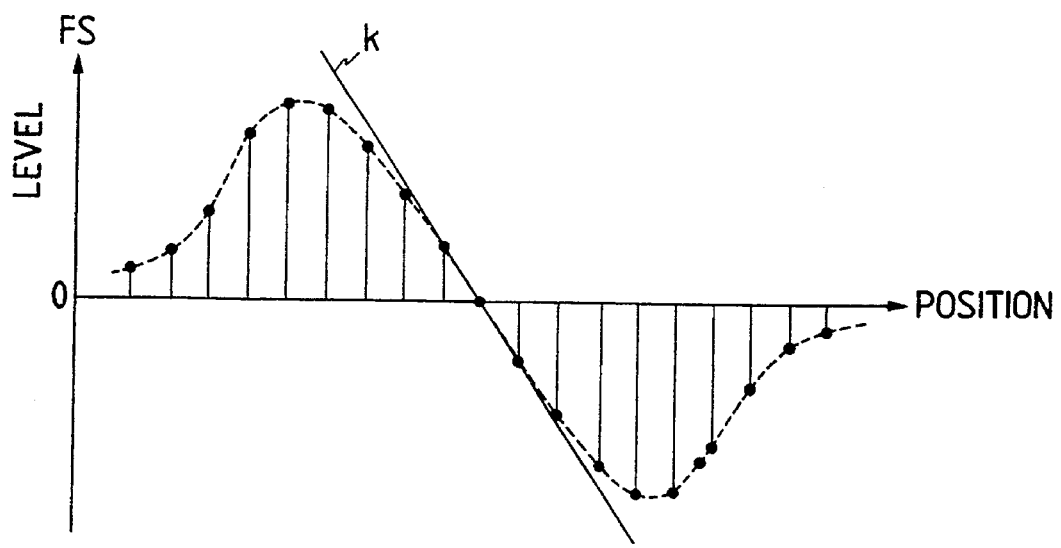
FIG. 5 is a waveform diagram showing an example of detection signal (deviation signal).

When the above-mentioned operation is repeatedly executed in the inclination driving range of the plane parallel 12 designated earlier, the data on the level variation characteristics (S curve waveform) of the detection signal FS are stored in the memory 108. These data are being averaged as one date by the processor 118 from the level values of m pieces of the detection signals FS sampled per angle position of the plane parallel 12, and are restored in the memory 108 sequentially. The level variation characteristics of the detection signal FS thus obtained are represented as shown in FIG. 5 as an example. In FIG. 5, the broken line connecting the plotted points of the respective sampling data represents an envelope of the detection signal FS. Also, the axis of ordinate shows the level of the detection signal FS while the axis of abscissa shows the angle position of the plane parallel 12. The angle positions correspond uniquely to the positions in the direction Z of the Z stage 20. As also clear from FIG. 5, the S curve signal has a waveform which is point symmetrical to the zero point of the level, and has a straight line portion with the zero point as its center. This straight line portion is an area where the detection signal FS (deviation signal) detected by the AF system and the actual amount of the positional deviation (the surface displacement of an object against the fiducial plane) maintain a substantially proportional relationship (linear relationship), and the servo system mostly utilizes this area. Therefore, it may be possible to confine the level variation characteristics of the detection signal FS only to this linear area when stored in the memory 108.

Subsequently, from the characteristics shown in FIG. 5, the processor 118 calculates the sensitivity (rate of change in the signal level against the variation of the positional deviation) $\Delta A$ at the zero point of the detection signal FS or its extreme vicinity by the use of least squares method. In FIG. 5, is obtained the inclination of the straight line k of the linear differential expression drawn on the waveform of the detection signal FS with the zero point as its tangential point. The sensitivity (inclination) $\Delta A$ has a unit of V/µm provided that the detection signal FS is given as voltage (V) and the positional deviation, as µm.

Now, in the processor 118, the value $\Delta Ar$ of the sensitivity which serves as standard (or the sensitivity determined by the previous calibration) is stored. The processor 118 compares the measured sensitivity $\Delta A$ with the standard sensitivity $\Delta Ar$. In this case, if a character display to monitor the measurement sequence is provided in the control rack of an aligner body or the console, it is preferable to enable the value of the measured sensitivity $\Delta A$ to be indicated on the display together with the standard sensitivity $\Delta Ar$.

Figure 6:
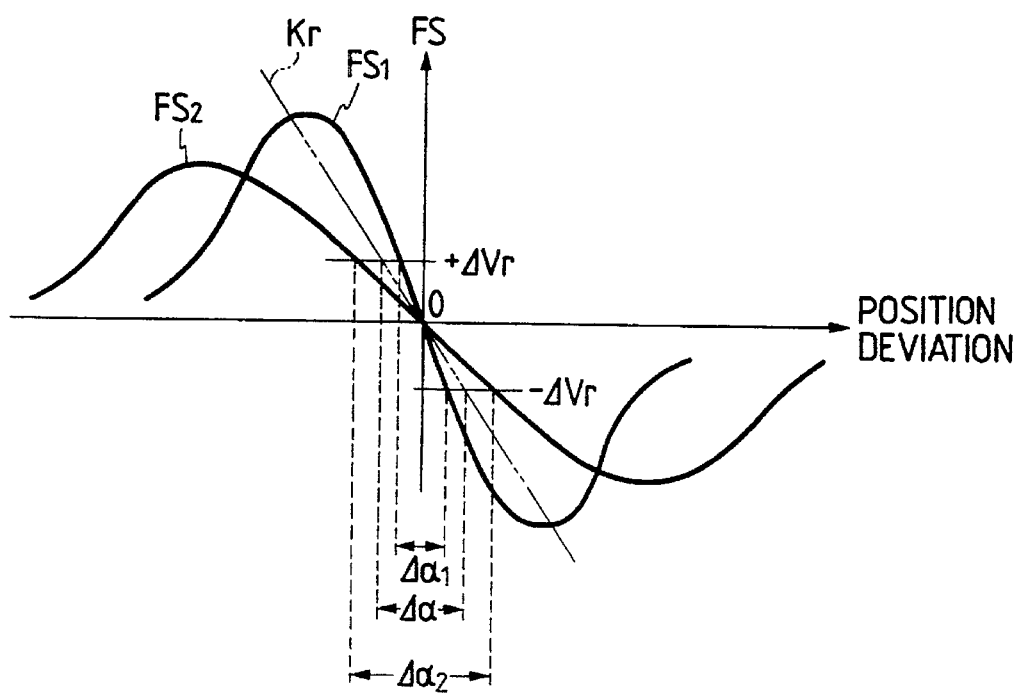
FIG. 6 is a waveform diagram illustrating the difference in the inclination (sensitivity) of detection signals.

Here, with reference to FIG. 6, the significance of the standard sensitivity $\Delta Ar$ will be described in brief. In FIG. 6, the axis of ordinate represents the level of the detection signal FS and the axis of abscissa represents the positional deviation of the Z stage 20 (wafer W, or fiducial board FM) in the direction Z. The zero point is assumed to match the best focus plane. Now, if the straight line Kr passing through the zero point in FIG. 6 is regarded as the standard sensitivity $\Delta Ar$, the servo pursuance range of the Z stage 20 at the time of focus adjustment, that is, an allowable voltage range on the standard sensitivity $\Delta Ar$ corresponding to an allowable range $\Delta \alpha$ of the positional deviation where the focus can be regarded as matching, is set at $\pm \Delta Vr$. This allowable range $\pm \Delta Vr$ corresponds to the window width to be set by the DAC 128 in the window comparator 130 in FIG. 4.

In such a state, let it be assumed that the inclination of the straight line portion of the actual level variation characteristics of the detection signal FS is acuter than the inclination of the straight line Kr of the standard sensitivity $\Delta Ar$ as at $FS_1$. In this case, then, the allowable voltage range $\pm \Delta Vr$ set for the servo system becomes an allowable range $\Delta \alpha_1$ on the positional deviation of the Z stage 20. This is smaller than the standard range $\Delta \alpha$. Therefore, if the servo system can operate stably with the characteristics $FS_1$, the pursuance precision will be enhanced, and no disadvantages may result from this range reduction.

On the contrary, if the inclination of the straight line portion becomes smaller than the inclination of the standard sensitivity $\Delta Ar$ as in the characteristics $FS_2$, a problem will be encountered. In other words, the allowable range on the positional deviation against the allowable voltage range $\pm \Delta Vr$ on the characteristics $FS_2$ becomes $\Delta \alpha_2$. This will of course bring about the relation $\Delta \alpha_2 > \Delta \alpha$ and make the pursuance precision lax. Therefore, in some cases, the wafer W may be displaced from the position that an operator estimates to set within the allowable range $\Delta \alpha$. In other words, each time the focus adjustment is executed, the surface position of the wafer W fluctuates within the $\Delta \alpha_2$, and it may exceed the $\Delta \alpha$. If, therefore, the focus adjustment is executed in each of the shot areas on the wafer W under such conditions, the fluctuation of focusing precision becomes great in the shot area. The fluctuation of the focusing precision deprives the reproducing fidelity (image quality) of the projected pattern transferred to the shot area per shot.

Therefore, the processor 118 compares the measured sensitivity $\Delta A$ and the standard sensitivity $\Delta Ar$, and if any difference is found, the following operation is executed to correct it:

At first, assuming that the allowable range on the positional deviation against the measured sensitivity $\Delta A$ is made equal to the standard value as $\Delta \alpha$, the relations of the following two equations will be satisfied:

$$2 \cdot \Delta Vr / \Delta \alpha = \Delta Ar$$

$$2 \cdot \Delta Vx / \Delta \alpha = \Delta A$$

Here, the $\Delta Vx$ is the allowable voltage range on the level characteristics to be obtained. Therefore, when the above two equations are solved, the following relation will be obtained:

$$\Delta Vx = \Delta A \cdot \Delta \alpha / 2 = \Delta A \cdot \Delta Vr / \Delta Ar \qquad (1)$$

On the basis of this equation (1), the processor 118 executes a correcting operation and stores in it a new allowable voltage range $\Delta Vx$ corresponding to the sensitivity $\Delta A$, at the same time, modifying the value related to the window width which should be set in the window comparator 130 to the $\Delta Vx$ through the DAC 128. In this respect, as clear from the equation (1), when the $\Delta A > \Delta Ar$, the $\Delta Vx > \Delta Vr$ while the $\Delta A < \Delta Ar$, the $\Delta Vx < \Delta Vr$.

Thus, when the calibration for the detection signal FS of the AF system, namely, the calibration of an allowable range corresponding to the sensitivity of the focus deviation signal, is terminated, the processor 118 causes the switch $SW_1$ to return to the position shown in FIG. 4. The usual focus adjustment operation is restored.

Now, with the circuit structure shown in FIG. 4, it is possible to adopt two different methods in performing the servo control at the time of focus adjustment. One is adoptable when the switch $SW_3$ is positioned as shown in FIG. 4 to make the target value TS zero. The other is adoptable when the switches $SW_2$ and $SW_3$ are switched over from the positions shown in FIG. 4 to make the target value TS an offset voltage provided by the DAC 120.

When the target value TS is made zero, the level characteristics of the detection signal FS is always at 0 V according to this method. Therefore, even when an offset voltage is added to the detection signal FS through the DAC 120 and switch $SW_2$ and the characteristics $FS_1$ or $FS_2$ in FIG. 6 are shifted in parallel in the direction of the ordinate axis by the offset portion, for example, the position where the level on the characteristics in the state shifted in parallel arrives at the zero point becomes the target position of the Z stage 20. Therefore, if, assumably, the position in the direction Z where the level on the characteristics before the addition of the offset is at zero point is matched with the best focus plane, the position on the wafer surface for which the focus should be adjusted can be displaced from the best focus plane intentionally. The amount of such a displacement is uniquely determined by an offset voltage and the sensitivity $\Delta A$ of the detection signal.

The same is exactly applicable to the case where an offset voltage is given to the target value TS, and what differs is only that the servo system comes to a standstill when the level of the detection signal FS is matched with the offset value which serves as the target value.

In this respect, when the plane parallel 12 is inclined, it is possible to provide a focus offset. In this case, unlike the offset to which a voltage is given, the level variation characteristics of the detection signal FS have been shifted in parallel in the direction of the positional deviation (direction Z). In other words, regarding the characteristics $FS_1$ or $FS_2$ in FIG. 6, the characteristics $FS_1$ or $FS_2$ have been shifted in parallel in the direction of the abscissa axis in the graph in FIG. 6.

As described above, in the first embodiment, the arrangement is made to suspend the servo system by switching over the switch $SW_4$ when it is caused by the DAC 128 and the window comparator 130 to be positioned in an allowable range, but it may be possible to use a soft ware to implement such a function in the processor 118. In this case, the conversion in the ADC 106 is repeated always at a high speed to allow the processor 118 to read the digital values sequentially and operate comparisons of such values with the allowable range $\Delta Vr$ or $\Delta Vx$ which are stored digitally. Also, the function of the differential amplifier 124 for the servo system should be replaced with a soft ware to work out in turn the difference between the digital value from the ADC 106 and the target value TS digitally stored. Then, the structure is arranged to the difference thus worked out to be impressed upon the power amplifier 126 through the D/A converter.

Thus, in order to suspend the servo system by detecting that the level is in the allowable range $\Delta Vr$ or $\Delta Vx$, the difference between the target value TS and the digital value from the ADC 16 worked out by the software is forcibly made zero on such a software and is simply output to the amplifier 126.

Now, the allowable voltage range $\pm\Delta Vr$ shown in FIG. 6 is a considerably small value in an actual apparatus. Further, the allowable range $\Delta\alpha$ is also extremely small. As an example, for a stepper used for the fabrication of 16 Mbit DRAM, the effective focal depth of its optical projection system PL is approximately $\pm 0.7$ μm, and the allowable range $\Delta\alpha$ is approximately $\pm 0.3$ μm accordingly. Also, the range of the straight line portion of the detection signal FS of the AF system of an incline incident type is $\pm 3$ to 6 μm at the most approximately.

Subsequently, the description will be made of a second embodiment according to the present invention. Fundamentally, the second embodiment is the same as the first embodiment, but what differs is that there is the provision of an additional structure wherein the inclination of the detection signal (S curve signal) corresponding to each of the measuring points in the multipoint AF system in the first embodiment is measured for the calibration of the allowable range for the amount of positional deviation from the target value in the direction Z at each of the measuring points. Therefore, the structures shown in FIG. 1, FIG. 2, and FIG. 3 are also the same in the second embodiment. Only the structure shown in FIG. 4 is partly different.

Figure 7:
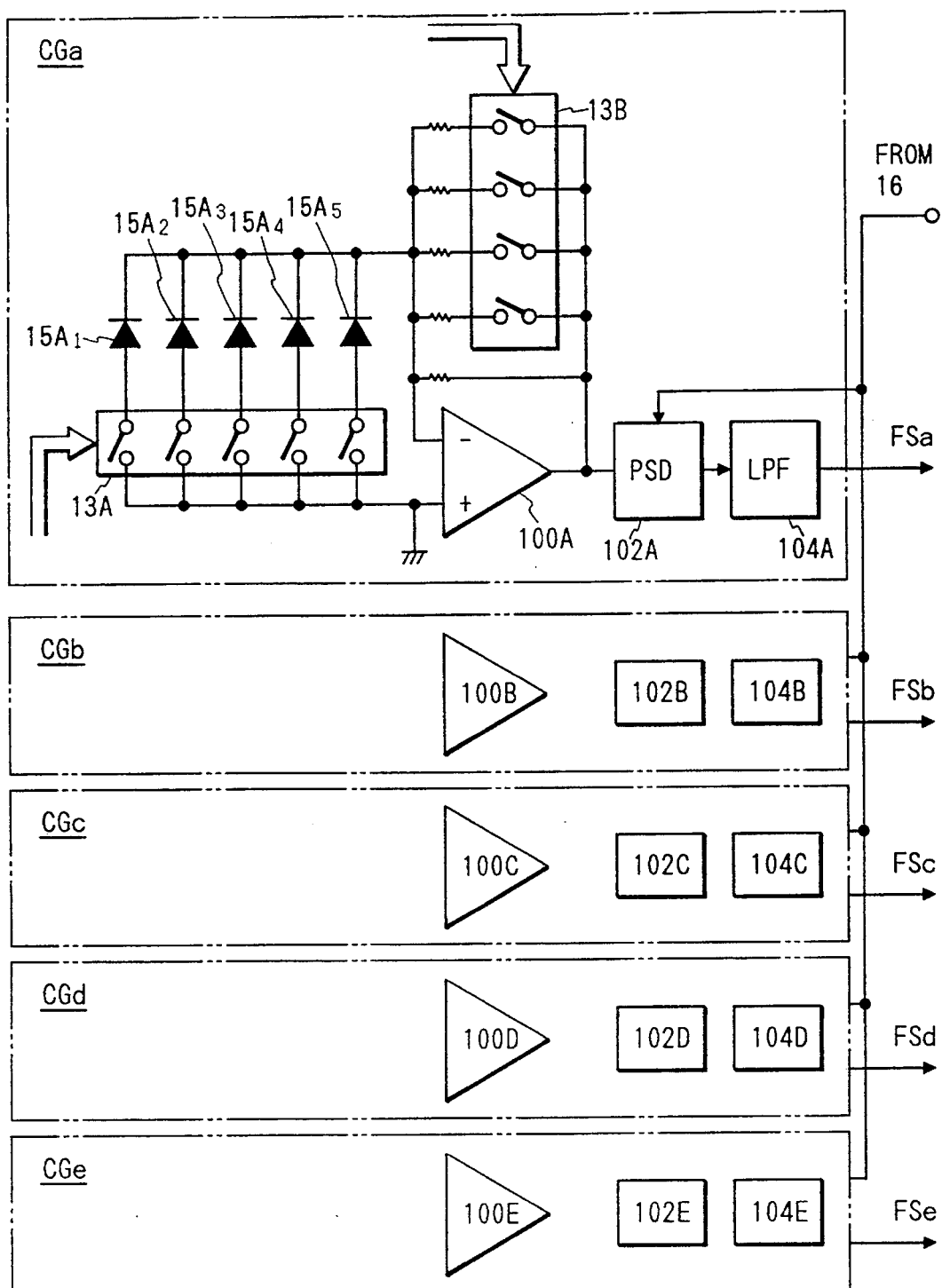
FIG. 7 is a block diagram illustrating the structure of a signal processing system preferably suitable when a second embodiment of the present invention is applied to a multipoint AF system.

FIG. 7 is a view schematically showing an example of the connecting relationship between the array sensor 15 and selector circuit 13 shown in FIG. 1. As shown earlier in FIG. 2 and FIG. 3, too, the array sensor 15 is such that a plurality of light receiving cells are arranged one dimensionally in the longitudinal direction of the slit image ST on the wafer W. Then, the light receiving cell array on the array sensor 15 is divided into five equal portions for the arrangement of the five groups Ga, Gb, Gc, Gd, and Ge are arranged. In each of the groups, several pieces of light receiving cells are included.

In the present embodiment, the structure is made to enable each of the five groups to output photoelectric signals in accordance with the reflective rays of light as shown in FIG. 7. Further, the photoelectric signals from each of the groups are impressed respectively upon the five synchronous detection circuits (PSD) 102A, 102B, 102C, 102D, and 102E and low pass filters which are separately prepared to obtain the five detection signals FSa, FSb, FSc, FSd, and FSe simultaneously. Also, in FIG. 7, the processing circuits of the AF systems are designated by reference marks CGa, CGb, CGc, CGd, and CGe respectively for the five measuring points, but each having the same structure, only the circuit CGa is shown in detail to represent them.

In the light receiving cell group CGa of the array sensor 15, five light receiving cells $15A_1$, $15A_2$, $15A_3$, $15A_4$, and $15A_5$ are included. These cells are connected in series to each of the five switches in a selector circuit 13A and then connected to each other in parallel to be connected to the input of the I–V conversion amplifier 100A. The five switches in the selector circuit 13A are alternatively closed or arbitrarily selected plural switches (two to five) are closed each time by the instruction from the MCU 30 shown in FIG. 1, and the add signal of the photoelectric signal from either one of five light receiving cells $15A_1$ to $15A_5$ or from each of the arbitrarily selected plural cells (two to five) is I–V converted.

In a feed back circuit of the I–V conversion amplifier 100A, five resistors and four switches are arranged as shown in FIG. 7 to correct the gains in accordance with the number of the light receiving cells selected by the five light receiving cells. The four switches are appropriately switched over by the instructions from the MCU 30 in accordance with the selected patterns of the light receiving cells by the selector circuit 13A. Here, the four switches are designated as a gain switching device 13B. Then, the signals from the I–V conversion amplifier 100A are detected by the PSD 102A and LPF 104A. Thus, the circuit CGa outputs the detection signal FSa. Now, the other circuits CGb to CGe are structured exactly the same and output the detection signals FSb to FSe, respectively.

With the above-mentioned structure, when any one of the switches in the five light receiving cells in the group CGa is arbitrarily selected by the selector circuit 13A and closed, the switching over device 13B is changed to make the synthesized resistance in the feed back group of the I–V conversion amplifier 100A the highest, that is, it is switched over to make the I–V conversion gain the highest. In the structure shown in FIG. 7, it is possible to arrange a parallel connection by any one of the arbitrary two, three, four, or five light receiving cells. Therefore, the gain correction of the I–V conversion by changing the switching over device 13B is set at ½, ⅓, ¼, and ⅕, respectively, when the gain is the highest. Thus, if the light receiving cells are made selective even in one group, it is possible to set up the measuring points minutely in response to the pattern structure in the shot area on the wafer W. Also, if some of the light receiving cells in the group are used in parallel, the area usable as measuring points can be expanded in the longitudinal direction of the slit image ST, but it is advantageous in terms of the averaging effect resulting from the photoelectric signal addition, the enhancement of S/N ratio, and the like.

In this respect, with the circuit structure shown in FIG. 7, if an arrangement is made to set up individually the selected pattern by each of the selector circuits 13A of the five circuits CGa to CGe, it becomes possible to select five points arbitrarily out of 25 points apparently existing in the slit image ST.

As described above, when the detection signals FSa to FSe corresponding respectively to the five measuring points are obtained, the inclination and local unevenness of the surface of the wafer W are known from the difference in the zero positions of these signals with respect to the longitudinal direction of the slit image ST. In other words, it becomes possible to correct the inclination (conduct the leveling) of the wafer by obtaining the smoothness of the wafer surface. However, in order to obtain the inclination and local unevenness highly precisely with respect to the fiducial plane (the shifting plane of the XY stage 21) of the wafer surface, it may also be necessary to know the inclination (sensitivity) of the straight line portions of the detection signals FSa to FSe at each of the measuring points in advance. Also, in a case where a focus adjustment is performed by servo controlling the Z stage 20 only on the basis of the detection signals from one arbitrary measuring point of the five measuring points, the effect genuine to the multipoint AF system that the best focus can be matched with a specific portion in the shot area by selecting the measuring points arbitrarily is reduced by half if the allowable deviation range As fluctuates by each of the detection signals.

Therefore, a multiplexer circuit is provided to select either one of the five detection signals FSa to FSe before the ADC 106 shown in FIG. 4, or ADCs are provided respectively for the five detection signals FSa to FSe. In this way, the sensitivities $\Delta Aa$, $\Delta Ab$, $\Delta Ac$, $\Delta Ad$, and $\Delta Ae$ are respectively obtained for the five detection signals FSa to FSe in the same manner as the first embodiment. Then, as in the foregoing equation (1), the allowable voltage ranges $\Delta Vxa$, $\Delta Vxb$, $\Delta Vxc$, $\Delta Vxd$, and $\Delta Vxe$ should be calculated on the basis of the standard allowable deviation range $\Delta \alpha$ regulated by the standard sensitivity $\Delta Ar$.

Or while the sensitivity obtained from one target measuring point of the five measuring points, namely the sensitivity $\Delta Ac$ obtained at a measuring point by the group Gc positioned in the center of the slit image ST, for example, is being defined as the standard sensitivity, the allowable voltage range may be calibrated in response to each of the remaining four sensitivities $\Delta Aa$, $\Delta Ab$, $\Delta Ad$, and $\Delta Ae$. In this case, any allowable deviation range of the AF system corresponding to each of the measuring points other than the target measuring point in the slit image ST can be uniformed to the allowable deviation range of the AF system corresponding to the target measuring point.

Now, when a focus adjustment is performed for a wafer W using the above-mentioned multipoint AF system, it is required as a practical operation to measure the focus displacement at each of the five measuring points and determine one displacement amount by executing an averaging operation or a statistical operation on those amounts of displacement thus measured. Therefore, an example of the signal processing system which may also serve the purpose will be shown in FIG. 8.

Figure 8:
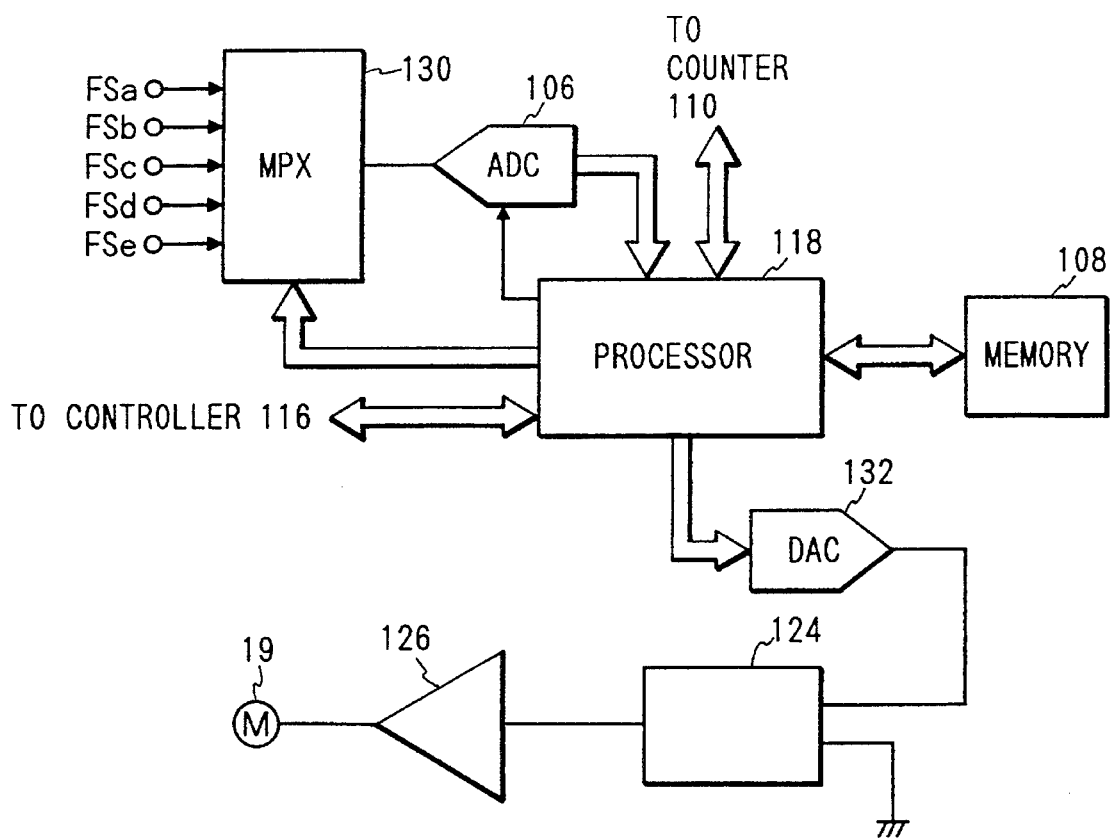
FIG. 8 is a block diagram showing a variation of the structure of the signal processing system and control system preferably suitable for a multipoint AF system.

FIG. 8 is such that the analogue processing in the circuit shown in FIG. 4 is mostly replaced with the operation in the processor 118. Also, in FIG. 8, the same reference numerals are given to the same members as those appearing in FIG. 4. The five detection signals FSa to FSe are inputted into an analogue multiplexer circuit (MPX) 130 which conducts switching by the instructions from the processor 118, and one of them is output to an ADC 106. The conversion timing of the ADC 106 is controlled by the processor 118. The converted digital value is in turn read by the processor 118 and written to the memory 108 at the time of the allowable range calibration. Also, the processor 118 reads the measured values from a counter circuit 110 which is the same as in FIG. 4 and writes it to the memory 108 as required.

Further, in order to perform the focus adjustment, the processor 118 outputs to a DAC 132 the digital value which represents the deviation voltage corresponding to the amount thereby to shifts the Z stage 20 in accordance with each of the measuring values at the five measuring points. Hence, a differential amplifier 124 and power amplifier 126 servo control a motor 19 for the Z stage 20 to allow the Z stage 20 to be set at a target position. When the AF system at each of the measuring points in the above-mentioned structure is calibrated, the measured value from the counter circuit 110 is stored in the memory 108 subsequent to the driving control given to a plane parallel 12 so that it is inclined by a given amount, and at the same time, the MPX 130 is sequentially switched over to output signals FSa to FSe. Hence, each time it is switched over, the digital value from the ADC 106 is read and stored in the memory 108. Again, then, the plane parallel 12 is inclined repeatedly by a given amount to produce in the memory 108 waveform data as shown in FIG. 5 at each of the measuring point for the execution of the calibration.

Figure 9:
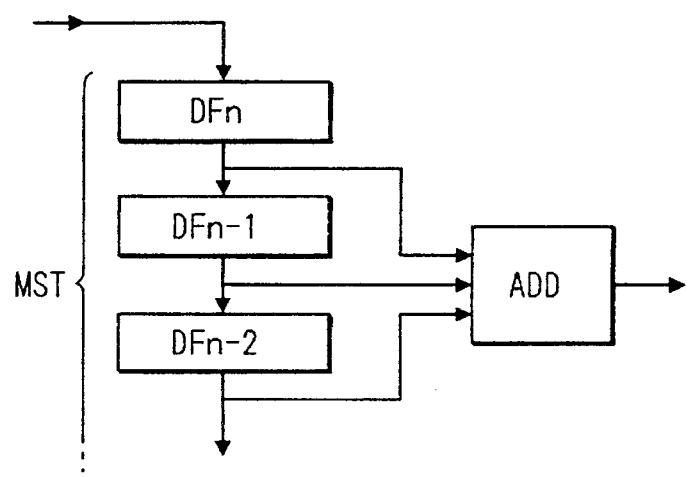
FIG. 9 is a block diagram schematically showing an averaging operation at the time of reading signals.

On the other hand, when the focus adjustment is performed for the wafer W (or the fiducial board FM), the switching of the MPX 130 and the conversion timing of the ADC 106 are conducted at a high speed to read each level of the detection signals FSa to FSe at such a high speed sequentially. Further, the processor 118 stores provisionally a plurality of the level values obtained from several of the repeated reading cycles of each level of the detection signals, and execute operations to average them per detection signal by the use of a software. FIG. 9 is a view schematically showing such a state in a hardware fashion. The processor 118 has five stack memory portions for the five detection signals on a software. FIG. 9 represents one of such stack memory portions MST. This stack memory portion MST is for the detection signal FSa, for example, and each time the level of the signal FSa is read from the ADC 106, the digital value $DF_n$ is written into one address. The digital value $DF_{n-1}$ read one cycle before and the digital value $DF_{n-2}$ read two cycles before are shifted to the adjacent addresses in turn. When a new digital value is written into the stack memory portion MST, an adder ADD adds several of the digital values $DF_n$, $DF_{n-1}$, $DF_{n-2}$, . . . and obtains its averaged value. In this respect, the averaged value can be obtained simply by shifting the resultant data on the addition one bit in the LSB (least significant bit) direction if the digital values to be added is two or by shifting the resultant data on the addition two bits in the LSB direction if the digital values to be added is four.

With the operations described above, the level values of the five detection signals FSa to FSe are drawn into the processor 118 almost on real time. Therefore, the processor 118 calculates the positional deviation amount from the best focus plane at each of the measuring points on the basis of such level values. This operation is started immediately in accordance with each level of the signals FSa to FSe when the shot area to be aligned is shifted by the XY stage 21 to be at a halt at in a given position.

However, in order to execute this operation, it is a prerequisite that the sensitivities ΔAa to ΔAe are obtained respectively for the detection signals FSa to FSe. The processor 118 calculates the positional deviation amount ΔZa, ΔZb, ΔZc, ΔZd, and ΔZe at the respective measuring points in the direction Z in accordance with the level value (voltage) Va, Vb, Vc, Vd, and Ve read for each of the detection signals FSa to FSe as well as each of the sensitivities ΔAa to ΔAe. This operation can be executed simply by multiplying the level values and sensitivities, respectively.

Subsequently, the processor 118 determines the weight for each of the measured values ΔZa to ΔZe in accordance with the weighting coefficient defined in advance by the pattern structure (step and the like) in the shot area, and then, processes the five measured values by operational expressions such as a simple averaging, least squares approximation, spline function, and others to work out an averaged deviation amount ΔZav from the best focus plane on the wafer surface. After that, the processor 118 obtains the difference (ΔZc−ΔZav) between the currently measured value ΔZc of the detection signal FSc of the AF system having its measuring point in the center of the shot area, for example, and the averaged deviation amount ΔZav, and further, obtains the level difference on the detection signals FSc corresponding to such a difference. Now, since the sensitivity of the detection signal FSc is ΔAc, the level difference is obtainable by ΔAc·(ΔZc−ΔZav). Then, by adding this value to (or subtracting it from) the level Vc of the current detection signal FSc, a level value Vc' can be obtained. This value will be a target value. In other words, the processor 118 outputs to the DAC 132 shown in FIG. 8 the driving data which enable the level of the detection signal FSc to vary from Vc to Vc'. Thus, the Z stage 20 is shifted in the direction Z. The processor 118 monitors in turn the level of the detection signal FSc and cause the Z stage 20 to be suspended by making the driving data to the DAC 132 zero when such a level reaches the target value Vc' in the allowable voltage range set at the time of calibration.

Now, the description will be made of a third embodiment according to the present invention. Here, however, the method to provide an offset at each of the measuring points will be described with the assumption that the sensitivity of the AF system corresponding to each of the measuring points of a multipoint AF system is confirmed, and that the allowable range is calibrated.

As shown in FIG. 2, in the multipoint AF system having a number of measuring points in the projection field If, the height of the wafer surface for which the signal of the AF system corresponding to each of the measuring points becomes its zero point is arranged to be matched with the best focus plane (reticle conjugate plane) of the optical projection system PL as much as possible. To be strict, however, the best focus plane does not present an ideal plane due to the optical performance of the optical projection system PL, the flatness of the pattern surface of the reticle R, and others. Now, even if it presents an ideal plane, there is no assurance that it is strictly orthogonal to the optical axis AX of the optical projection system PL due to the holding condition of the reticle R and others. Therefore, if the best focus points (height) are obtained among the countless points in the pattern projection image by the optical projection system and the surface including them is imagined, such a surface is inclined to the ideal plane perpendicular to the optical axis AX totally and is curved to the ideal plane locally.

Now, it is necessary to obtain the real position of the best focus at each of the measuring points in the multipoint AF system at a high speed and know the amount of deviation between the position in the direction Z which is detected by the AF system as its zero point and the real position of the best focus at each of the measuring points. If such an amount of the deviation is known at each of the measuring points, it is possible to realize the multipoint AF system taking the inclination and curvature of the best focus plane into account in addition to the inclination and unevenness of the wafer surface by providing the amount of the deviation for each of the AF systems as an offset value.

Figure 10:
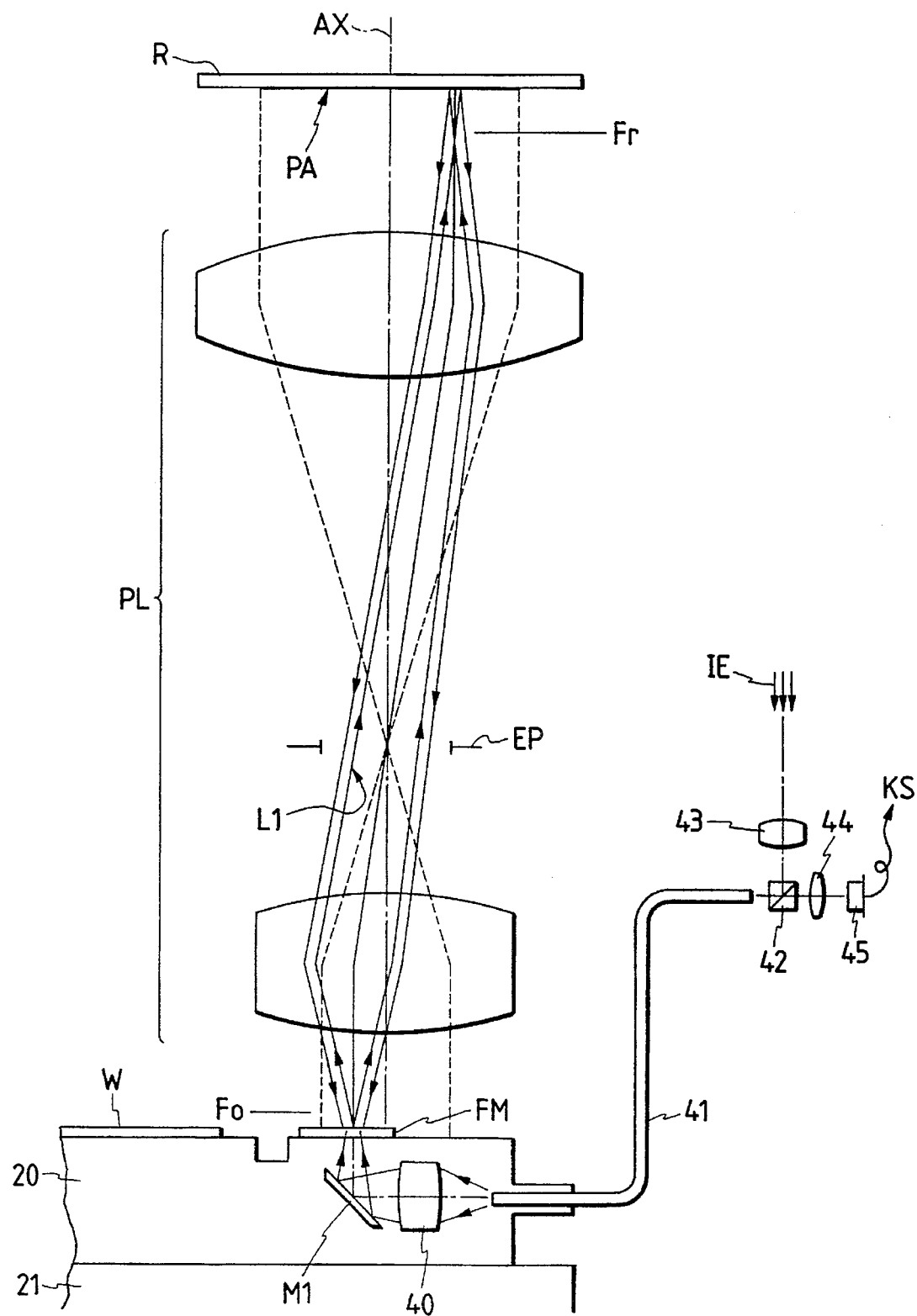
FIG. 10 is a view illustrating the structure of a focus checking system of a through-the-lens type (TTL-FC).

FIG. 10 is a view showing the structure of a TTL-FC (through-the-lens focus check) system to detect the real position of the best focus at an arbitrary position in the projection field If of the optical projection system PL in a state where a reticle for the real device alignment is installed.

Figure 11:
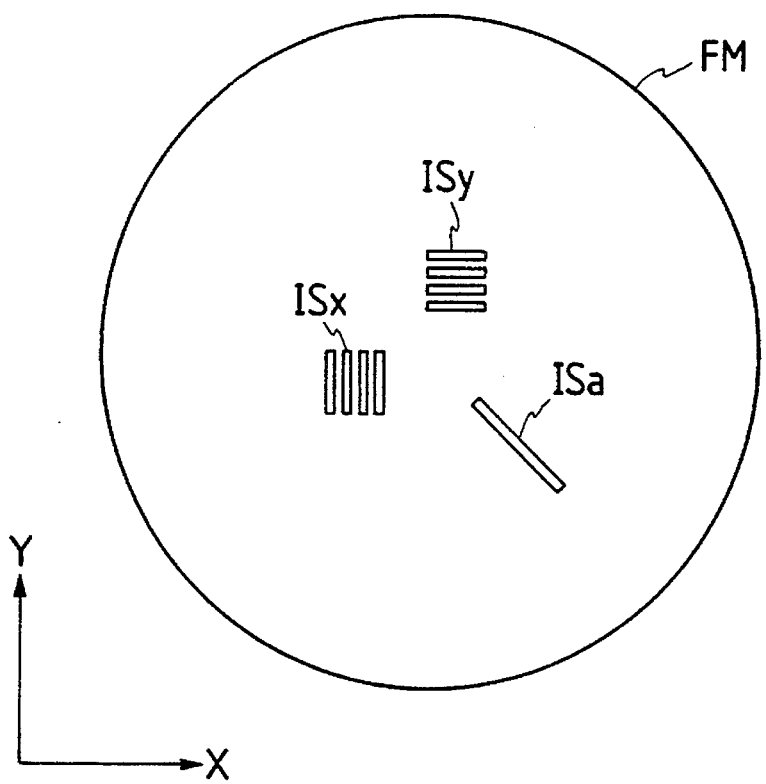
FIG. 11 is a plan view showing the shape of light emitting marks of the TTL-FC system.

In FIG. 10, the reticle R with the circuit pattern area PA being formed on the lower surface thereof for fabricating a real device is held by a reticle holder which is not shown. The optical axis AX of the optical projection system PL schematically represented by dividing its front group and rear group with its diaphragm plane (pupil plane) Ep therebetween runs through the center of the reticle R, that is, through the center of the pattern area PA perpendicularly to the reticle pattern surface. On a part of the Z stage 20 which is shifted minutely (within ±100 μm, for example) in the direction of the optical axis AX with the wafer W mounted thereon, a fiducial board FM is fixed at a position substantially equal to the height of the surface of the wafer W. On this fiducial board FM, there are arranged as shown in FIG. 11, a mark ISy which is formed with plural slits of a transmitting type extending in the direction X at given pitches in the direction Y, a mark ISx which is formed with plural slits of a transmitting type extending in the direction Y at given pitches in the direction X, and an inclined slit ISa formed at an angle of 45° to the directions X and Y, respectively. These slit marks ISx, ISy, and ISa are inscribed as transparent portions on the chrome layer (light shielding layer) deposited over the entire surface of the fiducial board FM made of quartz.

Now, in FIG. 10, below the fiducial board FM (in the Z stage 20), a mirror M1, an objective lens 40 for illumination, and a optical fiber 41 are arranged. The illuminating light from the emitting end of the optical fiber 41 is converged by the objective lens 40 to irradiate all the slit marks ISx, ISy, and ISa of the fiducial board FM from its reverse side. On the incident side of the optical fiber 41, a beam splitter 42 is arranged to guide the illumination light for exposure IE into the optical fiber 41 through a lens system 43. It is desirable to obtain the illuminating light IE from alight source (mercury lamp, excimer laser, or the like) for illuminating the reticle R, but a light source dedicated for this may be provided separately. However, if any separate light source is used, it is necessary to employ an illuminating light having the same wavelength as or extremely close to the exposure illumination light.

Also, the conditions of the objective lens 40 to illuminate the fiducial board FM should be matched with those of the optical projection system PL at the time of pattern projection as much as possible. In other words, the aperture number (N.A.) of the illuminating light on the image side of the optical projection system PL and the aperture number (N.A.) of the illuminating light from the objective lens 40 to the fiducial board FM are substantially matched.

Now, with a structure such as this, when the illuminating light IE is induced to the optical fiber 41, the image beams which inversely progress to the optical projection system PL are emitted from the marks ISx, ISy, and ISa on the fiducial board FM. In FIG. 10, the Z stage 20 is assumed to have been set to allow the fiducial board FM to be positioned slightly below the best focus plane (reticle conjugate plane) Fo of the optical projection system PL. At this juncture, the image beam L1 emitted from one point on the fiducial board FM passes the center of the pupil EP of the optical projection system PL. After being converged on a plane FR which is slightly deviated down from the pattern surface of the reticle R, this beam is dispersed and returned to the original optical path after being reflected on the pattern surface of the reticle R. Here, the plane Fr is positioned conjugately with the fiducial board FM with respect to the optical projection system PL.

Figure 12:
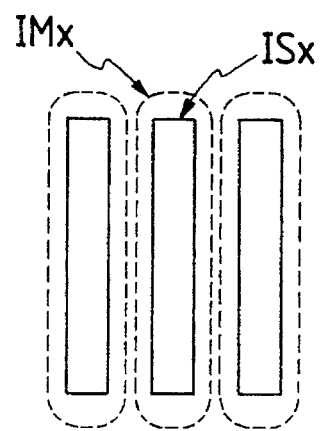
FIG. 12 is a plan view showing the relationship between the light emitting mark and reflective image.

If the optical projection system PL is of telecentric system on both sides, the image beams from the light emitting marks ISx, ISy, and ISa on the fiducial board FM are normally reflected on the lower face (pattern surface) of the reticle R and are returned to be superposed with the marks ISx, ISy, and ISa again. However, if the fiducial board FM is displaced from the best focus plane Fo as shown in FIG. 10, the blurrily reflective images each of the marks ISx, ISy, and ISa are formed on the fiducial board FM. On the other hand, when the fiducial board FM and the plane Fo are matched, the plane Fr is also matched with the pattern surface of the reticle R. On the fiducial board FM, therefore, the sharply reflected images each of the marks ISx, ISy, and ISa are formed to be superposed with the respective marks. FIG. 12 illustrates schematically the relationship between the light emitting mark ISx and its reflective image IMx when the fiducial board FM is defocused. In the optical projection system PL which is telecentric on both sides, the reflective image IMx is projected on the light emitting mark ISx, the origin of the image itself as shown in FIG. 12. Thus, if the fiducial board FM is defocused, the reflective image IMx becomes larger than the contour dimension of the mark ISx, and the illuminance per unit area is also reduced.

Therefore, the beams of the image portions of the reflective images formed on the fiducial board FM, which are not shielded by the original marks ISx, ISy, and ISa are received by the optical fiber 41 through the mirror $M_1$ and objective lens 40 and received by the photoelectric sensor 45 further through the beam splitter 42 and lens system 44. The light receiving surface of the photoelectric sensor 45 is arranged substantially conjugately with the pupil plane (Fourier transform surface) EP of the optical projection system PL.

A system known as a conventional TTL-FC system of the kind obtains electric signals to detect contrast by optically or electrically scanning the reticle marks in the XY plane with the arrangement of the light emitting marks, light receiving marks, or simple reflective fiducial marks on the image plane side of an optical projection system. In the structure shown in FIG. 10, however, it is unnecessary to obtain any electric signals to indicate the variation of the contrast by scanning the fiducial board FM in the XY plane as in the conventional system. The contrast can be obtained simply by shifting the Z stage 20 in the vertical direction (direction Z).

Figure 13A:
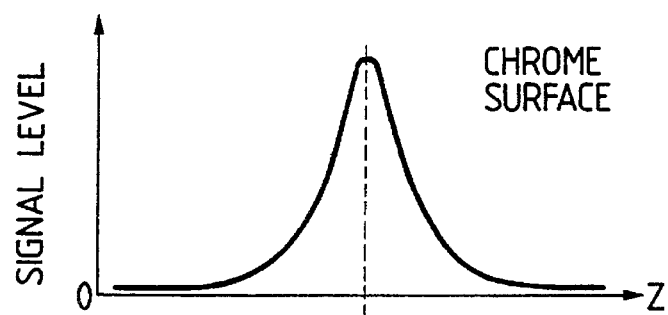
FIGS. 13A and 13B are waveform diagrams showing an example of photoelectric signal obtainable by the TTL-FC system.
Figure 13B:
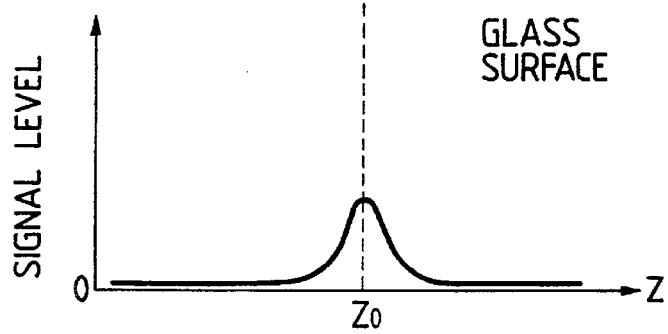

FIGS. 13A and 13B represent the signal level characteristics of the output signal KS of the photoelectric sensor 45. The axis of abscissa shows the positions of the Z stage 20 in the direction Z, namely, the height positions in the direction of the optical axis AX of the fiducial board FM. FIG. 13A shows the signal level when the light emitting marks ISx, ISy, and ISa are reversely projected on the chrome portion in the pattern surface of the reticle R. FIG. 13B shows the signal level when these marks are reversely projected on the glass portion (transparent portion) in the pattern surface. Usually, the chrome portion of the reticle is deposited on a glass (quartz) plate of approximately 0.3 to 0.5 μm thick, and the reflectivity of the chrome portion is significantly greater than that of the glass portion as a matter of course. Nevertheless, since the reflectivity of the glass portion is not completely zero, it is still possible to detect it although the reflectivity is considerably small as a level as shown in FIG. 13B. Also, in general, a reticle for a real device fabrication has a high pattern density. Conceivably, therefore, the probability is extremely small that all the reversely projected images of the light emitting marks ISx, ISy, and ISa (in an area of one to several micron diameter on the reticle) are placed over the glass portion (transparent portion) in the reticle pattern at a time. In any case, if the surface of the fiducial board FM is shifted in the direction of the optical axis so that it transverses the best focus plane Fo, the signal level presents the greatest value at a position Zo in the direction Z. Accordingly, the position of the best focus plane Fo can be obtained by measuring the position of the Z stage in the direction Z (level of the detection signal FS) and the output signal KS simultaneously for the detection of the position in the direction Z at the time of the level of the signal KS becoming the greatest. Moreover, in this detection method, it is possible to detect the best focus plane Fo at an arbitrary position in the reticle R. In other words, there is no need for the use of patterns (marks) formed at specific positions in the reticle as in the conventional art. If only the reticle R is set on the object side of the optical projection system PL, an absolute focus position (optimal imaging plane Fo) can be measured at an arbitrary position in the projection field at any time. Also, as described earlier, the chrome layer of the reticle R is 0.3 to 0.5 μm thick, and the detection error of the optimal imaging plane Fo due to this thickness is $(0.3 \text{ to } 0.5) \times (1/5)^2 = 0.012$ to 0.02 μm provided that the projection power of the optical projection system PL is of a 1/5 reduction. This value is almost negligible.

Figure 14A:
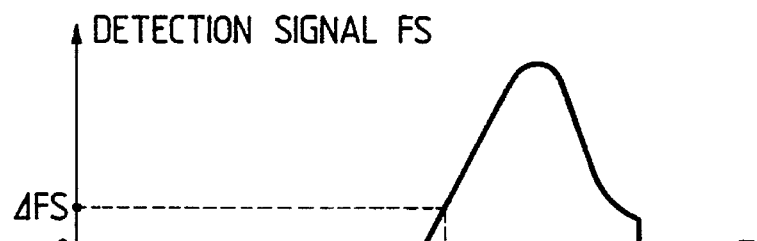
FIGS. 14A and 14B are waveform diagrams showing the state where an offset measurement is performed for an AF system of an inclined incident type using photoelectric signals from the TTL-FC system.
Figure 14B:
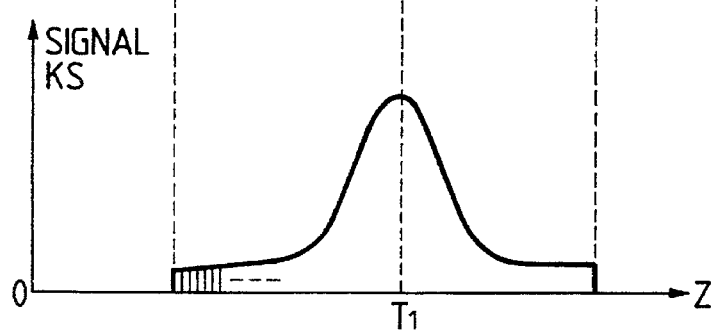

Therefore, the light emitting mark group shown in FIG. 11 is positioned at the measuring points of the multipoint AF system in the projection field IF or in the vicinity thereof. Then, the variation of the level of the signal KS and the variation of the level of the detection signal FS are drawn by the A–D converter simultaneously while the Z stage 20 is being shifted are stored in the memory (RAM). Subsequently, as shown in FIGS. 14A and 14B, the waveforms of both of them are compared by the processor to obtain the level value ΔFS of the detection signal FS corresponding to the position $T_1$ at the peak point of the level variation of the signal KS. Such a value becomes an offset amount (proper error) from the absolute position of the AF system corresponding to one of the measuring points of the multipoint AF system.

Here, the offset amounts ΔFSa, ΔFSb, ΔFSc, ΔFSd, and ΔFSe are respectively obtained for each of the five measuring points by the TTL-FC system shown in FIG. 10 and stored. This operation should be executed once each time reticles R are replaced in principle. However, in a stepper employed for exposing versatile integrated circuits, a same reticle may be installed all day long or continuously for several days, it is desirable to remeasure the offset amount periodically.

Figure 15:
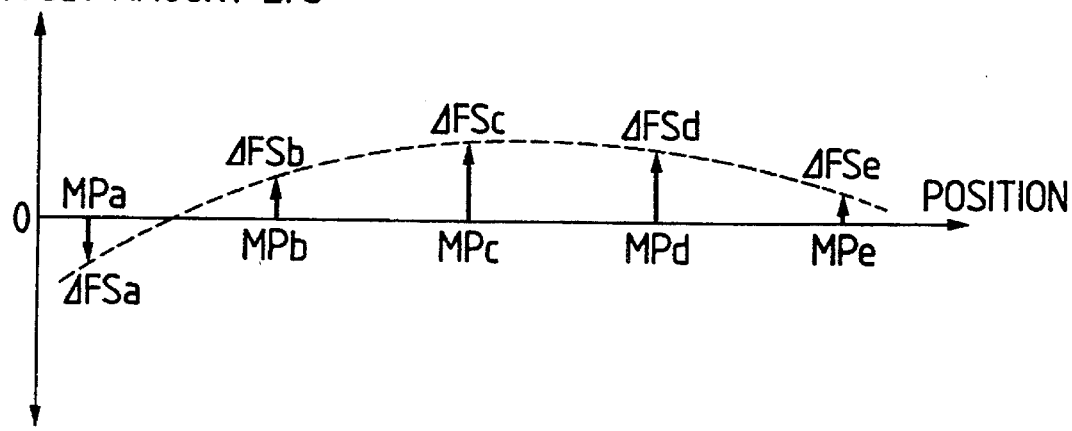
FIG. 15 is a view schematically showing an offset inclination when the projected image is curved.

When the above-mentioned offset amount measurement is executed, it is possible for the multipoint AF system to perform the focus adjustment taking the image plane inclination and image plane curvature into consideration because the sensitivities $\Delta Aa$ to $\Delta Ae$ of the detection signals FSa to FSe have already been measured at each of the measuring points and the allowable deviation range $\Delta\alpha$ has already been defined as well. FIG. 15 is a graph schematically showing with exaggeration an example of the offset tendency when the image curvature is present. In FIG. 15, the axis of abscissa represents the positions of the slit image ST in the longitudinal direction, and the axis of ordinate represents the offset amount at each of the five measuring points MPa to MPe.

When this offset tendency is stored in advance, and a focus adjustment is performed by obtaining an averaged proximate plane with the measurement of the positional deviation in the direction Z on the wafer surface at each of the five measuring points MPa to MPe or a pinpoint AF is performed to focus the wafer surface on the basis of the detection signal at an arbitrary one point of the five measuring points, these offset amounts are handled as displacement amounts of real positions from the best focus plane after being corrected by addition or subtraction with respect to each level of the detection signals FS. For example, regarding the measuring point MPc in FIG. 15, the real position of the best focus plane is a point where the detection signal FSc is positively offset by $\Delta$FSc.

Also, the allowable deviation range $\Delta\alpha$ is calibrated to be set uniformly at all the measuring points MPa to MPe. Hence, an allowable deviation range of a constant width exists with the offset tendency represented by the broken line in FIG. 15 as its center. In other words, regarding the measurement point Cc, the level of the detection signal FSc is recognized to be in the best focus position when it arrives at a value between $\Delta$FSc+$\Delta\alpha$/2 and $\Delta$FSc–$\Delta\alpha$/2 where the allowable deviation range is $\pm\Delta\alpha$/2. Thus when the actual focus adjustment is performed after obtaining the offset amount as a system error related to the real plane of the best focus, the focus adjustment becomes extremely accurate whether it is made by the averaged AF which specifies the proximate plane or by the pinpoint AF if only the allowable deviation rang $\Delta\alpha$ is uniformly set for each of the detection signals FSa to FSe.

In this respect, if the projection image plane itself is curved or inclined as shown in FIG. 15, it may be possible to implement a method wherein the proximate plane of such an image plane is predetermined using the least squares method, spline function or the like and then, the focus adjustment is performed to match the wafer surface with the proximate plane.

Figure 16:
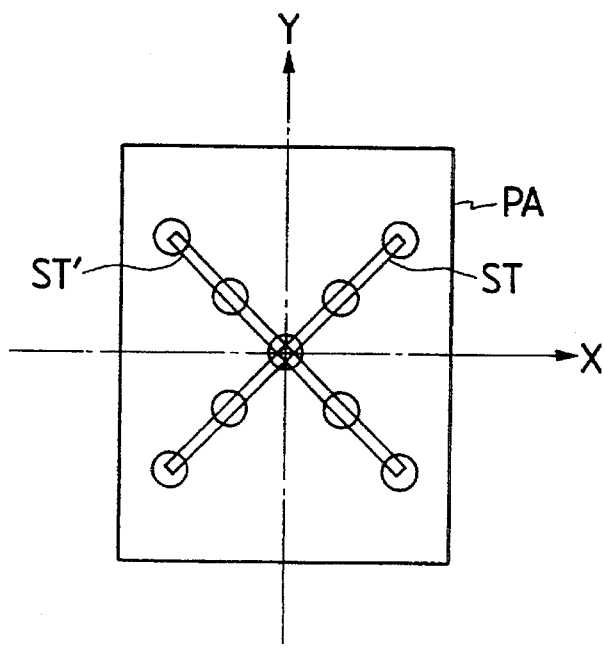
FIG. 16 is a plan view showing a variation of the measuring point arrangement of a multipoint AF system.

Now, since the projection system for the slit image ST shown in FIG. 2 is such that it is inclined by an angle of 45° to the X–Y coordinate axes, it lacks the ability to specify any plane as a multipoint AF system. Therefore, it is effective to arrange another set of multipoint AF system in the direction at an angle of 135° to the X and Y optical axes and project the slit image ST' as shown in FIG. 16 at the same time. In this way, it is possible to set nine measuring points (each marked with a circle in FIG. 16) including the four corner areas, center and others in the pattern area PA (shot area on the wafer). As a result, five points must be selected on each of the two sets array sensors to provide ten (or nine) synchronous detection circuits in total.

Also, for the multipoint AF system, the same effect as in each of the above-mentioned embodiments can be obtained by a method wherein a minute slit image or spot image is diagonally projected individually at each of plural measuring points predetermined in the projection field If, and the reflective slit (spot) images from the respective measuring points are collectively received by two dimensional imaging elements, CCD, for example; thus outputting the deviation signals corresponding to the amounts of displacement of the received images from the respective fiducial positions on the CCD. Furthermore, each of the embodiments is equally applicable to a multipoint AF system wherein spot rays of light are projected to a plurality of points on the wafer, four points, for example, only through an optical projection system.

Subsequently, the description will be made of a fourth embodiment according to the present invention. In the present embodiment, the description will be made of a stepper provided with a multipoint AF system of an inclined incident type, but an apparatus of the present embodiment being fundamentally the same as the one shown in FIG. 1 in its structures, the description of the entire structure thereof will be omitted. In the embodiment set forth below, the description will be centered on what differs from the apparatus structures of the first through third embodiments.

Figure 17:
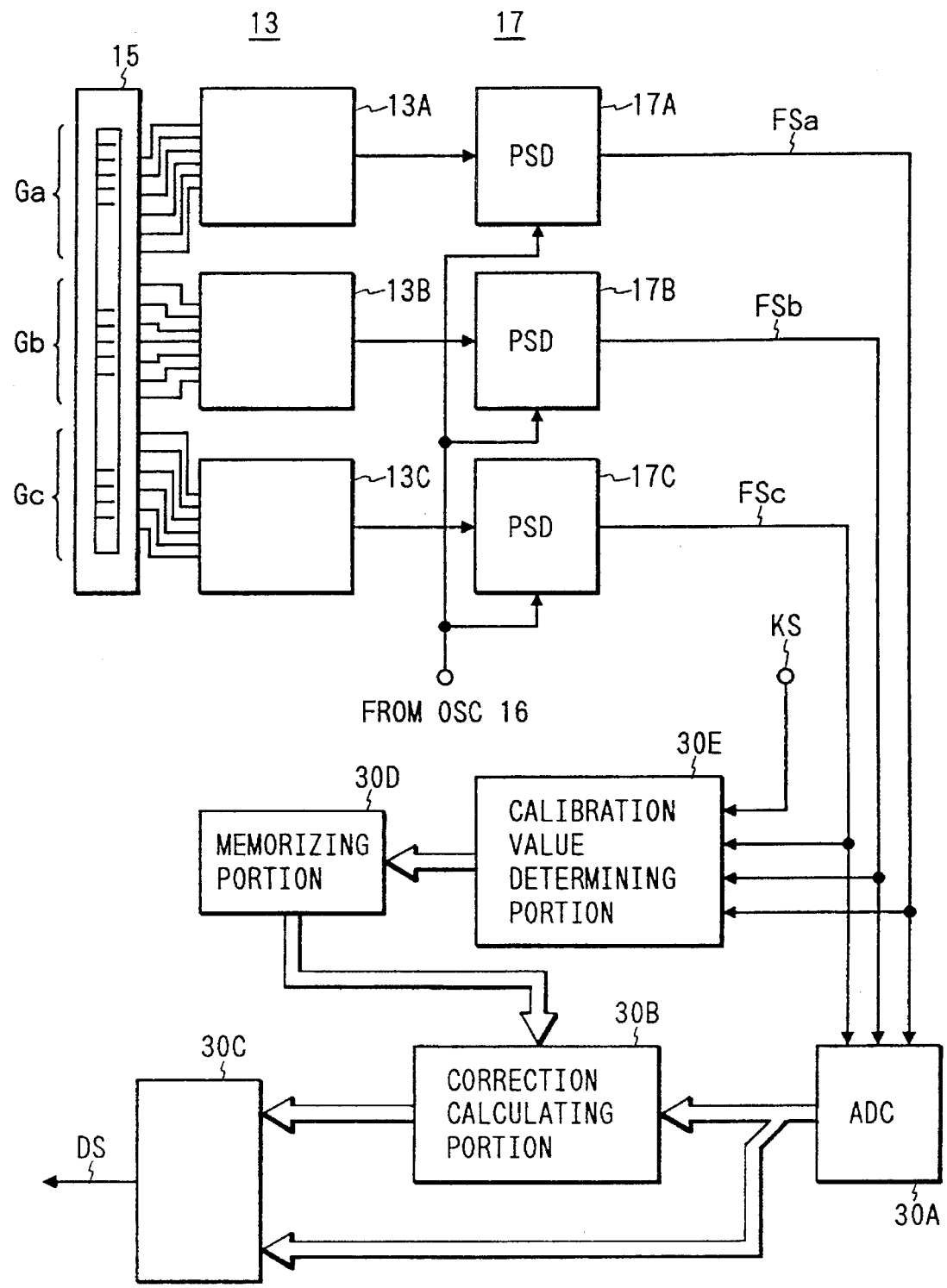
FIG. 17 is a block diagram illustrating the structure of a signal processing circuit of a first focus detection system (multipoint AF system) used for a fourth embodiment according to the present invention.

FIG. 17 shows an example of the specific processing circuits of a selector 13, array sensor 15, PSD 17 and MCU 30 constituting an apparatus (FIG. 1) of the present embodiment. Here, the light receiving cells in the array sensor 15 are divided into three groups Ga, Gb, and Gc, and it is assumed that the selection and coordination of the light receiving cells are conducted in each of the groups. The group Gb is designed to select the central part of the slit image ST while the groups Ga and Gc are to detect both ends of the slit image ST.

Now, in the group Ga, a plurality of light cells in the array sensor 15 are included, and at least one cell among them is selected by a selector 13A. The output signal of the light receiving cell thus selected is output to a PSD 17A. In this respect, the selector 13A is provided with a function to select two or three adjacent cells in the group Ga arbitrarily and transmit to the PSD 17A the signals to which the output signals from such cells are added, besides the function to select an arbitrary one cell in the plural light receiving cells in the group Ga and transmit its output signal to the PSD 17A. Also, the output signals from each of the light receiving cells in the groups Gb and Gc are processed likewise by the selectors 13B and 13C. The selected signals are transmitted to the PSDs 17B and 17C.

The PSDs 17A, 17B, and 17C receive the basic wave a.c. signals from the OSC. 16, respectively, and output the detection signals FSa, FSb, and FSc. The detection signals FSa, FSb, and FSc thus output are respectively converted into the digital signals by an analogue-digital converter (ADC) 30A in the MCU 30, and are transmitted to a correction calculation portion 30B. The correction calculating portion 30B works out the value which corresponds to the position in the direction Z serving as a target with which to position the Z stage 20 in accordance with the three output values, namely, the focus displacement amount at three point, and outputs the value thus calculated to the deviation detecting circuit 30C.

Also, the detecting circuit 30C outputs the value which differs from the detection output of the ADC 30A to the Z-DRV 18 as an instruction signal DS. At this juncture, the correction calculating portion 30B induces into it the offset value stored in advance in the memory 30D for each of the detection outputs FSa, FSb, and FSc and executes various operations. This offset value has been measured and calculated by the calibration value determining portion 30E, and the determining portion 30E receives the three detection outputs FSa, FSb, and FSc as well as the output signal KS of the photoelectric sensor 45 and obtains the deviation between the fiducial plane of the multipoint AF system itself and the best focus plane Fo as a deviation voltage from the zero level of the detection output.

In this respect, the deviation detection circuit 30C selects either one of the three values of the detection outputs from the ADC 30A and compares it with the target value from the calculating portion 30B. Therefore, a servo system which enables such a resultant difference to be zero or a given value is incorporated. Also, in the calibration value determining portion 30E, an A–D converter, waveform memory, and others are included to digitally sample each level of the three detection outputs and the level of the signal KS at the same time.

Here, with reference to FIG. 18, a specific example of the structure of the calibration value determining portion 30E will be described. At first, the output signal KS from the photoelectric sensor 45 of the TTL-FC system shown in FIG. 10 is inputted into an analogue-digital converter (ADC) 300 and converted to the digital value which corresponds to its signal level. It is stored in a memory (RAM) 301. The address designations for the RAM 301 are conducted by a counter 304. Both of the increment of the counter 304 and the converting timing of the ADC 300 respond to the clock pulses from a clock generator (CLK) 303.

Likewise, one of the three detection output signals FSa, FSb, and FSc is inputted into the ADC 305 through a selection switch, and its converted digital value is stored at the address in a RAM 306 designated by the counter 307. Therefore, in the RAMs 301 and 306, the temporal variations of the respective wave forms of the output signal KS and one of the detection outputs are stored (FIGS. 14A and 14B). The waveforms stored in the RAMs 301 and 306 are used in the calculation processing portion 310 as smoothing, maximum value detection, and other processing data. In this respect, the calculation processing portion 310 outputs to the Z-DRV 18 the instruction signals to shift the Z stage 20 and others, at the same time outputting to an XY-DRV 22 the signal to shift the center of the light emitting mark to the position of each measuring point of the multipoint AF system in order to store the signal waveforms in the RAMs 301 and 306. Also, since the detection output signal becomes a waveform substantially symmetric to the zero point as its center, the A–D conversion is conducted with a consideration given to its negative levels for any of the data having a negative level smaller than the zero point.

Now, in the RAM 301, the maximum value of the waveform of the signal KS is stored with the time axis as its address. The calculation processing portion 310, therefore, analyzes the waveform shown in FIG. 14B to obtain the time $T_1$ at which the maximum point is provided. This time $T_1$ uniquely corresponds to a specific address point in the RAM 301. Subsequently, the calculation processing portion 310 accesses the corresponding address point in the RAM 306 to obtain the level value AFS of the detection output signal stored in such an address point. This level value ΔFS is an offset value from the zero point of the detection signal, and at the measuring point of the multipoint AF system generating the detection output as shown in FIG. 14A, the wafer surface and the best focus plane Fo can be matched if the wafer surface is shifted in the direction Z at such a measuring point so that the detection output becomes +ΔFS.

Figure 18:
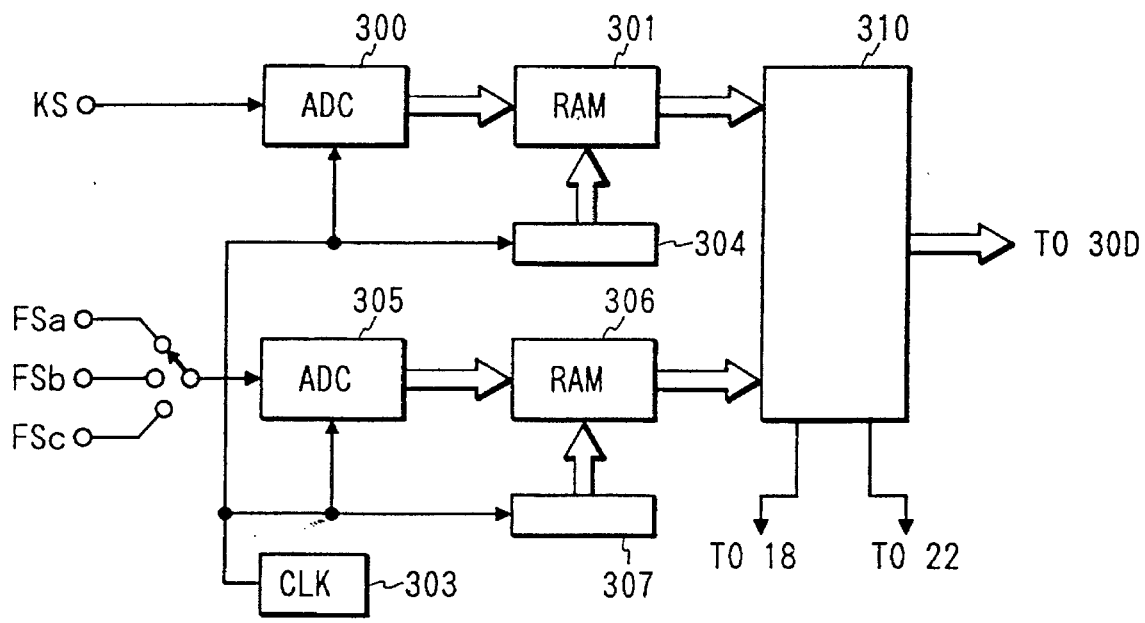
FIG. 18 is a block diagram illustrating the structure of a signal processing circuit of a second focus detection system (TTL-FC system) used for the fourth embodiment.

Now, when the circuit shown in FIG. 18 is used, the XY stage 21 is shifted to position the center of the light emitting marks on the fiducial board FM in order to place it at any one of the positions of the plural measuring points of the multipoint AF system. It is unnecessary to make such positioning very strictly. There will be no problem even if the measuring point of the multipoint AF system and the center of the group of the light emitting marks are displaced in the X and Y directions by 100 μm approximately. Therefore, when the measuring point of the multipoint AF system, that is, the point in the slit image ST shown in FIG. 2, is determined, it may be possible to obtain the coordinate positions where the peak of the signal KS becomes great to a certain extent by displacing the position of the light emitting mark group within a range of approximately ±100 μm in the directions X and Y with such a point as its center while swinging it in the direction Z at the same time. This is effective to avoid as much as possible a drawback that the light emitting mark group is entirely matched with the transparent portion of the reticle R (the reduction of the S/N ratio of the signal KS), although the probability is extremely small. However, when the calibrating operation is performed at a high speed, it is possible to obtain the offset value ΔFS with a substantially same precision without any particular searching of the coordinate positions where the peak of the signal becomes great.

Figure 19:
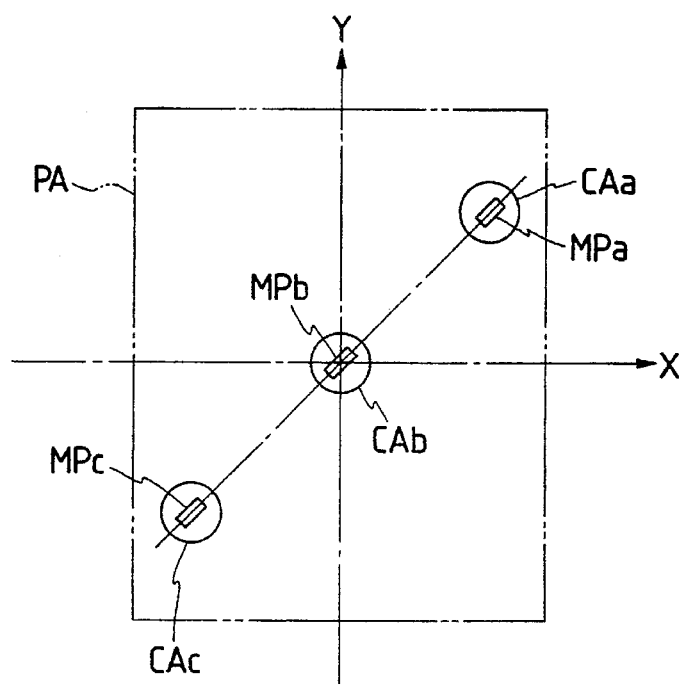
FIG. 19 is a view showing an example of the measuring point arrangement in a shot area on a wafer according to a multipoint AF system.

FIG. 19 is a view schematically showing the relationship between the three measuring points MPa, MPb, and MPc of the multipoint AF system and the areas CAa, CAb, and CAc where the center points of the light mark groups are present, in which the optical axis AX of the optical operation system PL, is assumed to pass the intersecting point of the axis X and axis Y. Each of the measuring points MPa to MPc corresponds to the position of the light receiving cells on the array sensor 15. Also, a reference mark PA designates an area when the pattern area of a reticle R is projected, namely, the range of one shot area on the wafer. In the present embodiment, the three points on the slight image ST are defined as the measuring points, and the measuring point MPb is assumed to be set in the vicinity of the shot center point while the other measuring points MPa and MPc are set in the vicinity of both end of the slit image ST. Further, for the simplicity of the description set forth below, no scribe lines are given on the axes X and Y in FIG. 19 and the area PA is assumed to be a portion for one chip.

Now, each time the center of the light emitting mark group is positioned at each of the three measuring points MPa to MPc in FIG. 19, the Z stage 20 (fiducial board FM) is shifted once in the direction Z from the top to the bottom (or from the bottom to the top) at a substantially equal speed to obtain individually the offset amount ΔFSa, ΔFSb, and ΔFSc at each of the measuring points using the multipoint AF system and TTL-FC system simultaneously. Thus, each of them is stored in the memory 30D in FIG. 17. In this respect, when this calibration is operated, the surface of the fiducial board FM is detected by a multipoint AF system of an inclined incident type. Therefore, if the light emitting mark groups ISx, ISy, ISa, and others are positioned just on the slit image ST to enable giving influence to the detection output FS at each of the measuring points, it may be possible to make arrangement so that the slit image ST is projected on the reflective surface portion of the fiducial board FM which is slightly displaced from the light emitting mark groups by displacing the positions of the light emitting mark groups in the areas CAa to CAc where the mark groups exist in FIG. 19.

Now, the offset values ΔFSa, ΔFSb, and ΔFSc (unit being voltage V) obtained at each of the measuring points mean that the height position in the optical axis AX, which is made a focus point (zero point) for each of the three points of the multipoint AF system, has given offset $\Delta Za$, $\Delta Zb$, $\Delta Zc$ with respect to the point correspond to the best focus plane Fo. Here, if the inclination k (unit being V/μm) of the straight line portion including the zero point on the waveform of the detection output signal shown in FIG. 14A is known, the offset $\Delta Za$ to $\Delta Zc$ can be obtained by the following equation as a distance in the direction Z:

$$\Delta Za = \Delta FSa/k_1, \Delta Zb = \Delta FSb/k_2, \Delta Zc = \Delta FSc/k_3$$

In this respect, the $k_1$, $k_2$, and $k_3$ take the one and same value fundamentally, but to be strict, these are different individually. It is thus desirable to obtain them per measuring point.

Figure 20A:
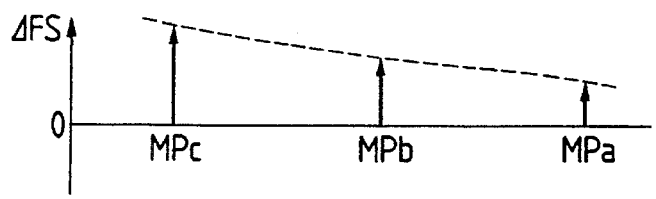
FIGS. 20A, 20B, and 20C are graphs schematically showing an offset amount at each of the measuring points of a multipoint AF system.
Figure 20B:
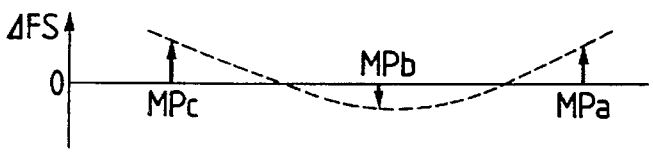
Figure 20C:
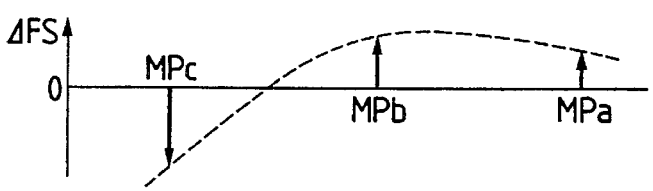

FIGS. 20A to 20C are views schematically showing examples of the state where the offset amounts $\Delta FS$ appear. FIG. 20A represents a case where the respective offset amounts $\Delta FSa$, $\Delta FSb$, and $\Delta FSc$ of the three points MPa, MPb, and MPc all take positive values and a substantially constant inclination is present in the direction in which the slit image ST extends. Many causes may be thought for the presence of such an offset tendency as this, but these causes can be divided into two: one is the problem on the multipoint AF system side and the other, on the reticle R side. As the problem on the multipoint AF system side, it is conceivable among others that when the slit image ST from the projection slit board 1 is reimaged on the light receiving slit board 14, the parallelism of the slits of the slit board 14 becomes slightly disturbed. Meanwhile, as the problem on the reticle R side, it is conceivable among others that the reticle pattern is inclined at least in the longitudinal direction of the slit image ST or the image plane inclination of the optical projection system PL itself may be present. In any case, these problems are complex after all, and it is difficult to specify them individually.

Also, FIG. 20B represents a case where the offset amount $\Delta FSb$ of the central measuring point MPb is of a negative value while the offset amounts $\Delta FSa$ and $\Delta FSc$ at the measuring points MPa and MPc at both ends are of the positive value and in substantially the same size, both of them. AS the cause for such characteristics as these, the problems mainly on the reticle R side, such as the curvature of the reticle pattern surface and the image plane curvature of the optical projection system PL itself, can be thought. However, the image plane curvature of the optical projection system PL can be controlled to be sufficiently small at the time of inspection and adjustment in fabricating the apparatus. Now, even if there should remain a slight curvature, the degree of such a remaining curvature can be obtained quantitatively in advance. Therefore, if an observation is given by subtracting such an anticipated portion from the characteristics shown in FIG. 20B, it will be clear whether the main cause is the curvature of the reticle R or not. Further, FIG. 20C represents a case where the tendencies of the inclination and curvature shown in FIG. 20A become complexed.

Now, the description will be made of a specific example of the calibration sequence with the consideration given to the offset tendency at each of the measuring points as in FIGS. 20A to 20C. In principle, however, the offset amounts $\Delta FSa$ to $\Delta FSc$ obtained at the respective measuring points MPa to MPC become the calibration values at such points, respectively. For example, when the surface of the wafer W is detected at the measuring point MPa, the wafer surface and the best focus plane Fo can be matched at the measuring point MPa if the Z stage 20 is driven to make the detection output signal FSa becomes $\Delta FSa$.

Figure 21:
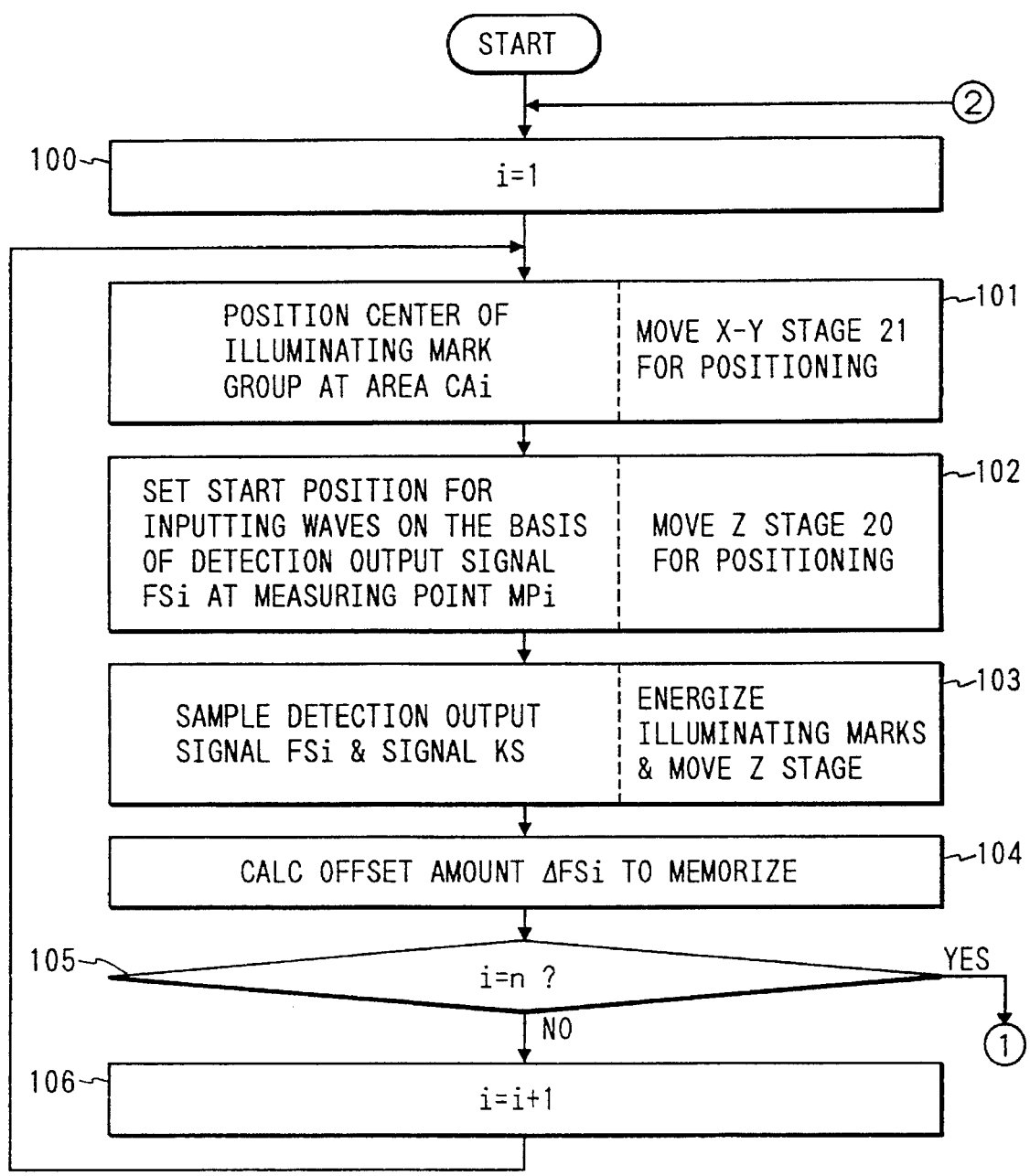
FIG. 21 is a flowchart showing the sequence of a measuring operation when each of the measuring points is calibrated in a multipoint AF system.

However, the actual focus adjustment is not necessarily performed only at one point. It may be necessary to take a face to face relationship into consideration in some cases. Also, in addition to this, the focal depth of the optical projection system PL must be taken into account. FIG. 21 is a flowchart showing the measurement operation among the calibration sequences. Here, it is assumed that the measuring points of the multipoint AF system is generalized as an n number. Further, the measuring point shown in FIG. 19 is defined as MPi (i=1 to n); the area where the center of the light emitting mark group, as CAi (i=1 to n); the synchronous detection output signal at each measuring point, as FSi (i=1 to n); and the offset amount, as $\Delta FSi$ (i=1 to n).

At first, in step 100, the i=1 is set. In step 101, the XY stage 21 is shifted to position the center of the light emitting mark groups in the area CAi. Then, in step 102, the Z stage 20 is positioned in the vicinity of the starting point to drawn the signal waveforms to be stored in the RAMs 301 and 306 shown in FIG. 18 in accordance with the detection output signal FSi at the measuring point MPi. In this case, it is necessary to store in the RAMs 301 and 306 the waveforms as shown in FIGS. 14A and 14B. Hence, the Z stage 20 is set in the position where the detection output signal FSi is outside the maximum value or the minimum value as shown in FIG. 14A. Also, in order to conduct this simply, the focus servo is operated in the straight line portion including the zero point of the detection output FSi while a servo enable signal is produced to prohibit any feed back to the servo system outside the straight line portion; hence making it possible to position the Z stage 20 on the basis of such servo enable signals.

Then, in step 103, the light emitting mark groups are illuminated by the light which has the same wavelength as the exposure light, and each waveform of the detection output signal FSi and the signal KS is digitally sampled into the RAMs 301 and 306 in the circuit shown in FIG. 18 while causing the Z stage 20 to be shifted in one way at a substantially equal speed.

When the storage of the waveforms is terminated, the offset amount $\Delta FSi$ is calculated in step 104 to store it in the memory 30D. Then, in step 105, whether the i=n or not is determined, and if i has not reached the nth number yet, the i is incremented by one in step 106. The sequence will then return to the step 101 to repeat the same sequence for the other measuring points. Also, when the i=n is determined to be true in the step 105, the sequence shown in FIG. 22 will be executed. In this respect, of the sequence shown in FIG. 21, the step 102 is not necessarily executed for all the measuring points. It may be possible to execute it only once at a measuring point in the vicinity of the center of the projection field If immediately before the step 101, for example, and use the starting point (the height position of the Z stage 20) to read the stored waveforms at that time for the measurements at the other measuring points.

Figures 22, 22A:
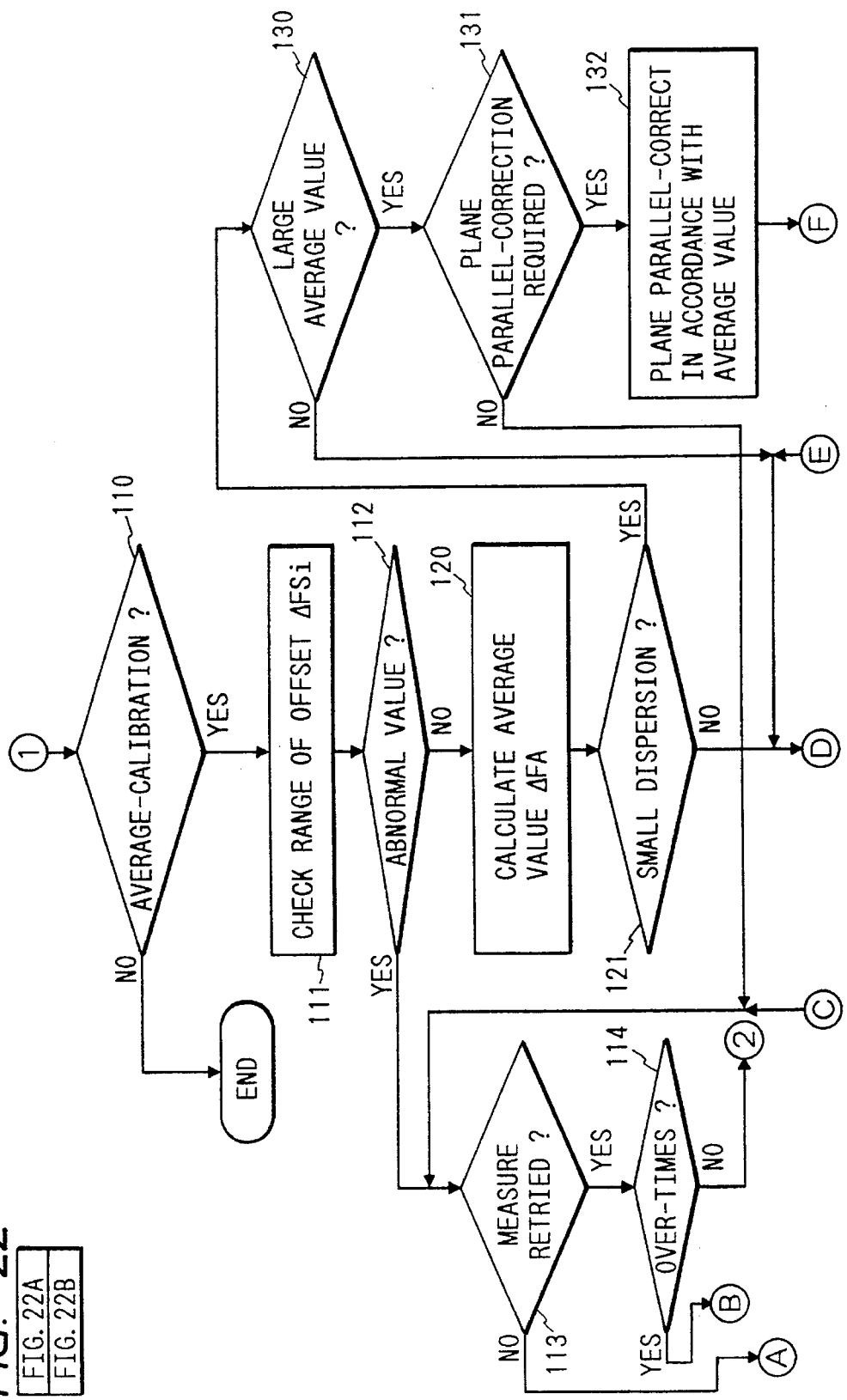
FIG. 22 is comprised of FIGS. 22A and 22B showing flowcharts of the operational sequence of an calibration in a multipoint AF system.

Now, FIGS. 22A and 22B show unique calibration techniques for the multipoint AF system as well as an example wherein a calibration is performed with the considerations given to the various factors described in conjunction with FIGS. 20A to 20C. At first, in step 110, whether the averaged calibration is executed in consideration of the plural measuring points of the multipoint AF system as a whole or not is determined. In this case, a series of the calibration processing will be terminated if it is good enough to obtain only the offset amount $\Delta FSi$ per measuring point (on the assumption that such as a focus adjustment is performed individually at each measuring point by a pinpoint AF, for example). Also, if an averaged calibration is performed, the range of each offset amount ΔFSi will be checked in the next step 111. For an algorithm for such a check, a method is adopted among others to check whether the difference between the two measuring points which are adjacent to each other is exceedingly great or not, or to check the absolute amount of the offset amount at each measuring point has arrived at the proximity of the upper or lower limit of the straight line range in the detection signal FS or not.

Subsequently, in step 112, whether any offset amount showing an abnormal value is present or not is determined in accordance with the checking result in the step 111. If any abnormal value exits, the sequence will proceed to step 113. In this case, the allowable range of the number of points and positions which present such abnormal values is determined depending on the surface structure of the shot area on the wafer W where the pattern of the installed reticle R is superposed.

Now, in the step 113, whether the measuring operation shown in FIG. 21 should be conducted again or not is determined. The requirement of such a remeasurement is set by an operator in advance when the parameters for the apparatus operation are defined. Then, in the step 113, if it is determined that the execution of the remeasurement (retrial) is needed, whether the remeasurement is executed for a preset number of times or not is determined in the next step 114. In the step 114, the number of times is found yet to be over, the sequence shown in FIG. 21 will be repeated beginning at the step 100. Also, in the step 113, if it is found that no remeasurement is set in advance, the sequence will proceed to step 118 to provide an error message and warning to the extent that an abnormal value exists and terminate the series of the sequence.

Further in the step 114, if the number of times is found to have been over, the sequence will proceed to the next step 115 to determine whether the reticle realignment has been set or not. As described earlier, if each of the offset amounts ΔFSi varies greatly, there is a problem on the reticle R side as one of the factors. For example, when the reticle R is absorbed to its holder, a comparatively large foreign particle, or the like is picked up between the absorbing plane and the reticle R, or in some cases, the reticle R is warped by the absorption. Here, therefore, the reticle R is once demounted from the holder, and the realignment is conducted to correct the inclination of the pattern surface, warping, or others for the reticle R as desired.

Thus, if, in the step 115, the reticle realignment is found to be required, whether the number of times set in advance has been over or not is determined in the next step 116. Here, if the number of times for the reticle realignment is found to have been over (step 116) or no reticle realignment has been set (step 115), the sequence will in either cases proceed to step 118 to provide an error message and warning accordingly. If, in the step 116, the number of times is found yet to be over, the reticle R is realigned in step 117 (once demounted from the holder and the alignment is executed after the reticle is again absorbed to the holder). Then, the sequence will proceed to the step 100 shown in FIG. 21. At this juncture, the counter is reset to zero for the remeasurement number to be determined in the step 114.

On the other hand, if no abnormal values are detected in the forgoing step 112, an averaged value ΔFA is calculated by giving an arithmetic mean to the respective offset amounts ΔFSi in step 120. Further, in step 121, the dispersion of the respective offset amounts ΔFSi centering the averaged value ΔFA (the deviation amount of ΔFSi from the ΔFA) is checked. If the dispersion is found to be greater than a given value, the sequence will proceed to step 122; if found to be smaller, to step 130.

Figure 23A:
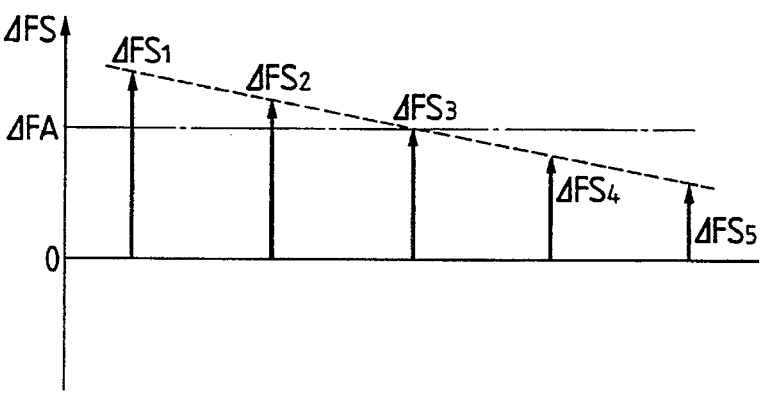
FIGS. 23A and 23B are graphs showing the tendency of an offset amount at each of measuring points estimated at the time of a calibration.

Here, with reference to FIGS. 23A and 23B, the averaged value ΔFA and dispersion will be described. FIG. 23A represents a case where any one of the offset amounts ΔFSi at the measuring points (here, five points) takes a positive value and equally has an inclined tendency. The averaged value ΔFA at this juncture appears substantially at the intermediate point of the evenly inclined characteristics (broken line). Further, as regards the dispersion in this case, it becomes greater or smaller on the periphery in accordance with the inclination characteristics. As a result, if the dispersion is small, it means that the parallelism of the multi-point AF system itself between the imaging fiducial plane and the best focus plane Fo is desirable; hence making possible the approximation of the best focus plane Fo just by shifting in parallel the imaging fiducial plane of the multi-point AF system itself.

Figure 23B:
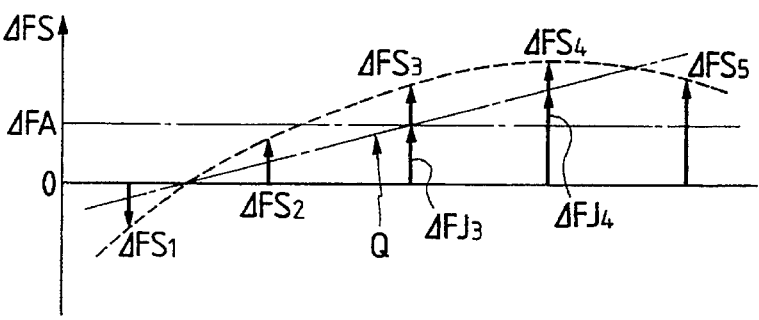

Also, FIG. 23B represents the characteristics in a case where the image plane curvature, reticle warping, and others are complexly present with the interrelated inclination. Although the averaged value ΔFA is small in some cases, the dispersion (deviation amount of ΔFSi from ΔFA) can be great in most cases. If the degree of the curvature and the degree of the interrelated inclination are small, the dispersion can also be small as a matter of course.

Therefore, if, in the step 121, the dispersion is found to be small more or less, whether the averaged value ΔFA is large to a certain extent or not is determined in step 130. Then, if the averaged value ΔFA is comparatively large, whether any offset correction should be conducted by the plane parallel 12 shown in FIG. 1 or not is determined in step 131. The plane parallel 12 enables the imaging fiducial plane (the plane regulated by the zero point of the detection output FS) of the multipoint AF system itself to be shifted in parallel in the direction Z as a whole by adjusting its inclination. As a result, if the plane parallel correction is selected in the step 131 and the correction is executed in step 132 by the plane parallel 12, the offset value ΔFSi will be modified to make the averaged value ΔFA zero as shown in FIG. 23A, for example. In other words, after the plane parallel 12 is inclined by the amount of interval ΔZf in the direction Z corresponding to the averaged value ΔFA in the step 132, the real offset amount ΔFSi at each of the measuring points can be handled as modified to ΔFSi=ΔFSi−ΔFA. However, the correction amount by the plane parallel 12 is not necessarily matched with the averaged value ΔFA exactly. It will suffice if only a correction amount by the plane parallel 12 is obtained accurately.

Subsequently, in step 133, whether the offset amount at each measuring point will be remeasured or not is determined. If remeasured, the sequence will proceed to the step 100 in FIG. 21. This selection in the step 133 is made in accordance with the parameter set by the operator. On the other hand, if no remeasurment is needed in the step 133 (this is the case that a correction amount by the plane parallel can be obtained accurately or the like), each offset amount ΔFSi is modified operationaly in the next step 134 by the amount of plane parallel correction (to be ΔFA') and stored. In other words, the operation ΔFSi=ΔFSi−ΔFA' is executed.

With the above, the processing is completed in the case where the averaged value ΔFA is found to be great in the step 130 and proceeds to the next step 122. This step 122 is also the destination to which the sequence will jump when the dispersion is found to be great in the earlier step 121 or the averaged value ΔFA is found to be small in the step 130. In the step 122, using each of the obtained offset values ΔFSi the proximate plane (or proximately straight line) is specified by the least squares method. This proximate plane (or stright line) is a proximate plane represented by the inclined characteristics (broken line) under the offset amount ΔFSi having evenly inclined characteristics as shown in FIG. 23A, and becomes a proximate plane (or stright line) represented by slanted lines Q in FIG. 23B under the offset amount ΔFSi having curved characteristics (broken line) in FIG. 23B.

Then, in step 123, the inclined amount of the proximate plane, namely, the inclined amount indicated by the lines Q in FIG. 23B with respect to the zero level, is obtained, and in the next step 124, whether such inclined amount is more than the allowable value or not is determined. The inclined amount is an interrelated inclination between the proximate plane and best focus plane Fo which is defined to make the deviation the smallest at any place for the offset amount ΔFSi at each of the measuring points of the multipoint AF system. If this inclination is great, a defocus may take place partly in the shot area, that is, a focus error may be generated in the shot, due to the relationship between the focal depth of the optical projection system PL and the dimension of the shot area. Therefore, if the inclination of the proximate plane is exceedingly great, it is determined that there is some problem at the time of measurement or on the reticle R side, and the steps 113 to 118 described earlier will be executed.

On the other hand, if, in the step 124, the inclination of the proximate plane is determined to be within the allowable value, the last step 125 will be executed. In this step 125, an operation is executed to modify the offset amount ΔFSi at each of the measuring points to ΔFJi with the proximate plane as a new standard. More specifically, it is replaced with the offset amount $\Delta FJ_3$ at a point on the proximate plane corresponding to the measuring point the offset amount of which is $\Delta FS_3$ in FIG. 23B, for exmaple. Hence, it becomes possible thereafter to attain desirable focus adjustments over the enter shot area by moving the Z stage 20 vertically and inclining the leveling stage 23 to make the detection output signal FSi obtainable at each of the measuring points the offset amount ΔFJi, respectively.

With the above, the series of the calibration operation is terminated. In this respect, it is sufficient, in principle, to execute the sequences shown in FIGS. 21, 22A and 22B once the reticle alignment is completed subsequent to the reticle replacement. However, in a stepper using a same reticle for a long time, there is a possibility that the initial offset amount ΔFSi or ΔFJi shows an abnormality due to errors or the like at the time of correcting focus positions due to the slight drifting of the multipoint AF system, temperature change in the apparatus, and pressure control in the optical projection system PL. Therefore, it may be desirable to execute the sequences shown in FIGS. 21, 22A and 22B per lot (usually 25 sheets) in a stepping process.

Further, in the present embodiment, when a tendency such as a plane inclination appears, the realignment of the reticle is executed in the steps 115, 116, and 117, but it may be possible to incline the holder of the reticle R instead as another method. In this case, although the best focus plane Fo and the imaging fiducial-plane (or prominate plane) of the multipoint AF system can be set in parallel, there may occur a trapezoid deformation, rhombus deformation, or the like in the image of the projected pattern on the wafer W. Here, it may be possible to reduce such deformation by inclining some pieces of the optical lenses in the optical projection system PL close to the recticle side from the plane perpendicular to the optical axis AX minutely.

The tendency such as a image plane inclination appears also due to the slit parallelism between the reflective slit image ST of the multipoint AF system and the light receiving slit board 14. Thus, the inclination tendency is generated remarkedly as in FIG. 23A, for example. Therefore, if the inclination is not modified even by the realignment of the reticle, it may be possible to adjust the slit parallelism by automatically rotate the projection slit board 1 or light receiving slit board 14 minutely in accordance with the inclination tendency.

As above, the description has been made mainly of the sequences regarding the calibration in FIGS. 21, 22A and 22B, but now, some of the operating methods of the multipoint AF system after the calibration will be described.

At first, in the stage that the offset amount ΔFSi is obtained at each of the measuring points of n number in the multipoint AF system, the steps 122 and 123 in FIGS. 22A and 22B are executed using the offset amounts ΔFSi thus obtained to calculate the interrelatedly inclined amount and inclined direction inclination of the averaged fiducial imaging plane of the multipoint AF system and the best focus plane. As described earlier, since the interrelated inclination to be obtained here is a relative value with the best focus plane as its reference, the fact that the interrelated inclination becomes zero means that the hypothetical plane (namely, fiducial imaging plane) which is produced by connecting the fiducial imaging positions (the Z positions where the zero point of the detection signal can be obtained) each at the measuring points of the multipoint AF system is now in parallel with the best focus plane at any point in the projection field with a substantially offset amount. In practice, however, it is difficult to readjust the apparatus to make the offset amount ΔFSi substantially constant at each of the measuring points. Therefore, if the averaged plane to be determined by the offset amounts ΔFSi of the n number is inclined, it may be effective to allow the wafer W to be inclined as a whole to match such an inclination at the time of operating the multipoint AF system. In other words, a countermeasure should be taken in terms of the wafer global level.

To this end, if the offset characteristics are as shown in FIG. 23A, the wafer holder is inclined in advance by the leveling stage 23 for the same amount as the inclination characteristics (broken line) in the same direction. Thus, in the case of the offset characteristics as shown in FIG. 23A, if the wafer W is positioned in the direction Z to make the offset amount $\Delta FS_3$ at the central measuring point, the respective offset amounts at the other measuring points become the values approximate to the values $\Delta FS_1$, $\Delta FS_2$, $\Delta FS_4$, and $\Delta FS_5$ stored in advance. Consequently, when the leveling stage 23 is driven immediately after this (or at the same time), such driving amount is extremely small. Thus, there is an advantage in enhancing the throughput required to step the reticle pattern on the wafer by a step-and-repeat method or a step-and-scan method.

Also, in the case of the offset characteristics accompanied by the curvature as shown in FIG. 23B, its proximate plane is obtained, and the leveling stage 23 should be inclined by the same amount of the inclination of the proximate plane (Q). In this way, when the shot area on the wafer is detected, all of the offset amounts each of the measured values become the values approximate to the offset amounts ΔFJi stored in advance; hence enabling the driving amount of the leveling stage 23 to be extremely small.

As described above, if the wafer holder is inclined as a whole to be prepared for the leveling in advance on the basis of the offset characteristics obtainable at the time of calibration, the amount thereby to conduct the leveling on the basis of the detected value at each of the measuring points of the multipoint AF system should become extremely small at the time of stepping in each of the shot areas on the wafer W. Hence, the enhancement of its throughput can be implemented.

Figure 24:
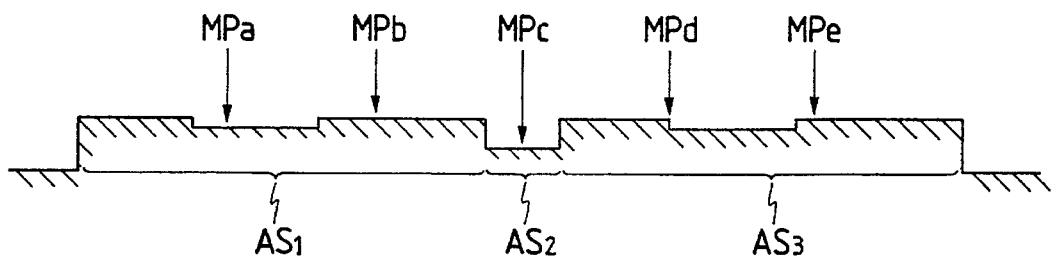
FIG. 24 is a view illustrating the sectional structure of a shot area surface on a wafer.

As a second operation method, there is the so-called pinpoint AF method wherein after the leveling correction is performed in each of the shot areas, the best focus plane is locally matched in a shot area on the basis of focus detection signal (detection output) at a specific point in each of the shot areas. FIG. 24 shows an example of the sectional structure of one shot area surface on the wafer W, in which arrows indicate five measuring points MPa to MPe of the multipoint AF system. In the shot area on the wafer for which the process has advanced, comparatively great unevennesses are created in general. In FIG. 24, the areas $AS_1$ and $AS_3$ are extruded portions which the area $AS_2$ is the recessed portion.

Here, when an exposure is attempted with the best focus plane being focused on the area $AS_2$, the focus adjustment (minute shifting of the Z stage) is performed on the basis of only the detection output signal $FS_3$ obtainable at the measuring point MPc subsequent to the leveling correction. If the offset characteristics of the multipoint AF system are as shown in FIG. 23B, the shot area surface is in parallel with the line Q in FIG. 23B because of the leveling correction. Here, the Z stage is minutely shifted to make the detection output value at the measuring point MPc the offset amount $\Delta FS_3$ whereas the focus adjustment is performed by the offset amounts $\Delta FJ_1$ to $\Delta FJ_5$ which represent the straight line Q in the fourth embodiment. Also, when the plane parallel 12 is corrected by the amount corresponding to the offset amount $\Delta FJ_3$ at the time of calibration at the measuring point MPc, the Z stage 20 should minutely be shifted to make the detection output value at the measuring point MPc equal to an amount ($\Delta FS_3 - \Delta FJ_3$). Thus, it is possible to obtain the best focus for the area $AS_2$ in FIG. 24 and enhance the resolution maximum in a selected local portion in the shot area.

Figure 25:
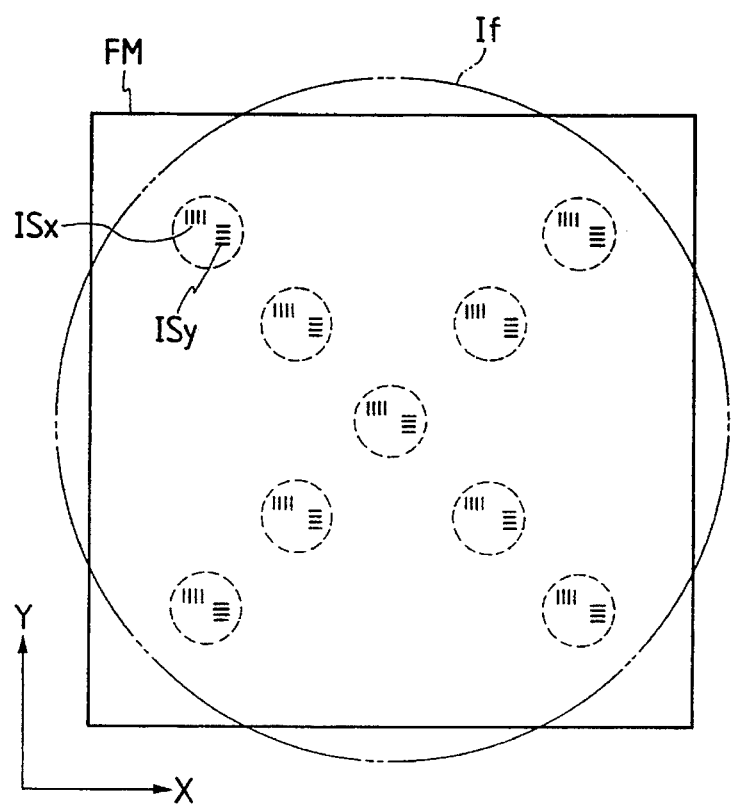
FIG. 25 is a view showing a variation of the light emitting mark arrangement on a fiducial board.

Now, in each of the above-mentioned embodiments, the calibration is performed at each of the measuring points while a pair of light emitting marks ISx and ISy, and others are being shifted in turn in the vicinity of each of the measuring points of the multipoint AF system. However, when a large fiducial board FM which can substantially cover the projection field If of the optical projection system PL is arranged on the Z stage 20 as shown in FIG. 25, it may be possible to provide n sets of light emitting marks on the fiducial board FM for the corresponding positions of each measuring point of the multipoint AF system. In this case, however, the rays of light returning to each of the slits, which are emitted from the optical projection system PL to regulate the n sets of the light emitting marks, must be guided to each of the photoelectric sensors of n number by the optical fiber and others arranged individually for each set.

With the provision of the plural sets of light emitting marks in the corresponding positions at each of the measuring points on the fiducial board FM like this, the calibration operation can be simplified extremely to make it possible to conduct the vertical movement of the fiducial board FM only once. However, it is necessary to prepare n sets of the ADC 305, RAM 306, counter 307, and others shown in FIG. 18 instead. In this respect, the small circles indicated by broken lines in FIG. 25 represent the areas where the slits of the light emitting marks ISx and ISy are illuminated from the reverse side, respectively. Also, when the calibration is performed by arranging the light emitting mark groups in the plural locations (nine in FIG. 25) on one large fiducial board FM such as this, it is conceivable that the orthogonal degree of the surface of the fiducial board FM and the optical axis AX of the optical projection system PL may affect the calibration as a mounting error of the fiducial board FM. However, even if the surface of the fiducial board FM and best focus plane may be inclined interrelatedly due to a slight inclination of the fiducial board FM, there will be no substantial influence at all.

Figure 26A:
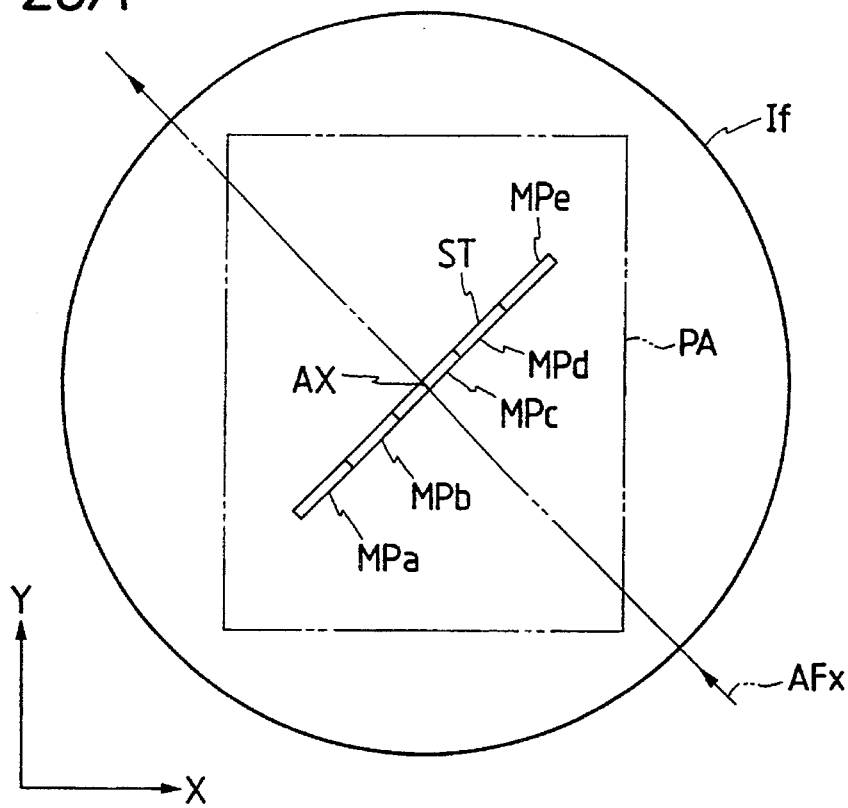
FIG. 26A is a view showing the relationship between the arrangements of a projection field and a slit projection image by a focus detection system.

Now, the description will be made of a fifth embodiment according to the present invention. In the present embodiment, the multipoint AF system (plane position detecting system) of an inclined incident type will be described. However, the multipoint AF system of the present embodiment being fundamentally the same as the AF system shown in FIG. 1 in its structure, the description of the entire structure will be omitted. In the embodiment set forth below, the description will be centered on its difference from the structures of the apparatuses described in the first to fourth embodiments. In this respect, FIG. 26A is a plan view illustrating the positional relationship between the projection field If of an optical projection system PL and the projection slit image ST of an AF system on a wafer. This is exactly the same as FIG. 2. Therefore, its description will be omitted.

Figure 26B:
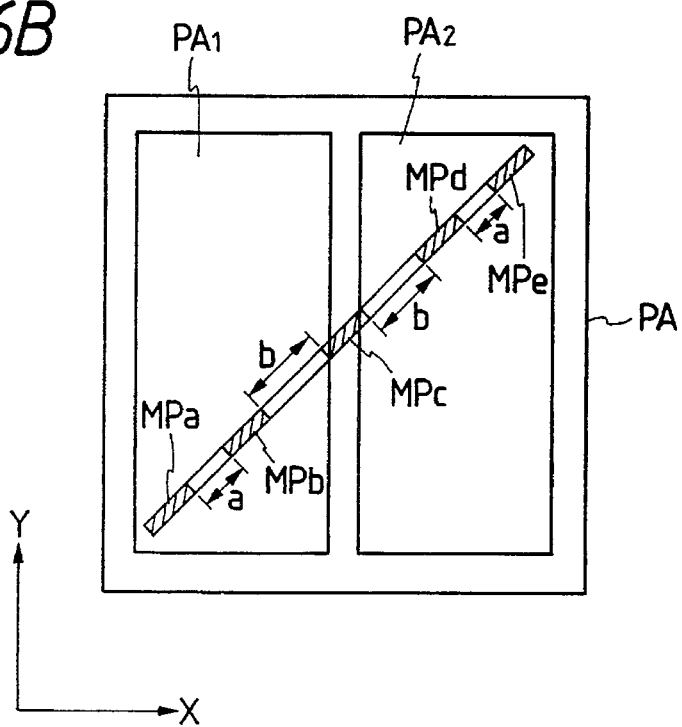
FIG. 26B is a view illustrating a pattern area and measuring point.

Now, when plural chips (PA1 and PA2 in FIG. 26B) are arranged in one shot area, a scribed line is formed in the shot area to be extended in the direction X or direction Y in order to separate the respective chips as described earlier. In the present embodiment, it is assumed that multipoint detections are performed by one slit image ST as shown in FIG. 26B, and that five points MPa, MPb, MPc, MPd, and MPe in the slit image ST are made the measuring points of the multipoint AF system corresponding to the chip arrangement shown in FIG. 26B. In other words, only the measuring point MPc is set on the scribed line extending in the direction Y while the remaining measuring points (MPa and MPb) and (MPd and MPe) are set on the chips PA1 and PA2. Also, the measuring points MPa and MPe serve to detect the peripheral area of the pattern area PA, respectively, while the measuring points MPb and MPd serve to detect the areas between the measuring point Pc and measuring points MPa and MPe, respectively.

Here, the selection of the measuring points (detection areas) in the slit image ST may be arranged by simply dividing them into five equal portions or by making only the desired portions in the slit image ST the measuring points in accordance with the surface condition (stepping structure) of the pattern area as shown in FIG. 26B. For example, as shown in FIG. 26B, the selected measuring area is made equal for the five portions, and given the interval between the measuring points MPa and MPb, and the interval between the measuring points MPd and MPe as a while the interval between the measuring points MPb and MPc, and the interval between the measuring points MPd and MPc as b, the interval between each of the measuring points a and b are arbitrarily defined in accordance with the stepping configuration.

Figure 27:
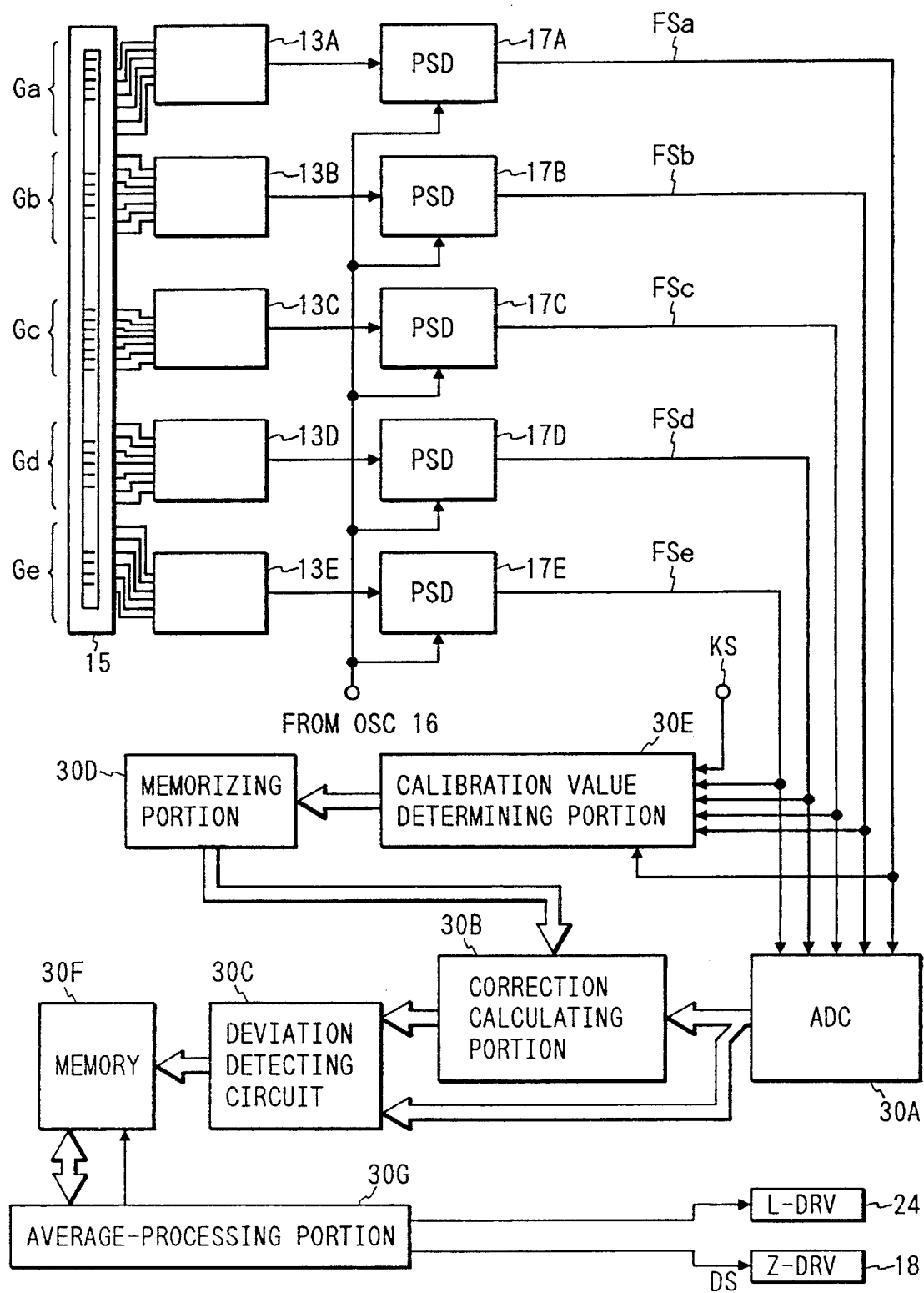
FIG. 27 is a block diagram illustrating the structure of a signal processing circuit of a focus detection system according to a fifth embodiment of the present invention.

FIG. 27 shows an example of the specific processing circuits of a selector 13, array sensor 15, PSD 17 and MCU 30. Here, the light receiving cells in the array sensor 15 are divided into five sensor areas Ga, Gb, Gc, Gd, and Ge, and the selections and coordinations of the light receiving cells are assumed to be performed in each of the sensor areas. These five sensor areas corresponds to the measuring points MPa, MPb, MPc, MPd, and MPe. The sensor areas are selected by designating the connecting destinations for each of the selectors on the basis of the measuring point information. This measuring point information is inputted through input means (key board and the like) 31. In this respect, the processing circuits shown in FIG. 27 are fundamentally the same as the circuits shown in FIG. 17. The description will be made in brief.

In FIG. 27, since plural numbers of light receiving cells in the array sensor 15 are included in the sensor area Ga, at least one of the light receiving cells is selected by the selector 13A to output its output signal to the PSD 17A. Also, the output signals from each of the light receiving cells in the sensor areas Gb, Gc, Gd, and Ge are processed likewise by the selectors 13B, 13C, 13D, and 13E. Thus, the selected signals are transmitted to the PSDs 17B, 17C, 17D, and 17E. The PSDs 17A, 17B, 17C, 17D, and 17E receive respectively the base wave a.c. signals from an OSC. 16 to output detection outputs FSa, FSb, FSc, FSd, and FSe. These detection outputs FSa, FSb, FSc, FSd, and FSe are digitally converted by the analogue-digital converter (ADC) 30A in the MCU 30, respectively, and transmitted to a correction calculating portion 30B.

The correction calculating portion 30B calculate the value corresponding to the position in the direction Z which should be a target to position the Z stage 20 at each of the measuring points in accordance with the values of the five detection outputs, namely, the defocus amounts at five points. These values are output to a deviation detecting circuit 30C. The detecting circuit 30C outputs the difference (deviation between the measured plane and best focus plane Fo) Z between the detection output value from the ADC 30A and the target value from the calculating portion 30B to a CPU 30G as a measured value. At this juncture, the correction calculating portion 30B receives the offset values which correspond to the respective detection outputs FSa, FSb, FSc, FSd, and FSe stored in the memorizing portion 30 in advance and executes various operations. These offset values are those measured and calculated by a calibration value determining portion 30E. The determining portion 30E receives the five detection outputs FSa, FSb, FSc, FSd, and FSe as well as the output signals KS of the photoelectric sensor 45 to obtain the deviation between the fiducial plane of the multipoint AF system itself and the best focus plane Fo as a deviation voltage from the zero level of the detection output. The measured values from the deviation detecting circuit 30C are stored in the memory 30F in accordance with the timing signals from an average-processing portion 30G. Also, it is assumed that the weighting coefficients for the averaging processing are stored in the memory 30F.

Now, the average-processing portion 30G performs the averaging processing on the basis of the measured value Z and weighting coefficient as well as the weighted averaging processing which obtains an averaged value by the total sum of the weighting coefficients; hence obtaining the target focus plane (the plane to be focused) BZ which is the weighted mean of the values at the five measuring points. Here, the target focus plane BZ is obtained as an adjustment amount Za after the average-processing and the weighted averaging processing. In the average-processing portion 30G, a servo system is incorporated to allow the target focus plane BZ to be matched with the best focus position Fo (the adjustment amount Za to be made zero or less than a given value) by outputting an instruction signal DS to the Z-DRV 18 for the Z stage shifting as required. In this respect, the weighting coefficients for the weighted averaging processing are inputted by input means 31.

Figure 28A:
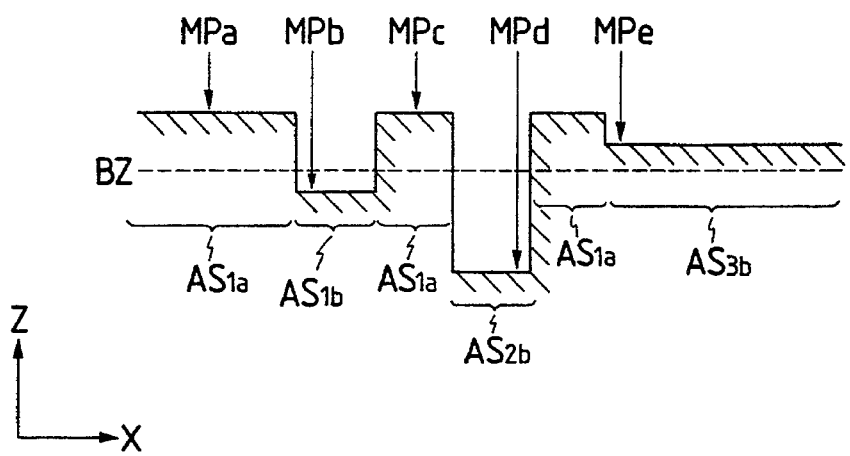
FIGS. 28A and 28B are views showing the sectional structure of a shot area surface on a wafer.
Figure 28B:
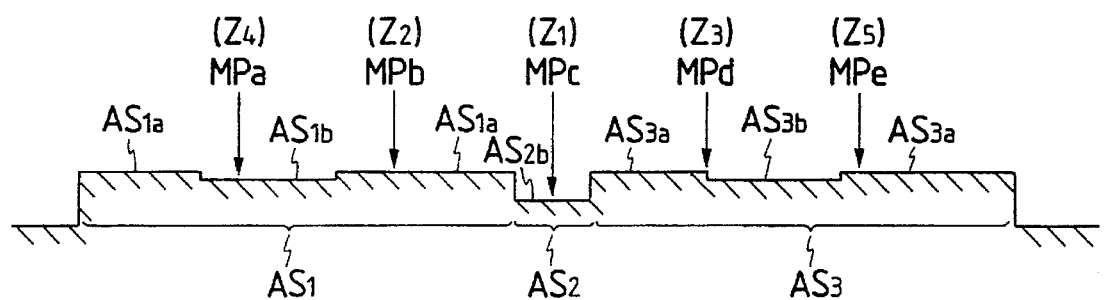

Subsequently, the description will be made of a method to obtain the target focus position BZ according to the present embodiment. In the present embodiment, the best focus plane is to be matched with the target plane (target focus position BZ) in accordance with the focus detection signals (detection signals) from the specific measuring points in the shot area. FIGS. 28A and 28B show an example of the sectional structure of the surface of one shot area on the wafer W, in which arrows indicate the five measuring points MPa to MPe of the multipoint AF system. Here, the adjustment amounts each at the measuring points are designated as Z1, Z2, Z3, Z4, and Z5, and the weighting coefficients as W1, W2, W3, W4, and W5. Further, the weighting coefficients W1 to W5 are arbitrary values defined by the stepping configurations, and here these are assumed to be zero to an arbitrary integer.

At first, a first method to obtain the target focus position BZ will be described. In FIG. 28A, an area $AS_{1a}$ is a protruded area while areas $AS_{1b}$, $AS_{2b}$, and $AS_{3b}$ are recessed areas. In the present method, the detected values each from the measuring points are multiplied by a given weight, respectively, and then, the target focus position BZ is obtained by the weighted averaging. This can be expressed by the following equation, for example, and it can be obtained as an adjustment amount Za corresponding to the target focus position:

$$Za = (Z1 \times W1 + Z2 \times W2 + Z3 \times W3 + Z4 \times W4 + Z5 \times W5)/N \quad (2)$$

where N=W1+W2+W3+W4+W5

Therefore, if the weighting coefficient is variable, it is possible to obtain the target focus position BZ by giving a weight to an arbitrary height position. The higher the weighting coefficient, the closer is the height position to the target focus position.

Here, it may be possible for the method for the selection of the position of the weighted measuring point to make an arrangement so that the weight is given to either one of the five points or it is given to all the points equally. Also, it may be possible to make the weighting coefficient zero for some points among the five points and detect the focus position only at other measuring points. Further, since the height of each step can be obtained individually, it is possible to give weight (make the selection of the position of the measuring point at which the weight is given and the amount of weight (degree)) in accordance with the importance of the area ratio and focus adjustment per step. Also, it is possible to define an arbitrary intermediate position between the step and step indicated by a broken line in FIG. 28A as a target focus plane BZ, and to adjust the focus on such a hypothetical plane as this. In this way, the best focus plane can be matched with an arbitrary height position by defining the weighting coefficient arbitrarily.

The above-mentioned method to give the weighting coefficient can be determined almost by the designing data, and can be defined to match the known stepping configuration (the position of the scribed line, position of the protruded pattern, stepping amount, and others). In this respect, on the inspecting surface (wafer), resist is usually coated. Therefore, the influence from the small stepping configuration is small, but the step between the scribed line and the pattern surface is great. Thus, even if coated with resist, the stepping influence is great. It is, therefore, effective to give weight in consideration of such an influence. When any influence from the process is to be considered, its process offset should only be added to the adjustment amount Za.

Subsequently, a second method to obtain the target focus position BZ will be described. The present method is such that the five measuring points are divided into plural groups, and after the average-processing is executed in the group, the weight is given, and that the results of the average-processing are divided by the sum of the weights given to perform the overall weighted-average processing. The description will be made of a case where the measuring points are divided into three groups on an inspecting surface having the stepped portions as shown in FIG. 28B, for example.

In FIG. 28B, the areas $AS_1$ and $AS_3$ are protruded portions while the area $AS_2$ is a recessed portion. Further, the area $AS_{1a}$ and area $AS_{3a}$, and the area $AS_{1b}$ and area $AS_{3b}$ are the areas having substantially the same height positions. Here, the areas having substantially the same positions (the areas $AS_{1a}$ and $AS_{3a}$, for example) are arranged as one group. Now, the area $AS_{1a}$ and area $AS_{3a}$ are detected at the measuring points MPb and MPd, and the measured values $Z_2$ and $Z_3$ at each of measuring points are arranged as a first group. Also, the area $AS_{1b}$ and area $AS_{3b}$ are detected at the measuring points MPa and MPe, and the measuring values $Z_4$ and $Z_5$ at each of the measuring points are arranged as a second group. Further, the measured value $Z_1$ of the measuring point MPc at which the area $AS_2$ is detected is arranged as a third group. Then, the measured values are averaged in the group, and subsequently, a weight is given to each of the averaged values in the respective groups. Thus, the sum of such averaged values is divided by the sum of the weights (to be averaged). In other words, the weighted average-processing is performed subsequent to the averaging in the group. Thus, the averaging effect is enhanced by the combination of the average-processing in the group and the weighted average-processing.

For example, a case where the average-processing is performed for the three divided groups and then the weighted average-processing is performed can be expressed as in the following equation:

$$Za=[Z1\times W1+(Z2+Z3)/2\times W2+(Z4+Z5)/2\times W4]/N \quad (3)$$

where W2=W3, W4=W5, N=W1+W3+W4

Here, when any influence from the process is to be considered, the process offset should be added to the adjustment amount Za as in the case described earlier.

Now, when the end portion of the step at the measuring point MPd as shown in FIG. 28B is measured, there is a possibility that the detection signals are fluctuated. Also, when the shot is measured at the periphery of the wafer, the measuring point is placed beyond the wafer, and there occurs the state where no signals are obtainable. Therefore, if the signal form either one of the measuring points MPa and MPe in the first group or either one of the measuring points MPb and MPd in the second group is erroneous (that is the case where no signals can be obtained from the measuring point or the detection signal is beyond the allowable value), it may be possible to perform the average-processing without using such a signal.

Also, in a case where an optimal focus position is to be obtained in a shot area having a symmetrical stepping structure as shown in FIG. 28B, the second method is able to enhance the detection accuracy as compared with the first method because with the second method the averaging is effectively performed by grouping. Now, the aforesaid grouping is not necessarily limited to the steps having one and the same height if only the stepping configurations are known. It may be possible to group a plurality of steps of the heights close to each other. Further, it may be possible to group measuring points arbitrarily. For example, the measuring points to detect the area $AS_{1a}$ and area $AS_{1b}$ in FIG. 28A may be grouped together. As described above, using the processing with the application of the weighting coefficient and grouping, the target position can be set at an arbitrary height with a desirable precision.

In this respect, for the first method it may be possible to perform the average-processing by removing (rejecting) the signals at any of the measuring points which may result in errors. Also, for the second method, if the signals from all the measuring points in a group present errors, it may be possible to perform the weighted average-processing by rejecting each of the signals from such a group. Here, in order to reject any signal as described above, the weight given to such a signal should only be made zero, for example.

Figure 29:
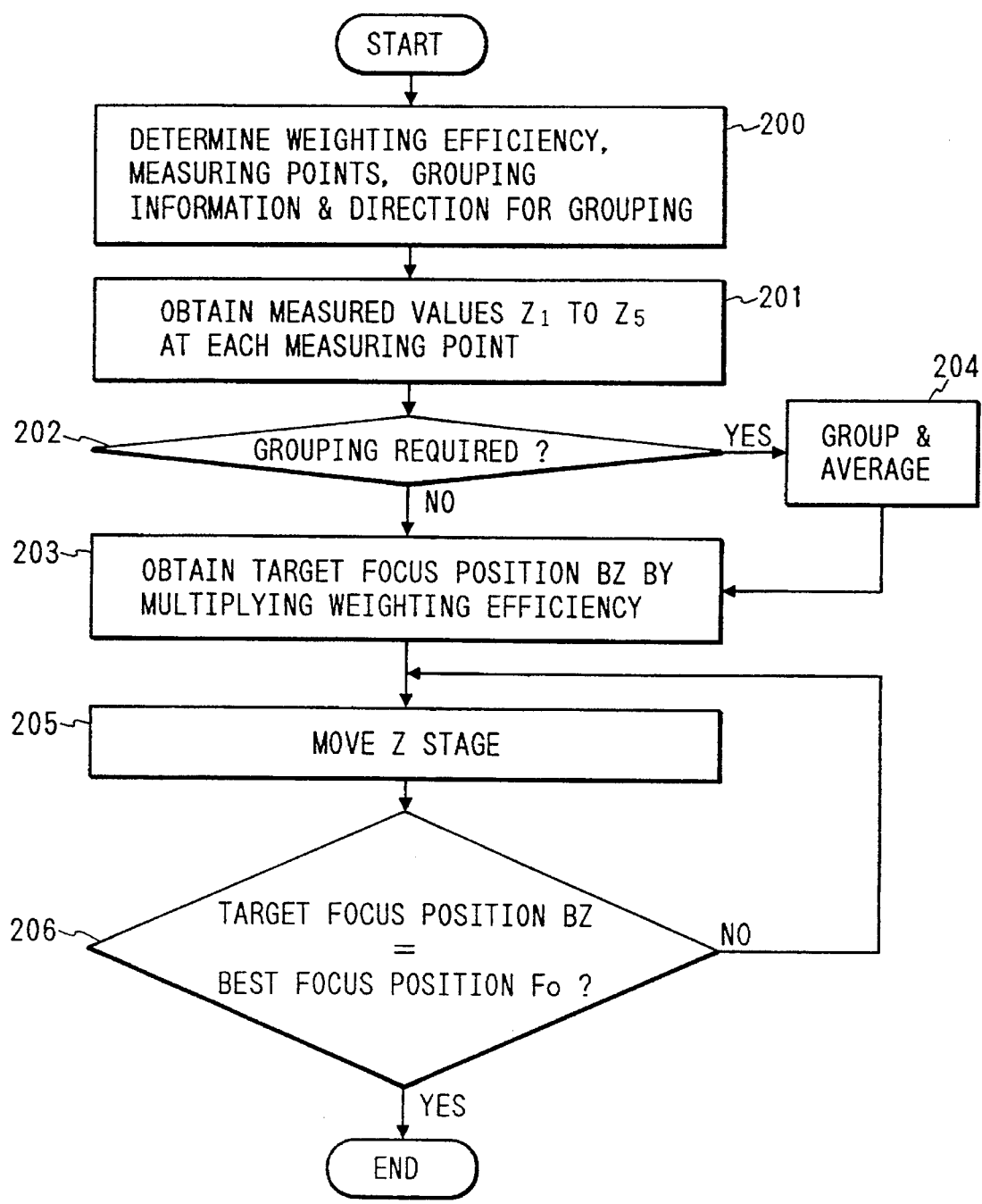
FIG. 29 is a flowchart illustrating an operation to enable a target focus position according to the fifth embodiment to be matched with the best focus plane.

Now, with reference to FIG. 29, the description will be made of an example of the detection operation whereby to match the target focus position BZ and the best focus position in the multipoint AF system shown in FIG. 1.

At first, in step 200, information (sensor area) at each of the measuring points, information regarding grouping arrangement, designation to execute the grouping or not, and weighting coefficients are inputted through input means S1. Then, in step 201, a phase detection circuit 30C obtains the measured values $Z_1$ to $Z_5$ at each of the measuring points, respectively. Each of the measured values is stored in the memory 30F. Then, in step 202, whether the grouping arrangement is made or not is determined. Here in the step 200, if the grouping execution is designated, the sequence will proceed to step 204. In the step 204, the sensors are grouped, and the average-processing of the signals in the group is executed. Then, the sequence will proceed to step 203. On the other hand, in the step 200, no grouping execution is designated, the sequence will proceed to the step 203 from the step 202.

Now, in the step 203, the average-processing portion 30G obtains an adjustment value Za (the target focus position) from each of the measured values $Z_1$ to $Z_5$ and weighting coefficients by the foregoing first method or second method. Further in step 205, the MCU 30 outputs a control signal DS to the Z-DRV 18 to shift the Z stage 20. At this juncture, the shifting direction of the Z stage is determined in accordance with a sign given to the adjustment value Za. Here, as described earlier, the adjustment value Za is an operated value which is an amount whereby the target focus position BZ is deviated from the best focus position Fo. Therefor, along the shifting of the Z stage 20, the adjustment amount Za is calculated in turn.

In the next step 206, whether the target focus position BZ is matched with the best focus position Fo or not is examined. In other words, whether the adjustment value Za is zero or not is examined. If the target focus position BZ is matched with the best focus position Fo, the detection operation is terminated. On the other hand, if the positions are not matched, the operations in the step 205 and step 206 are repeated (servo controlled) until both of them are matched.

Now, with reference to FIG. 30, the description will be made of a variation of the foregoing detection operation. In step 300, given pieces of information (each measuring point, information regarding the grouping, designation to execute the grouping or not, and weighting coefficient) are inputted through input means 31 as in the step 200 in FIG. 29. Then, in step 301, the Z stage 20 is shifted to match the measuring plane (pattern area surface) corresponding to a given measuring point (a measuring point at which the weighting coefficient is the greatest, or a measuring point set substantially in the center of the projection field) with the best focus plane Fo. This is operated in such a manner that a given measured value of the measuring values $Z_1$ to $Z_5$ is defined as $Z_M$, for example, and the Z stage is shifted to make this measured value $Z_M$ zero.

Further, in step 302, the phase detection circuit 30C obtains the measured values $Z_1$ to $Z_5$ at each of the measuring points, respectively. Each measured value is stored in the memory 30F. Then, in step 303, whether the grouping arrangement is made or not is determined. If the grouping execution is designated in the step 300, the sequence will proceed to step 305. In the step 305, the sensors (measuring points) are grouped, and the average-processing is executed for each of the signals in the group. Subsequently, the sequence will proceed to step 304. On the other hand, if no grouping execution is designated in the step 300, the sequence will proceed to the step 304 from the step 303.

Now, in the step 304, the average-processing portion 30G obtains an adjustment value Za from each of the measured values $Z_1$ to $Z_5$ and the weighting coefficients by the foregoing first method or second method. The adjustment amount Za is stored in the memory 30F. In step 306, the MCU 30 outputs a control signal DS to the Z-DRV 18 to shift the Z stage 20. Further, in step 307, a servo control is executed to match a measured value $Z_M$ (the measured value $Z_M=Z_1$, for example) at a given measuring point with the adjustment amount Za. At this juncture, if the adjustment amount Za exceeds the allowable value, the plane parallel 12 may be rotated or an offset may be given electrically to make the adjustment amount Za zero or less than a given value.

Now, the description will be made of a sixth embodiment according to the present invention. The present embodiment relates to the detection of the inspecting surface inclination.

Figure 31A:
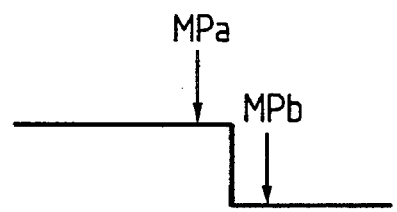
FIGS. 31A and 31B are views illustrating the problem encountered in correcting the inclination of an inspecting surface having a step.
Figure 31B:
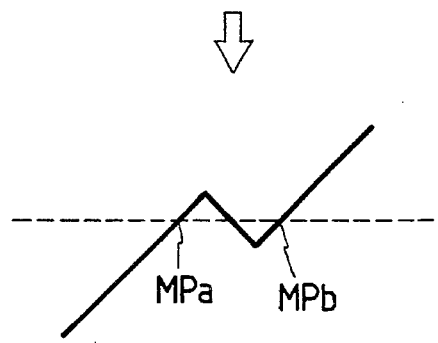

When a leveling is conducted for a plane having steps, there is a possibility that a problem is encountered in performing the leveling accurately by simply shifting the leveling stage 23 in order to make the signals from the plural measuring points equal. For example, the measured values are obtained as a measuring point in the protruded portion on an inspecting surface (without any inclination) having a step as shown in FIG. 31A as MPa, and a measuring point in the recessed portion as MPb. Then, the leveling stage 23 is shifted to make the height of the inspecting surface equal at each of the measuring points MPa and MPb. In this case, however, even if the leveling is conducted using the measuring points MPa and MPb as described above, the inspecting surface (indicated by a solid line) is greatly inclined with respect to the fiducial plane (a broken line) as shown in FIG. 31B; thus making it impossible to execute any normal leveling. Here, the shorter the distance (interval) between the measuring points MPa and MPb, and also, the larger the stepping amount, the greater is the inclination error of the plane as a matter of course.

Therefore, when the plural measuring points of the multipoint AF system are grouped per step as in the fifth embodiment (FIG. 26B), for example, (the points being grouped for each of the steps having substantially the same height), there will be no problem that any inclination errors take place due to the step as shown in FIG. 31B if the leveling is performed using only the measuring points in one group. In other words, in order to solve the above-mentioned problem, it will suffice if only the leveling stage is driven just using the measures values in one and the same group. Thus, the processing becomes extremely simple.

Hereinafter, with reference to FIG. 32, the description will be made of an example of the operation to correct the inclination of the inspecting surface. Now, in step 400, given pieces of information are inputted through input means 31, and the groups are decided per measuring point (light receiving array) and also per measuring point at which to detect substantially the same height positions. Then, in step 401, the measured values each at the measuring points are obtained. Further, in step 402, the difference (max−min) between the maximum value (max) and the minimum value (min) of the measured values each at the measuring points in a group is obtained per group. In the next step 403, the sum of (max−min) per group is obtained. Then, the offset value to make the sum obtained in the step 403 zero or less than a given value is added to the measured value at each of the measuring points (step 404), Further, in step 405, the leveling stage 23 is driven. In step 406, using the multipoint AF system the leveling stage 23 is servo controlled to make the measured value at each of the measuring points equal to the target value to which the foregoing offset value is added.

For the above-mentioned processing, there is almost no need to give any consideration to the position (interval between the measuring points, and others, for example) at each of the measuring points. Accordingly, there is no problem such as encountered in FIG. 31B due to the stepping configuration on the inspecting surface. Also, there is also no problem in giving a particular consideration to the plural groups having substantially the same height positions in order to obtain the inclination from the difference in the measuring values in such plural groups and the intervals between the measuring points. Further, it may be possible to obtain the inclination by obtaining the hypothetical inspection surface from the measured values each at measuring points using the least squares method. Also, in the present embodiment, it is arranged to obtain the difference (max−min) in all the groups, respectively, but it may be possible to obtain the above-mentioned difference at least in one group only. Further, it may be possible to servo control the leveling stage 23 using a leveling sensor of a collimator type other than the multipoint AF system for the correction of the inclination while the inclination of the inspecting surface is obtained by the use of the multipoint AF system described above. In other words, subsequent to the correction amount corresponding to the inclination previously obtained being added to the leveling sensor as an offset value, the leveling stage is servo controlled to make the output value from the leveling sensor zero or less than a given value.

Figure 33:
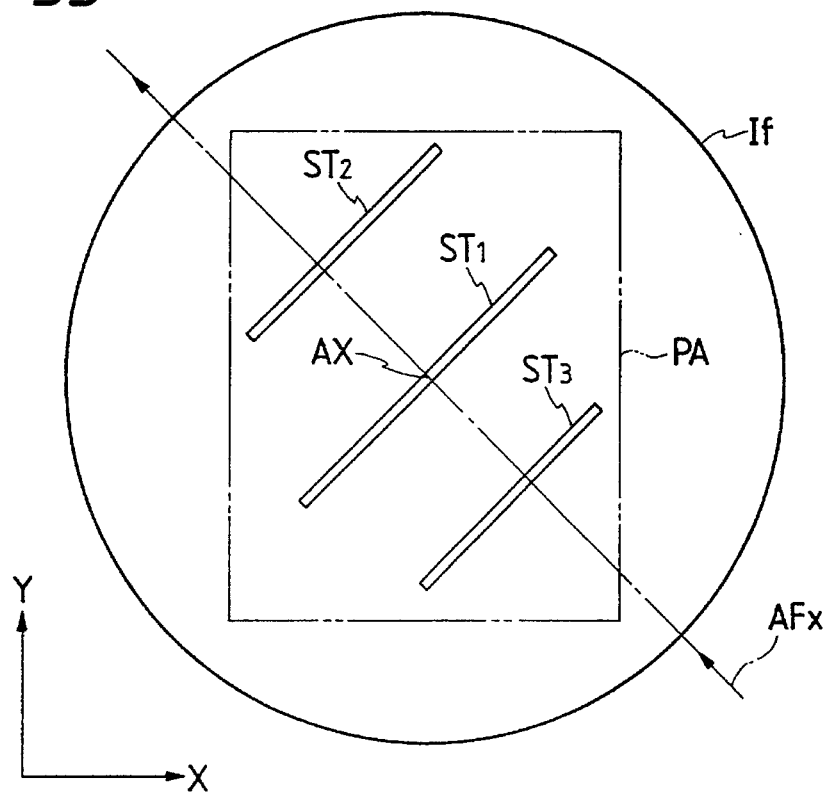
FIG. 33 is a view illustrating a case where the slit projection image of a focus detection system is made plural.

Now, in each of the above-mentioned embodiments, the description has been made assuming that the slit image ST is one, but it is possible to make the arrangement so that two or more slit images will be used. If, for example, three slit images ST1, ST2, and ST3 are used as shown in FIG. 33, the sensor structure and detection operation to project light to and receive light from each of the slit images are exactly the same as those in the foregoing embodiments. However, since there is a possibility that the stepping structure of each position where each slit image is formed, the way in which the weighting coefficient is given, and the offset amount should be different for each of the slit images. If the plural slit images are used as above, the measurement precision will further enhanced by performing the average-processing for each of the slits interrelatedly. Moreover, with this, it becomes possible to perform the operation effectively even if the stepping structure on an inspecting surface is more complexed, the number of chips in a shot area being more than three, for example. Also, in a case where an inclination should be obtained as in the sixth embodiment, the precision with which to measure the surface inclination will be enhanced using at least three measuring points among each of the slits. In this respect, it is conceivable to obtain the focus position and inclination using the measuring values each at measuring points by making the width of the slight image wide so that a plurality of measuring points are set two dimensionally in one slit image. Nevertheless, there is still an advantage in shortening the measurement period of time if the plural images are employed. Also, in each of the above-mentioned embodiments, while the description has been made of the focus detection system of a synchronous detection type, a focus detection system having two dimensional imaging elements (CCD and the like), or further, an air micrometer and the like can be used without any problem, for example.

Figure 35:
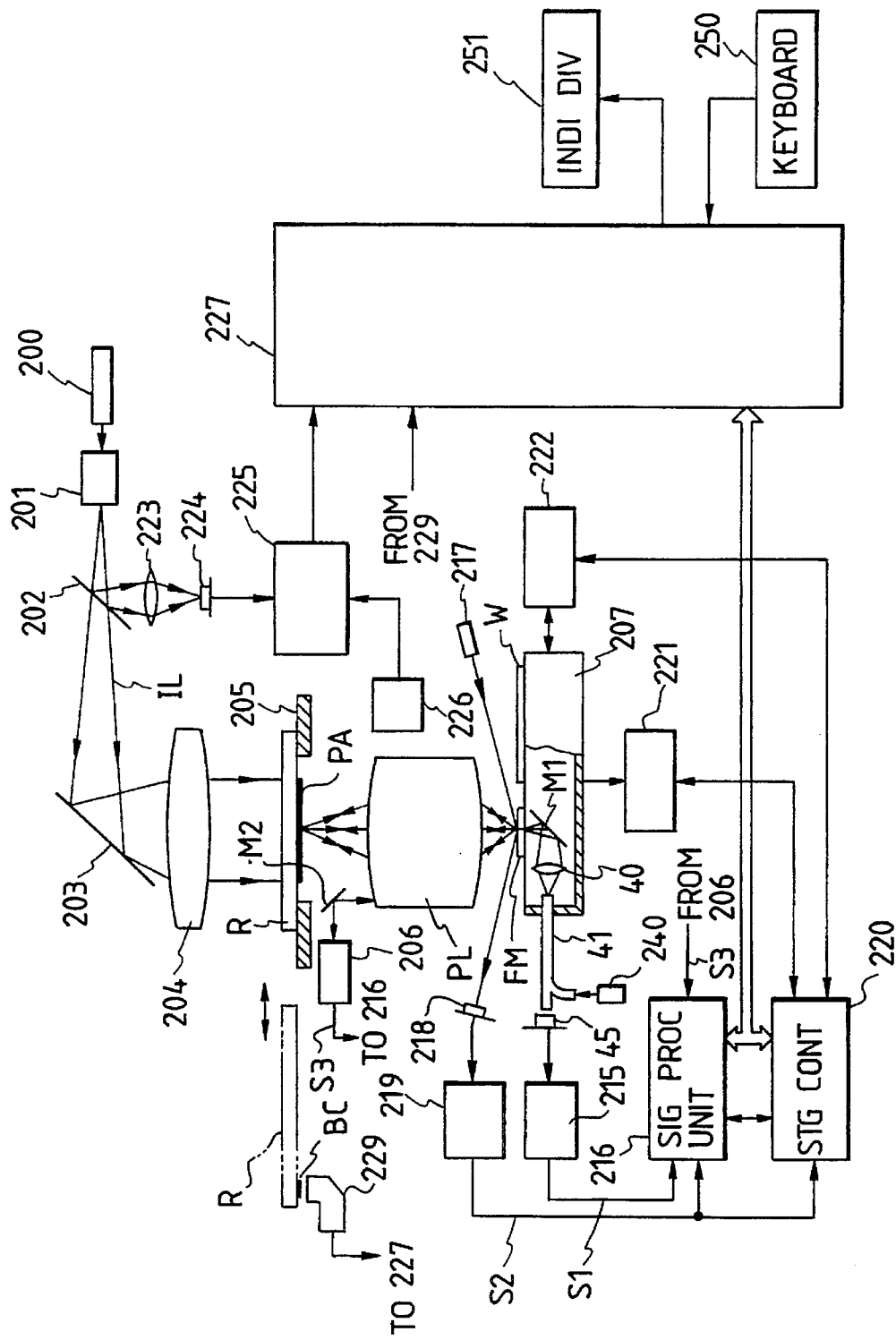
FIG. 35 shows the general construction of projection exposure apparatus provided with a levelling sensor according to a seventh embodiment of the present invention.

A seventh embodiment of the present invention will now be described with reference to FIG. 35. FIG. 35 shows the general construction of a projection exposure apparatus according to the present embodiment, in which there are provided levelling sensors (217, 218) disclosed in U.S. Pat. No. 4,558,949 and a TTL-FC system (240, 40, 41, M1, 45) of entirely the same construction as that shown in FIG. 10.

In FIG. 35, illuminating light IL emitted from an illuminating light source 200 for exposure enters an illuminating optical system 201 having an optical integrator (fly-eye lens), a reticle blind (field stop), an aperture stop (σ stop ), etc. As the illuminating light IL, use is made of the higher harmonic of a g-line, i-line, KrF or ArF excimer laser, or a metal vapor laser or a YAG laser. Most of the illuminating light IL having emerged from the illuminating optical system 201 is transmitted through a half mirror 202, is reflected by a mirror 203, is directed to a condenser lens 204 and illuminates a reticle R placed on a reticle stage 205 with substantially uniform illuminance.

Further, the illuminating light IL passed through a pattern forming area PA enters a both-side telecentric projection optical system PL, which projects the image of a circuit pattern onto a wafer W having a resist layer formed on the surface thereof. The wafer W is placed on a wafer stage 207, and the fiducial board (pattern board) FM of FIG. 10 is disposed on the wafer stage 207. The TTL-FC system (240, 40, 41, M1, 45) in FIG. 35 is of the same construction as that shown in FIG. 10 and therefore need not be described here, and in FIG. 35, a light source 240 for the TTL-FC system is provided discretely from the illuminating light source 200 for exposure.

Figure 37:
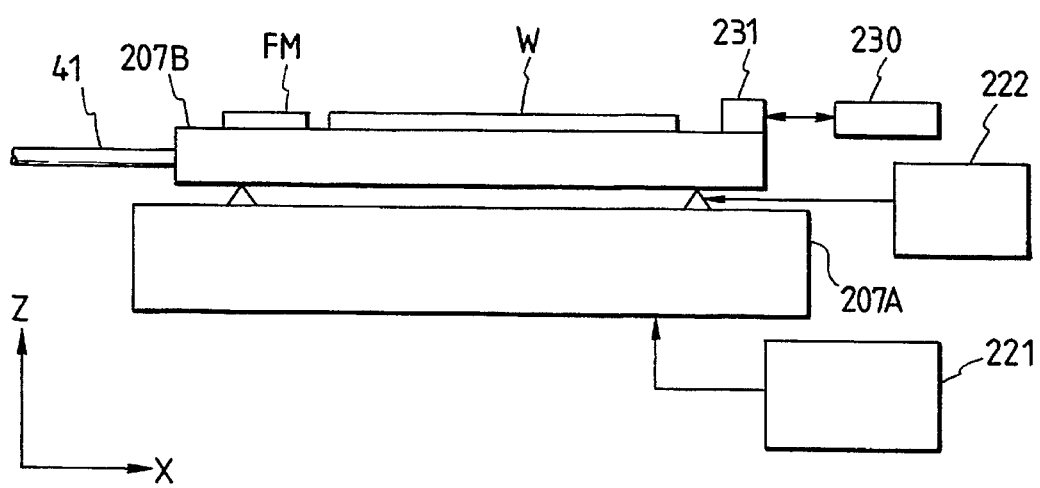
FIG. 37 shows the specific construction of a wafer stage in FIG. 35.

Now, although simply shown in FIG. 35, the wafer stage 207 is comprised of an XY stage 207A and a ZL stage 207B as shown in FIG. 37. The XY stage 207A is two-dimensionally movable in a plane (XY plane) perpendicular to the optical axis of the projection optical system PL by an XY driving system 221. The ZL stage 207B is finely movable in the direction of the optical axis of the projection optical system PL (Z direction) by independently controlling each of three sets of retractile drive elements (such as electrostrictive elements or magnetostrictive elements) by a ZL driving system 222, and is made arbitrarily inclinable with respect to the imaging plane of the projection optical system PL. Although not shown in FIG. 35, with the hysteresis nature of the drive elements taken into account, a position detector such as a capacity type displacement sensor or a differential transformer is provided for each drive element to thereby monitor the position of the drive element corresponding to a voltage or a magnetic field imparted to the drive element and make highly accurate driving possible.

In the present embodiment, the pattern board FM is placed on the ZL stage 207B, and like the wafer W, it is finely movable in Z direction and is arbitrarily inclinable with respect to the imaging plane of the projection optical system PL. The ZL stage 207B is, for example, a hollow ceramic stage, and a movable mirror 231 for reflecting a laser beam from a laser interferometer 230 is provided on an end portion thereof. Also, the positions (the amounts of movement) of the XY stage 207A in X and Y directions are always detected by two laser interferometers (of which only an interferometer 230 for X axis is shown) with a resolving power of the order of e.g. 0.01 μm.

Here, a detection signal S1 obtained by amplifying a signal output from a photodetector 45 to an optimum level by an amplifier 215 is a signal indicative of the intensity of a light beam passed through the fiducial pattern of the pattern board FM, and this detection signal S1 is output to a signal processing unit 216. The detection signal S1 becomes greatest when the surface of the pattern board FM coincides with the best imaging plane of the projection optical system PL (that is, becomes in focus). Accordingly, even if the imaging characteristic of the projection optical system PL is varied as by the absorption of exposure light, the above-described operation can be performed at any time (for example, even during the exposing operation for a wafer) to obtain the detection signal S1, thereby detecting the in-focus point (the best focus position) at any position in the image field of the projection optical system PL. However, when a phase type diffraction grating is used as the fiducial pattern on the pattern board FM, the detection signal S1 becomes smallest at the in-focus point.

Also, in the above-described apparatus (FIG. 35), the illuminating light source 240 is provided discretely from the light source 200 for exposure, but design may be made such that part of the illuminating light IL emitted from the light source 200 for exposure is caused to branch off by a beam splitter or the like and is directed to under the pattern board FM by an optical fiber, a mirror or the like. Also, the exit surface of the optical fiber 41 is substantially conjugate with the pupil plane of the projection optical system PL, and further it is desirable that the illuminating conditions therefor (coherence factor σ value, etc.) be made the same as the illuminating conditions for the reticle R by the illuminating optical system 201. Where for example, the inclined illuminating method (modified light source method) announced in *SPIE Optical/Laser Microlithography* V, Vol. 1674, 1992 or proposed in our U.S. application Ser. No. 791,138 (Nov. 13, 1991) is adopted, inclined illumination is also effected for the reference pattern. Specifically, a stop having an opening at each of a plurality of (two or four) positions eccentric relative to the optical axis of the optical fiber 41 can be disposed near the exit surface of the optical fiber 41.

Figure 36A:
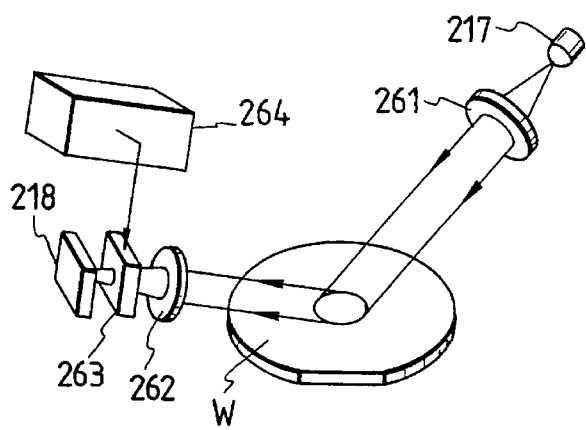
FIGS. 36A and 36B show the specific construction of the levelling sensor in FIG. 35.
Figure 36B:
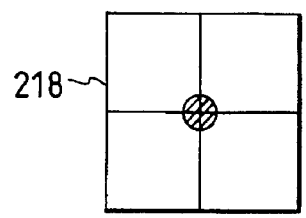

Now, inclination detecting systems (levelling sensors) 217 and 218 in FIG. 35, as disclosed in U.S. Pat. Nos. 4,558,949 and 4,902,900, are disposed symmetrically with respect to the optical axis of the projection optical system PL and the size of the detection areas thereof (the areas to which a parallel light beam is applied) is determined so as to substantially coincide with a shot area on the wafer W. This is accomplished by a variable field stop disposed in an irradiating optical system. In FIG. 35, only the light source 217 and the photoelectric detector 218 are shown, and as shown in FIG. 36A, the levelling sensor of the present embodiment has an objective lens 261 for converting the light emitted from the light source 217 into a parallel light beam, a condensing lens 262 for condensing the light reflected by the surface of the wafer W (or the pattern board FM) on the light receiving surface of the photoelectric detector (for example, a photoelectric sensor comprising the four-division light receiving element of FIG. 36B) 218, and plane parallel glass 263 two-dimensionally inclinably disposed for making the condensing point of the reflected light on the light receiving surface movable. Thus, in this levelling sensor, when the wafer W or the pattern board FM is inclined, the condensing point of the reflected light on the light receiving surface of the four-division light receiving element 218 moves in conformity therewith. Therefore, it is possible to find the amount and direction of inclination of the wafer W or the pattern board FM by detecting the amount and direction of movement of the condensing point relative to the reference point (for example, the central point) on the light receiving surface. Also, the plane parallel glass 263 is driven by a driving system 264 and is inclined so that when for example, in the calibrating operation of the levelling sensor, the imaging plane of the projection optical system PL and the surface of the pattern board FM become parallel to each other, the condensing point of the reflected light from the pattern board FM may coincide with the central point of the light receiving surface.

Although not shown, it is to be understood that in the projection exposure apparatus shown in FIG. 35, the afore-described fixed point AF system or multipoint AF system is also disposed besides the levelling sensors 217 and 218. As disclosed in U.S. Pat. No. 4,558,949, use may be made of a system comprising a combination of the fixed point AF system and the levelling sensors. Signals output from the levelling sensors 217, 218 and the fixed point AF system (or the multipoint AF system) are supplied through a signal processing circuit 219 to the signal processing unit 216 and a stage controller 220.

Further, there is also provided an alignment sensor 206 of the TTL (through-the-lens) type in FIG. 35. The alignment sensor 206 serves to detect an alignment mark (a diffraction grating mark) on the wafer W through the projection optical system PL, and the construction, etc. thereof are disclosed, for example, in U.S. Pat. No. 4,699,515. Although not described in detail herein, the alignment sensor 206 includes a cylindrical lens, a photoelectric detector, etc., and condenses the laser beam into a band-like spotlight via a mirror M2 and the projection optical system PL and applies the spotlight onto the wafer W. When the wafer stage 207, i.e., the XY stage 207A, is finely moved and the spotlight and the alignment mark on the wafer W are moved relative to each other, the alignment sensor 206 photoelectrically detects diffracted light (or scattered light) created from the alignment mark, through the projection optical system PL. The alignemnt sensor 206 outputs to the signal processing unit 216 a photoelectric signal S3 conforming to the intensity of the diffracted light (scattered light) from the alignment mark.

Now, the signal processing unit 216 includes an A/D converter, a memory, etc. and uses the photoelectric signal $3 from the alignment sensor 206 and a position signal from an interferometer 230 to calculate the position of the alignment mark on the wafer W (or the fiducial pattern on the pattern board FM) by a predetermined calculating process. Further, the signal processing unit 216 introduces into the memory a detection signal S1 output from the photoelectric detector 45 and a detection signal from the focus position detecting system (the fixed point AF system) when the ZL stage 207B is finely moved (parallel-moved) in the direction of the optical axis, finds the coordinates value of the Z axis of the in-focus point (the best focus position) at any position in the image field of the projection optical system PL by a predetermined calculating process, and supplies this information to the stage controller 220 and a main control system 227. The main control system 227 calculates the imaging plane of the projection optical system PL by a predetermined calculating process (such as an averaging process or a maximum square method) on the basis of the information from the signal processing unit 216, i.e., the in-focus point (coordinates value) at each of at least three positions in the image field of the projection optical system PL, and inclines the ZL stage 207B by the stage controller 220 in accordance with the result of this calculation, whereafter it uses the pattern board FM to effect the calibration of the inclination detecting systems 217, 218 and in addition, generally controls the entire apparatus.

Now, part of the illuminating light IL emitted from the illuminating optical system 201 is reflected by the half mirror 202, whereafter it is converged on the light receiving surface of an irradiation amount sensor (photoelectric detector) 224 through a condensing optical system 223, and a photoelectric conversion signal output from the irradiation amount sensor 224 is supplied to a sensor control unit 225. An environment sensor 226, which is disposed near the projection optical system PL, measures the atmospheric pressure, temperature, humidity, etc. around it, and supplies the result of this measurement to the sensor control unit 225. The sensor control unit 225 supplies the main control system 227 with the information of the amount of irradiation to the projection optical system PL obtained by integrating a signal output from the irradiation amount sensor 224, and the information of the atmospheric pressure, temperature, humidity, etc. around the projection optical system PL. The main control system 227 supplies the signal processing unit 216 and stage controller 220 with a command for instructing them to perform a predetermined operation, and the data of signals S1 and S2 are supplied from the signal processing unit 216 and stage controller 220 to the main control system 227.

Also, a bar-code reader 229 for reading a bar-code pattern BC on the reticle R is provided in FIG. 35, and the main control system 227 sets the various conditions of the apparatus (FIG. 35) on the basis of information written in the bar-code pattern BC. Various conditions may be written in the bar-code pattern BC on the reticle R, or the main control system 227 may store (input inadvance) therein the name of the reticle and various conditions corresponding thereto, and the name of the reticle and the stored substance written in the bar-code pattern BC may be checked up and the various conditions may be determined (set). Design may also be made such that the above-mentioned various conditions and the name of the reticle are input to the main control system 227 by the operator with the aid of a keyboard 250. An indicating device (such as a CRT) 251 serves to inform the operator of the operating state or the like of the apparatus, and may be designed to indicate, for example, the waveform of the detection signal S1 from the photoelectric detector 45 or the inclined state of the imaging plane of the projection optical system PL calculated as described above.

Description will now be briefly made of the calibration operation of the inclination detecting systems 217 and 218 in the apparatus (FIG. 35) of the above-described construction. It is to be understood that the focus position detecting system is set with the Z axis coordinates $Z_B$ of the wafer stage 207 as the in-focus point (zero point reference).

Now, the main control system 227 determines the positions and number of the measuring points for detecting the in-focus point in the image field necessary for calculating the best imaging plane of the projection optical system PL, on the basis of particularly the information regarding the size and shape of the pattern area PA of the reticle R which is included in the information read by the bar-code reader 229 when the reticle stage 205 is loaded with the reticle R. The number of the measuring points need be at least three, and can be determined in conformity with the calculation accuracy or the like of the imaging plane. Also, it is desirable that the positions of the measuring points be determined, for example, to the center of the image field (pattern area PA) and the vicinity of the outer periphery thereof.

Subsequently, the main control system 227 drives the XY stage 207A through the stage controller 220 to thereby move the pattern board FM to a desired measuring point in the image field of the projection optical system PL (i.e., one of at least three measuring points previously determined, and here the position of the optical axis of the projection optical system PL). Thereafter, it moves the Z axis coordinates of the ZL stage 207B by ΔZ below the current position (in-focus point) $Z_B$ (in a direction away from the projection optical system PL). When here, the expected maximum absolute value of the fluctuation of the imaging plane of the projection optical system PL in the direction of the Z axis is $Z_{MAX}$, the interval (the amount of movement) ΔZ is chosen so as to be $\Delta Z > Z_{MAX}$.

Further, the main control system 227 moves (scans) the ZL stage 207B from a position ($Z_B$–ΔZ) to above it at a substantially constant speed through the stage controller 220 and the ZL driving system 222. When this scanning is started, the signal processing unit 216 introduces thereinto the detection signal S1 from the photoelectric detector 45 and the detection signal from the focus position detecting system in synchronism with a predetermined sampling pulse and write these signals into a memory. At this time, the stage controller 220 examines whether the Z axis coordinates of the ZL stage 207B have reached ($Z_B$+ΔZ), and stops the scanning of the ZL stage 207B at a point of time whereat the Z axis coordinates have reached ($Z_B$+ΔZ). Thereafter, the signal processing unit 216 calculates the Z axis coordinates of the in-focus point (the best focus position) at the position of the optical axis of the projection optical system PL, and outputs this coordinates value to the main control system 217.

Thereafter, the main control system 227 finds the coordinates value of the in-focus point of each of all the measuring points in the image field previously determined, by an operation entirely similar to what has been described above. Thereafter, it calculates the imaging plane of the projection optical system from these in-focus points (coordinates values). Here, the imaging plane of the projection optical system PL has curvature of image field, etc. and therefore, an approximate plane is found by the use of the minimum square method, for example, and this plane is regarded as the imaging plane (see FIG. 23B). Further, the main control system 227 finds the amount of driving of three sets of driving elements on the basis of the previously calculated imaging plane (approximate plane) so that the imaging plane of the projection optical system PL and the surface of the pattern board FM may become coincident with (parallel to) each other. This amount of driving is then imparted to the stage controller 220, and the ZL stage 207B is driven by the ZL driving system 222. In a state in which the imaging plane of the projection optical system PL and the surface of the pattern board FM have been made substantially coincident with each other by the above-described operation, the main control system 227 detects the surface of the pattern board by the use of the inclination detecting systems 217, 218. The plane parallel glass 263 is then inclined, for example, by the driving system 264 so that the condensing point of the light reflected by the surface of the pattern board FM may coincide with the center of the light receiving surface of the four-division light receiving element 218, whereby the calibration of the inclination detecting systems 217, 218 is effected. Herein, description has been made of the method of inclining the plane parallel glass 263 to thereby optically provide offset, but the calibration method adopted may be any other method than this, and for example, design may be made such that the value of the detection signal S2 from the photoelectric sensor 218 when the imaging plane of the projection optical system PL and the surface of the pattern board FM coincide with each other is memorized as the reference value, whereafter the control of the ZL stage 207B is effected with the detection signal S2 as the reference value.

When the in-focus point is to be detected at any one point in the image field of the projection optical system PL, the measuring operation as described above can be repeated a plurality of times to thereby improve the accuracy of the measurement of the focus position. At this time, during each measurement (the scanning of the ZL stage 207B), the XY stage 207A is moved to thereby displace the position of the pattern board FM by a minute amount in a plane (XY plane) perpendicular to the optical axis of the projection optical system PL. Thereby, the position in the pattern area PA of the reticle R onto which the image of the fiducial pattern on the pattern board FM is projected is also displaced by a minute amount and therefore, the influence of the pattern of the pattern area PA is eliminated and any reduction in the accuracy of measurement is prevented.

Also, in the present embodiment, when the in-focus point is to be detected at each of a plurality of measuring points in the image field, the XY stage 207A is moved for each measuring point and the fiducial pattern on the pattern board FM is substantially brought into coincidence with a desired measuring point, whereafter the ZL stage 207B is finely moved. However, if a plurality of fiducial patterns are pre-formed within a range on the pattern board FM which corresponds to the image field and the TTL-FC system (40, 41, 45) is disposed for each fiducial pattern, it will become possible to detect the in-focus points at all measuring points simply by scanning the ZL stage 207B only once in Z direction.

Also, where use is made of a pattern board FM formed with a plurality of such fiducial patterns, the imaging plane of the projection optical system PL and the surface of the pattern board FM are made coincident with each other prior to the calibration operation of the inclination detecting systems 217, 218, whereafter the ZL stage 207B is again finely moved in Z direction and the in-focus point at the position in the image field whereat each fiducial pattern is formed is detected, whereby whether the imaging plane of the projection optical system PL and the surface of the pattern board FM are exactly parallel to each other can be simply checked up (and corrected). When the ZL stage 207B is to be driven to make the imaging plane of the projection optical system PL and the surface of the pattern board FM coincident with each other, if the ZL stage 207B is driven while the surface of the pattern board FM is detected by the use of a focus position detecting system, the two can be made exactly coincident with each other.

It is desirable that at this time, for example, an optical system capable of detecting the position of the wafer W in the direction of the optical axis of the projection optical system PL (the direction of the Z axis) at each of a plurality of predetermined points in the image field of the projection optical system PL, i.e., the aforementioned multipoint AF system, be used as the focus position detecting system. As the optical system of this kind, there is a system in which a plurality of conventional focus position detecting systems are disposed, or a system one or more long slits are formed in the surface of a wafer (within the range of the image field of the projection optical system PL) and the image of such slit or slits is divided into a plurality and received by a one-dimensional or two-dimensional line sensor or the like (the detection principle of this system is the same as that of the conventional focus position detecting system). Also, in the optical system of this kind, it is desirable that the plurality of measuring points of the optical system in the image field of the projection optical system PL and the plurality of detection points of the in-focus point by the TTL-FC system are made coincident with one another.

Also, the fiducial pattern on the pattern board FM may be comprised, for example, of an ECD (electrochromic device) disposed in the form of a matrix, or a liquid crystal element or the like. By controlling a voltage applied to each of minute elements constituting the matrix, various grating patterns can be formed. For example, grating patterns may be formed by an ECD or the like so as to be the same conditions as the degree of minuteness (pitch and periodicity) and shape of the pattern to be transferred to the wafer.

An eighth embodiment of the present invention will now be described. The projection exposure apparatus according to this embodiment is basically the same in construction as the seventh embodiment (FIG. 35) and therefore, the general construction thereof need not be described and only the differences thereof in construction from the apparatus of the seventh embodiment will be described below. The present embodiment is characterized in that the position of any particular mark (alignment mark or the like) on a reticle R is detected by the use of the TTL-FC system in FIG. 35.

Figure 38:
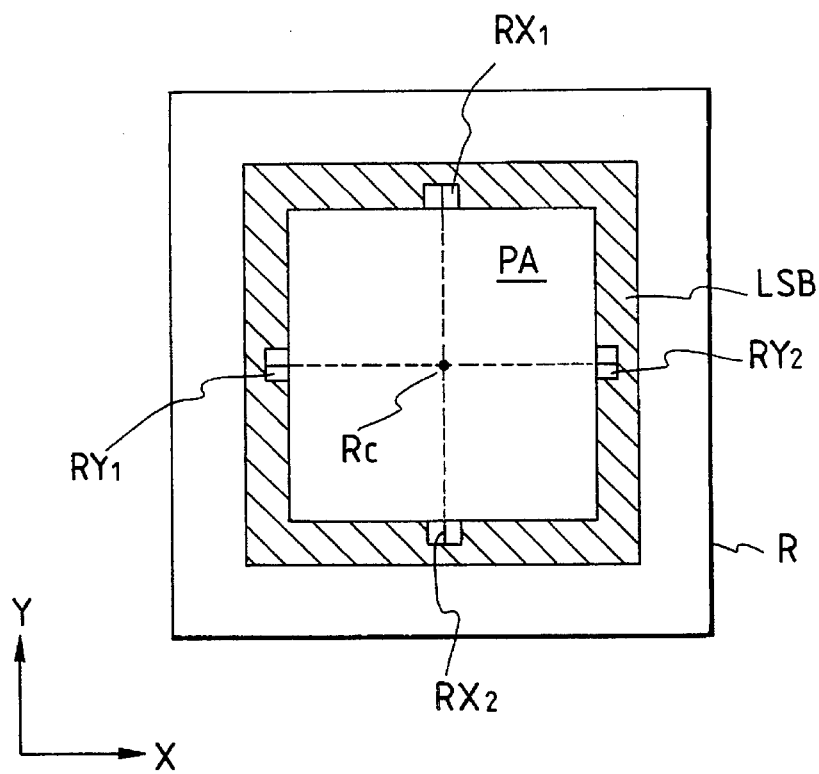
FIG. 38 shows the specific construction of a reticle used in an eighth embodiment of the present invention.

Referring to FIG. 38 which schematically shows the construction of the reticle R used in the present embodiment, a circuit pattern is formed in a pattern area PA surrounded by a light intercepting zone LSB and further, alignment marks $RX_1$, $RX_2$, $RY_1$ and $RY_2$ are formed on the respective sides of the pattern area PA. The alignment mark $RX_1$ is a bar mark formed so as to extend in Y direction by a light intercepting layer in a transparent window provided in the light intercepting zone LSB attendantly to the pattern area PA, and the other three marks also are of the same shape as the mark $RX_1$ and therefore need not be described herein. Each of the four alignment marks is formed substantially at the center of each side of the pattern area PA, that is, disposed substantially symmetrically with respect to the center Rc of the reticle R (pattern area PA).

Figure 39:
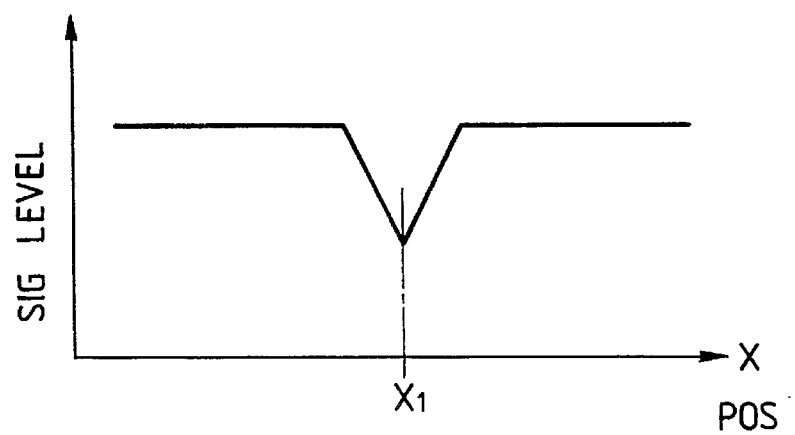
FIG. 39 is a graph for illustrating the measurement of the position of a particular mark on the reticle.

Now, when the XY stage 207A is moved in X direction when an alignment mark (e.g. $RX_1$) on the reticle R is to be detected by the use of the TTL-FC system and the pattern board FM, a detection signal S1 output from the photoelectric detector 45 becomes minimum (FIG. 39) when the projected image of a fiducial pattern MX (FIG. 41) on the pattern board FM and the alignment mark $RX_1$ coincide with each other. Exactly speaking, when each of fine light intercepting (chromium) patterns constituting the fiducial pattern MX coincides with the alignment mark $RX_1$, the detection signal S1 becomes minimum correspondingly to each light intercepting pattern. Therefore, actually, it is necessary to determine the position of the fiducial pattern MX as by averaging the positions of the light intercepting patterns. In FIG. 39, for the simplicity of illustration, there is shown the waveform of the detection signal S1 obtained when a light intercepting pattern is used as the fiducial pattern. Accordingly, when effecting reticle alignment, base line measurement or the measurement of the imaging characteristics (particularly the projection magnification and distortion) of the projection optical system, the above-described operation can be performed to a particular mark on the reticle to obtain the detection signal S1, thereby detecting the position of the particular mark (i.e., the coordinates position in the orthogonal coordinates system XY prescribed by the interferometer 230).

Thus, the signal processing unit 216 in the present embodiment calculates the position of the alignment mark on the reticle R by the use of the detection signal S1 output from the photoelectric detector 45 and the position signal from the interferometer 230 when the XY stage 207A is finely moved in X direction or Y direction. It is to be understood here that the signal processing unit 216 introduces the signals S1–S3 and the position signal from the interferometer 230 thereinto, and then carries out waveform processing in a software-like fashion to thereby calculate each position. Also, the stage controller 220 serves to receive as inputs the detection signal from the focus position detecting system (the aforementioned fixed point AF system or multipoint AF system) and the position signal from the interferometer 230 and control the movement of the wafer stage 207, and servo-controls the driving systems 221 and 222 in accordance with the command value (target position) from the main control system 227 and positions the wafer stage 207 at the target position. Further, the main control system 227 uses the fiducial pattern on the pattern board FM to effect the measurement of the imaging characteristics of the projection optical system and the base line and besides, generally control the entire apparatus.

The reticle alignment operation in the apparatus of the above-described construction (FIG. 35) will now be briefly described. It is to be understood here that the calibration of the focus position detecting system has already been terminated and by the use of the focus position detecting system, the surface of the pattern board FM is made coincident with the best imaging plane of the projection optical system PL in advance.

In FIG. 35, the reticle stage 205 is loaded with the reticle R, whereafter the main control system 227 executes reticle alignment by the use of the fiducial patterns MX and MY (FIG. 41) on the pattern board FM. The wafer stage 207 is first moved to set the fiducial pattern MX on the pattern board FM and the alignment mark $RX_1$ on the reticle R into predetermined positional relationship, whereafter the illuminating light IE is applied to the fiducial pattern MX from the underside thereof. Thus, the light transmitted through the fiducial pattern MX passes through the projection optical system PL to the underside of the reticle R, and the projected image of the fiducial pattern MX is formed near the alignment mark $RX_1$.

Thereafter, the XY stage 207A is finely moved in X direction and the alignment mark $RX_1$ and the projected image of the fiducial pattern MX are moved relative to each other in X direction. The signal processing unit 216 receives as inputs the detection signal S1 output from the photoelectric detector 45 with said movement and the position signal from the interferometer 230, and calculates a position $X_1$ in X direction at which as shown in FIG. 39, the level (voltage value) of the detection signal S1 becomes minimum as the position of the alignment mark $RX_1$. Likewise, it calculates the position $X_2$ of the alignment mark $RX_2$ by the use of the fiducial pattern MX, and further calculates the positions $Y_1$ and $Y_2$ of the alignment marks $RY_1$ and $RY_2$, respectively, by the use of the fiducial pattern MY. The main control system 227 calculates the residual alignment errors of the reticle R in X, Y and rotational directions from the thus calculated four positions $X_1$, $X_2$, $Y_1$ and $Y_2$, whereafter it finely moves the reticle stage 205 so that said errors may become approximately zero. Thereby, the reticle alignment operation is terminated. While in this embodiment, the reticle stage 205 is finely moved so as to effect reticle alignment, design may also be made such that for example, when the reticle pattern is to be transferred to the wafer W, the previously calculated residual errors are offset and by an amount corresponding to this offset, the XY stage 207A is deviated from the target position and is positioned.

The base line measuring operation in the apparatus of the above-described construction will now be briefly described.

It is to be understood here that the calibration of the focus position detecting system and the reticle alignment have already been terminated and the surface of the pattern board FM is coincident with the best imaging plane of the projection optical system PL. It is also to be understood that the alignment sensor 206 in FIG. 35 detects the positions of the alignment marks in X direction by the use of a spotlight extending in Y direction on the wafer W.

By an operation similar to the reticle alignment as described above, the main control system 227 first detects the position of the alignment mark $RX_1$ (or $RX_2$) on the reticle R by the use of the fiducial pattern MX. Thereafter, it detects the fiducial pattern MX by the use of the alignment sensor 206. That is, the XY stage 207A is finely moved in X direction and the spotlight and the fiducial pattern MX are moved relative to each other in X direction. It is to be understood that at this time, the illuminating light IE is not being applied to the fiducial pattern MX. Also, the detection signal S3 from the alignment sensor 206 is varied in intensity in conformity with the difference in the reflectance of the fiducial pattern MX.

So, the signal processing unit 216 receives as inputs the detection signal S3 output from the alignment sensor 206 with said movement and the position signal from the interferometer 230, and calculates the central position of the variation in the intensity of the detection signal S3 as the position of the fiducial pattern MX in X direction, i.e., the mark detection position of the alignment 10 sensor 206 (the applied position of the spotlight). The main control system 227 memorizes the difference between the previously calculated position of the alignment mark $RM_1$ and the mark detection position of the alignment sensor 206 as a base line amount $\Delta X$. Thereby, the base line measuring operation of the alignment sensor 206 is terminated.

In this embodiment, the mark detection position of the alignment sensor 206 is found by the use of the fiducial pattern MX, but alternatively, diffraction grating marks (e.g. DX and DY in FIG. 41) suitable for the alignment sensor 206 may be formed on the pattern board FM and the mark detection position of the alignment sensor 206 may be found by the use of said marks. Where the diffraction grating mark DX and the fiducial pattern MX are formed on the pattern board FM in deviated relationship with each other in X direction, the amount of the deviation need be given as offset to the base line amount $\Delta X$. However, in FIG. 41, the amount of the deviation is determined to zero.

Figure 41:
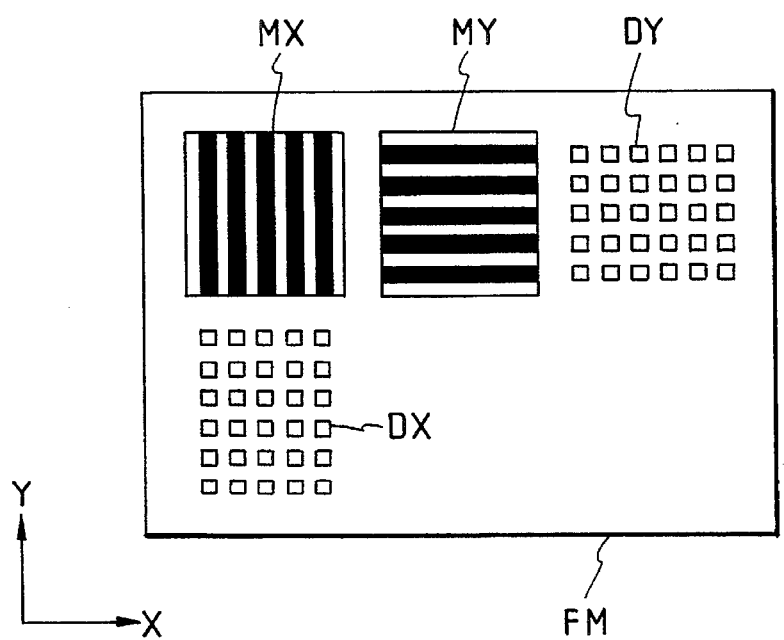
FIG. 41 shows the construction of a pattern suitable for the measurement of a base line.

Also, the base line measuring time can be shortened if the fiducial pattern MX and diffraction grating mark DX in FIG. 41 are used. That is, on the pattern board FM, the fiducial pattern MX and diffraction grating mark DX are formed in predetermined spaced apart relationship with each other with respect to Y direction so that the spotlight on the alignment sensor 206 and the diffraction grating mark DX may overlap each other when the projected image of the fiducial pattern MX and the alignment mark $RX_1$ on the reticle R coincide with each other. Thus, during the base line measurement, the position of the alignment mark $RX_1$ on the reticle R and the mark detection position of the alignment sensor 206 can be detected at a time simply by the pattern board FM being scanned (moved) only once in X direction, and the measuring time can be shortened. The diffraction grating marks DX and DY both are light-reflective marks formed on the pattern board FM by a light intercepting layer (or unevenness). Now, the base line measurement as described above may be effected for each unit number of wafers or may be effected with the measurement intervals being gradually shortened.

Description will now be briefly made of the operation of measuring the imaging characteristics, particularly distortion, of the projection optical system PL in the apparatus of the above-described construction. It is to be understood here that the measurement of distortion is effected by the use of a test reticle TR shown in FIG. 40. It is also to be understood that the test reticle TR is placed on the reticle 205 and reticle alignment and the calibration of the focus position detecting system have already been terminated and the surface of the pattern board FM is coincident with the best imaging plane of the projection optical system PL.

Figure 40:
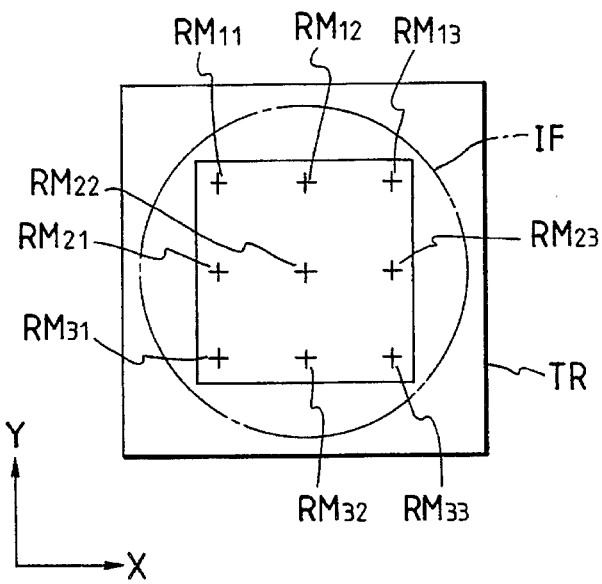
FIG. 40 shows an example of the reticle suitable for the measurement of the distortion of a projection optical system.

As shown in FIG. 40, nine cruciform particular marks $RM_{11}$–$RM_{33}$ are formed on the test reticle TR. A circle IF indicated by a dot-and-dash line in FIG. 40 represents the image field of the projection optical system PL. It is also to be understood that the spacing between adjacent ones of the nine particular marks on the test reticle TR is known.

Now, by an operation entirely similar to the aforedescribed reticle alignment, the main control system 227 detects the position of the particular mark $RM_{11}$ in X direction by the use of the fiducial pattern MX, and thereafter further detects the position of the particular mark $RM_{11}$ and Y direction by the use of the fiducial pattern MY. Such operation is repetitively executed for each of the remaining eight particular marks, whereby the positions of all particular marks in X and Y directions are found. Thereafter, the main control system 227 calculates the spacing between adjacent ones of the particular marks from the positions of the nine particular marks in X and Y directions, and finds the difference between this spacing and the design spacing (known) as the amount of distortion of the projection optical system PL. Thereby, the measurement of the distortion is terminated. It is apparent that in the above-described measurement, even the amount of error of the projection magnification can be calculated together with the amount of distortion.

Now, in the present embodiment, it is to be understood that when reticle alignment, base line measurement and distortion measurement are to be effected, the surface of the pattern board FM and the best imaging plane of the projection optical system PL are made coincident with each other in advance. This is because when the telecentricity of the projection optical system PL (particularly on the wafer side thereof) is bad, if in a defocus state, the positions of the particular marks are measured by the use of the fiducial pattern, an error will arise in the measured values thereof. So, the position of the alignment mark $RX_1$ in X direction at each Z position is measured by the use of the fiducial pattern MX while for example, the ZL stage 207B is moved by a predetermined amount in Z direction by the use of the alignment mark $RX_1$ on the reticle R, whereby the telecentricity (the inclination of the principal ray) on the wafer side of the projection optical system PL is found in advance. When the position of the alignment mark (or a particular mark) is measured in the defocus state, if the measured value is corrected in conformity with the previously found telecentricity and the defocus amount, it will become unnecessary to make the surface of the pattern board FM and the best imaging plane of the projection optical system PL prior to said measurement.

It is also to be understood that in the present embodiment, the alignment mark is intactly used as a particular mark, but a particular mark may be disposed discretely from the alignment mark. Further, as shown in FIG. 38, a bar mark is used as a particular mark, but the shape of the particular mark may be arbitrary and for example, use may be made of a so-called multimark comprising a plurality of bar marks, diffraction grating marks (DX, DY) shown in FIG. 41, or a direct grating mark. The shape of the fiducial pattern on the pattern board FM may also be arbitrary, and for example, the diffraction grating marks (DX, DY) in FIG. 41 may be used.

Figure 42A:
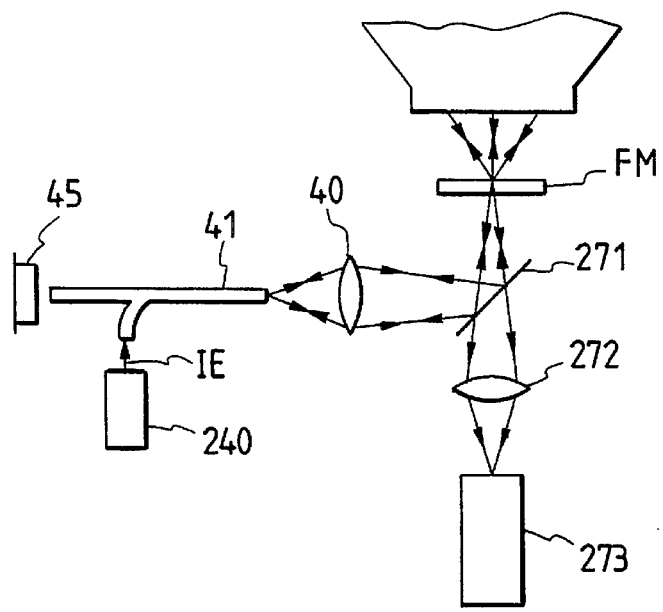
FIGS. 42A, 42B and 42C show modifications of a TTL-FC system in FIG. 35.

Further, in the present embodiment, when the position of the particular mark is to be measured, the reticle R and the pattern board FM are moved relative to each other in a plane perpendicular to the optical axis of the projection optical system PL, but by adopting, for example, a construction as shown in FIG. 42A, the position of the particular mark can be measured with the two kept stationary. In FIG. 42A, the same members as those in FIG. 35 are given the same reference characters.

Figure 42B:
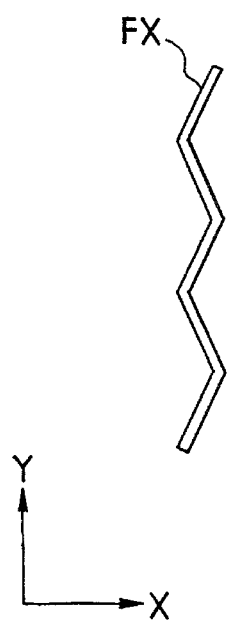

In FIG. 42A, the illuminating light IE from an illuminating light source 240 illuminates the pattern board FM from the underside thereof through an optical fiber 41, a condensing lens system 40 and a beam splitter (half mirror) 271. A fiducial pattern FX as shown in FIG. 42B is formed on the pattern board FM, and the light transmitted through this pattern FX enters the projection optical system PL, which thus forms the projected image of the fiducial pattern FX on the underside of the reticle R. The light reflected by the underside of the reticle R passes through the projection optical system PL, the fiducial pattern FX and the beam splitter 271, whereafter it enters the light receiving surface of an image pickup element (such as a CCD camera) 273 through a lens system 272. The light receiving surface of the image pickup element 273 is disposed conjugately with the surface of the pattern board FM, and on this light receiving surface, the image of a particular mark (e.g. $RX_1$) on the reticle R is also formed together with the image of the fiducial pattern FX.

Figure 42C:
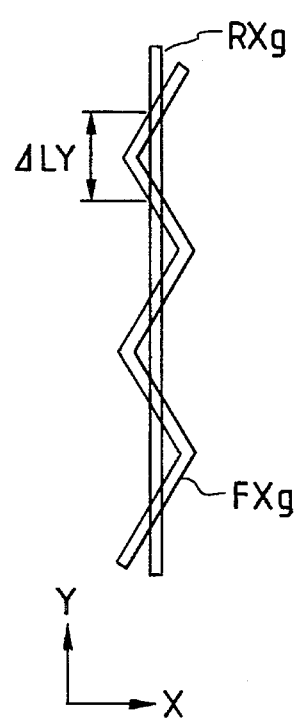

Now, on the light receiving surface of the image pickup element 273, as shown in FIG. 42C, the image $FX_g$ of the fiducial pattern FX and the image $RX_g$ of the alignment mark $RX_1$ overlap each other. Accordingly, by measuring the interval $\Delta LY$ between the overlapping portions of the two images in Y direction, and using a predetermined conversion expression, the amount of positional deviation $\Delta LX$ between the two images in X direction can be calculated accurately. So, the position of the alignment mark $RX_1$ in X direction can be calculated by the use of this amount of deviation $\Delta LX$ and the position signal from the interferometer 230.

According to the above-described construction, even if the wafer stage 207 is not finely moved, the positions of the particular marks on the reticle R can be found and also, by using the detection signal S1 of the photoelectric detector 45, the focus position of the projection optical system PL can be detected just as in the above-described embodiment. In FIG. 42A, the photoelectric detector 45 and the image pickup element 273 are employed, but if for example, a two dimensional array capable of random access is used as the image pickup element 273 and the output from an element of the two-dimensional array is used instead of the detection signal S1 of the photoelectric detector 45, it will become possible to effect focus detection and the measurement of the positions of the particular marks by the image pickup element 273 alone, without providing the photoelectric detector 45.

In the above-described eighth embodiment, it is possible to measure the imaging characteristics of the projection optical system PL, i.e., the focus position, astigmatism, curvature of image field and further, distortion and projection magnification thereof, by the use of the fiducial pattern on the pattern board FM and also, it is possible to effect reticle alignment and base line measurement. Accordingly, only one pattern board is required to be provided on the wafer stage 207, and this leads to an advantage that limitations in the arrangement on the stage become reduced and the space can be economized.

What is claimed is:

1. A plane positioning apparatus comprising:

a projection system for projecting a beam to a given portion on a substrate surface;

a light receiving system for receiving a reflective beam from said substrate surface to output a photoelectric signal corresponding to variation of the light receiving position;

a calculating circuit to output a deviation signal corresponding to a deviation amount of said substrate surface from a predetermined fiducial plane in accordance with said photoelectric signal;

a substrate shifting system for shifting and setting said substrate to a given position in a direction perpendicular to said fiducial plane in accordance with said deviation signal;

a detecting device for detecting level variation of said deviation signal generated at a time of displacing said substrate surface and said fiducial plane interrelatedly within a range having substantially a linear relationship with said deviation amount;

a calculating device for calculating a value of inclination of level variation characteristics at a point where said substrate surface and said fiducial plane are substantially matched in accordance with said level variation characteristics; and a correcting device for correcting an allowable range set for said level variation characteristics in accordance with said calculated value of inclination in order to control said substrate shifting system.

2. A plane positioning apparatus of claim 1, wherein said correcting device includes an offset generating member for giving an offset corresponding to a deviation between a target plane where said substrate surface is to be set and said substrate surface to at least one of said light receiving system, said calculating circuit, and said substrate shifting system.

3. A plane positioning apparatus comprising:

a projecting system for projecting beams to a plurality of given portions on a substrate surface;

a light receiving system including a plurality of photoelectric elements to receive individually reflective beams respectively from a plurality of given portions on said substrate surface and output photoelectric signals in accordance with variation of light receiving positions;

a calculating circuit for outputting individually deviation signals in accordance with each of deviation amounts with respect to a fiducial plane predetermined at a plurality of given portions on said substrate surface based on each of said plural photoelectric signals;

a shifting system for shifting said substrate in a direction perpendicular to said fiducial plane or a direction inclined to said fiducial plane in accordance with at least one of said deviation signals;

a detecting device for individually detecting level variation characteristics of each deviation signal generated at a time of displacing each of a plurality of given portions on said substrate surface and said fiducial plane in a direction perpendicular to said fiducial plane interrelatedly within a range having substantially a linearly relationship with said deviation amounts;

a calculating device for calculating each of values of inclination of said level variation characteristics at a point where each of a plurality of given portions on said substrate surface is substantially matched with said fiducial plane; and a correcting device for individually correcting an allowable level variation range set for each of said level variation characteristics in accordance with a calculated value of inclination for each of said plurality of given portions in order to make uniform an allowable range of deviation values for each of said plurality of given portions.

4. A plane positioning apparatus comprising:

a shifting system for holding a substrate to be positioned substantially in parallel to a given fiducial plane and shifting the substrate in a direction perpendicular to said fiducial plane;

a multipoint measuring system having a plurality of measuring points set on a surface of said substrate to measure positional deviation amounts from said fiducial plane at said measuring points with respect to a direction perpendicular to said fiducial plane and output deviation signals corresponding to said deviation amounts at said measuring points;

a controller for controlling said shifting system in accordance with at least one of the deviation signals output at said measuring points;

a detecting device for detecting a ratio of level variation of said deviation signals with respect to variation of said deviation amounts for each of said measuring points; and a setting device for individually setting an allowable range of the level variation of said deviation signals at said measuring points in accordance with a detected rate of change per measuring point so as to make an allowable deviation amount from said fiducial plane substantially equal at each of the measuring points on said substrate when said substrate is positioned by said shifting system.

5. A plane positioning apparatus of claim 4, wherein a pattern image of a mask substrate is provided for a projection exposure apparatus for imaging on a photosensitive substrate by projection through an optical projection system, and said shifting system sets a position of either one of said mask substrate and said photosensitive substrate with regard to a plane perpendicular to an optical axis of said optical projection system as said fiducial plane.

6. A plane positioning apparatus of claim 5, wherein said projection exposure apparatus has a Z stage to hold said photosensitive substrate and cause it to be shifted in the direction of the optical axis of said optical projection system, and a fiducial board is arranged on said Z stage with the fiducial marks being formed thereon to measure the inclination or curvature of the projected image of said optical projection system with respect to said fiducial plane when said mask substrate is installed.

7. A projection exposure apparatus comprising:

an optical projection system to project and image a mask pattern in a given imaging surface;

an XY stage to hold a photosensitive substrate substantially in parallel with said imaging surface and to be shifted two dimensionally in a plane parallel to said imaging surface;

a Z stage to shift said photosensitive substrate in a direction of an optical axis of said optical projection system;

a first focus detecting system having measuring points at plural positions predetermined in a projection field of said optical projection system to detect a positional deviation of a surface of said photosensitive substrate in the direction of the optical axis at each of said measuring points;

a fiducial board arranged on a part of said Z stage with a light emitting portion being formed thereon to emit light with a given configuration;

a second focus detecting system for detecting a positional relationship of said fiducial board in the direction of the optical axis with said imaging surface in such a manner that when said light emitting portion is positioned at an arbitrary point in said projection field, rays of light reflected by said mask return to said fiducial board through said optical projection system, among those rays of light from said light emitting portion to reach said mask through said optical projection system, and are photoelectrically detected by shifting said Z stage;

a specifying device for specifying coordinate positions of said XY stage so that said light emitting portion is positioned in turn in each of the measuring points or positions close thereto by said first focus detecting system; and a calibrating system for calibrating detection errors by said first focus detecting system individually or averagely at each of said measuring points in accordance with each positional relationship detected by operating said second focus detecting system at each of the specified coordinate position.

8. A method for detecting plane positions comprising:

measuring a positional deviation amount between a given fiducial plane and an inspecting surface in a direction perpendicular to said fiducial plane at each of plural measuring points set on the inspecting surface;

classifying said plural measuring points into at least two groups in accordance with a surface condition within said inspecting surface, at the same time determining weighting coefficients to be given to said deviation amounts per group; and detecting a position of said inspecting surface in a direction perpendicular to said fiducial plane by giving said determined weighting coefficients to said deviation amounts, at the same time averaging a sum of deviation amounts subsequent to said giving of weighting coefficients.

9. An apparatus for detecting plane positions comprising:

a projection system for projecting a pattern light on an inspecting surface;

a light receiving system for receiving said pattern light reflected by said inspecting surface to output signals corresponding to the pattern light;

an input device for inputting information regarding position of said inspecting surface to be measured;

a selecting device for dividing a pattern image into a plurality of portions to selectively detect at least two portions of said pattern image in accordance with the information from said input device;

a first position detecting system for output ting a first detection signal corresponding to a height position of said inspecting surface for each of said pattern image portions;

a weighting device to give a weighting coefficient to weight each of said first detection signals; and a second position detecting system for averaging a sum of said weighted signals by a sum of the weighting coefficients so that a second detection signal corresponding to the height of said inspecting surface is outputted.

10. An apparatus for detecting plane positions of claim 9, wherein said weighting device includes a determining device for determining at least one of said weighting coefficients to be different from other weighting coefficients.

11. An apparatus for detecting plane positions comprising:

a projection system for projecting a pattern light on an inspecting surface;

a light receiving system for receiving said pattern light reflected by said inspecting surface to output signals corresponding to a pattern light receiving position;

an input device for inputting information regarding a position of said inspecting surface to be measured;

a selecting device for dividing a pattern image into a plurality of portions to selectively detect at least two portions of said pattern image in accordance with the information from said input device;

a first position detecting system for outputting a first detection signal corresponding to a height position of said inspecting surface for each of said portions of said pattern image;

a weighting device for classifying said pattern image portions into predetermined groups to give a weighting coefficient to weight each of signals obtained by averaging a sum of said first detection signals by a number of said pattern image portions in a group for each of said groups; and a second position detecting system for averaging a sum of said weighted signals by a sum of the weighting coefficients so that a second detection signal corresponding to the height of said inspecting surface is outputted.

12. An apparatus for detecting plane positions comprising:

a multipoint measuring system having a plurality of measuring points set on an inspecting surface to measure positional deviation amounts from a fiducial plane at each of said plurality of measuring points with respect to a direction perpendicular to the fiducial plane, and output deviation signals corresponding to said deviation amounts at the measuring points;

a determining device for classifying said measuring points at least into two groups, at the same time determining weighting coefficients to weight said deviation signals for each of said groups; and a position detecting system for giving said determined weighting coefficients to said deviation signals, and averaging a sum of the weighted signals so that a detection signal corresponding to the height of said inspecting surface is outputted.

13. An apparatus for detecting plane positions comprising:

a projection system for projecting a pattern light on an inspecting surface;

a light receiving system for receiving said pattern light reflected by said inspecting surface to output signals corresponding to a pattern light receiving portion;

an input device for inputting information regarding a position of said inspecting surface to be measured;

a first selecting device for dividing said pattern image into a plurality of portions to selectively detect at least two portions of said pattern image in accordance with the information from said input device;

a position detecting system for outputting detection signals corresponding to height positions of said inspecting surface for each of said pattern image portions;

a second selecting device for selecting at least two of said detection signals corresponding to local areas having substantially the same height positions on said inspecting surface; and an inclination detecting system for detecting inclination of said inspecting surface from a difference between at least two detection signals selected by said second selection device.

14. An apparatus for detecting plane position of claim 13, wherein said second selecting device selects at least two detection signals at least at each of two local areas on said inspecting surface, and said inclination detecting system includes a calculating circuit to obtain said difference per each local area and sets an inclination of said inspecting surface to minimize a sum of the signal difference per each local area.

15. An apparatus for detecting plane positions comprising:

a multipoint detecting system having plural measuring points in a projection field of an optical projection system and detecting a deviation amount of a surface of a photosensitive substrate exposed with a mask pattern through the optical projection system in a direction of an optical axis of said optical projection system at each of said measuring points;

a stage capable of mounting said photosensitive substrate thereon, and movable in the direction of the optical axis of said optical projection system;

a first position detecting system for detecting first detection signals corresponding to deviation amounts of said substrate surface from an imaging plane of said optical projection system at each of at least two measuring points among said plural measuring points;

a weighting device for giving a weighting coefficient to weight each of said first detection signals; and a second position detecting system for averaging a sum of the weighted signals by a sum of the weighting coefficients so that a second detection signal corresponding to a deviation amount of a predetermined plane of said substrate from said imaging plane is outputted.

16. An apparatus according to claim 15, wherein said first position detecting system has a circuit for selecting at least two of the plural measuring points in accordance with a surface condition of said photosensitive substrate.

17. An apparatus for detecting plane positions comprising:

a multipoint detecting system having plural measuring points in a projection field of an optical projection system and detecting a deviation amount of a surface of a photosensitive substrate exposed with a mask pattern through the optical projection system in a direction of an optical axis of said optical projection system at each of said measuring points;

a stage capable of mounting said photosensitive substrate thereon, and movable in the direction of the optical axis of said optical projection system;

a first position detecting system for detecting first detection signals corresponding to deviation mounts of said substrate surface from an imaging plane of said optical projection system at each of at least two measuring points among said plural measuring points;

a weighting device for classifying said at least two measuring points into predetermined groups to give a weighting coefficient to weight each of signals obtainable by averaging a sum of said first detection signals by a number of said measuring points in a group for each of said groups; and a second position detecting system for averaging a sum of the weighted signals by a sum of the weighting coefficients so that a second detection signal corresponding to a deviation amount of a predetermined plane of said substrate from said imaging plane is outputted.

18. An apparatus for detecting plane positions comprising:

a multipoint detecting system having plural measuring points in a projection field of an optical projection system and detecting a deviation amount of a surface of a photosensitive substrate exposed with a mask pattern through the optical projection system in a direction of an optical axis of said optical projection system at each of said measuring points;

a position detecting system for detecting detection signals corresponding to height positions of said substrate surface at each of at least two measuring points among said plural measuring points;

a selecting device for selecting at least two detection signals corresponding to said substrate surface having substantially the same height positions among said detection signals; and an inclination detecting system for detecting inclination of said substrate surface in accordance with a difference between at least two detection signals selected by said selecting device.

19. An apparatus according to claim 18, further comprising:

a system for inclining said substrate in accordance with the detected inclination so that said surface of said substrate is made substantially parallel to an imaging plane of said projection optical system.

20. An apparatus according to claim 19, wherein said inclining system comprises a leveling stage capable of holding and inclining said substrate, and a system for driving said leveling stage so that said surface of said substrate is made substantially parallel to said imaging plane of said projection optical system.

21. An apparatus according to claim 18, wherein said position detecting system has a circuit for selecting at least two of the plural measuring points in accordance with a surface condition of said photosensitive substrate.

22. A projection exposure apparatus comprising:

a projection optical system for imaging and projecting a pattern of a mask onto a photosensitive substrate;

a substrate stage holding said photosensitive substrate thereon and inclinable with respect to an imaging plane of said projection optical system;

an inclination detecting system for detecting inclination of a surface of said photosensitive substrate independently of said projection optical system;

a pattern board provided on said substrate stage and having a predetermined fiducial pattern;

an illuminating system for applying illuminating light of substantially the same wavelength as that of illuminating light for exposure from an underside of said pattern board to said fiducial pattern;

a photoelectric detector for receiving light created from said fiducial pattern and applied to a pattern surface of said mask through said projection optical system and reflected by said pattern surface and returned through said projection optical system and said fiducial pattern;

a detecting system for detecting a focus position of said projection optical system based on a detection signal output from said photoelectric detector when said pattern board and the imaging plane of said projection optical system are moved relative to each other in a direction of an optical axis of said projection optical system;

a calculating device for finding the imaging plane of said projection optical system based on a focus position at each of a plurality of different positions in a projection field of said projection optical system;

a controller for controlling inclination of said substrate stage in conformity with the found imaging plane so that the imaging plane of said projection optical system and a surface of said pattern board may substantially coincide with each other; and a calibrating system for calibrating said inclination detecting system so that said inclination detecting system may detect the surface of said pattern board as a fiducial surface when the imaging plane of said projection optical system and the surface of said pattern board are made substantially coincident with each other by said controller.

23. A projection exposure apparatus comprising:

a projection optical system for imaging and projecting a pattern of a mask onto a photosensitive substrate;

a substrate stage holding said photosensitive substrate thereon and movable in a direction of an optical axis of said projection optical system and a direction perpendicular to the direction of said optical axis;

a pattern board provided on said substrate stage and having a predetermined fiducial pattern;

an illuminating system for applying illuminating light of substantially the same wavelength as that of illuminating light for exposure from an underside of said pattern board to said fiducial pattern;

a photoelectric detector for receiving light created from said fiducial pattern and applied to a pattern surface of said mask through said projection optical system and reflected by said pattern surface and returned through said projection optical system and said fiducial pattern;

a measuring system for measuring position of a particular mark on said mask in a plane perpendicular to the optical axis of said projection optical system based on a detection signal output from said photoelectric detector when the light created from said fiducial pattern is applied to said particular mark; and a detecting system for detecting a focus position at a predetermined point in a projection field of said projection optical system based on a detection signal output from said photoelectric detector when said pattern board and an imaging plane of said projection optical system are moved relative to each other in the direction of the optical axis of said projection optical system.

24. A projection exposure apparatus comprising:

a projection optical system for projecting a pattern on a mask onto a substrate;

a system for measuring a position or a positional deviation of a substrate surface along an optical axis of said projection optical system, at each of plural measuring points in a projection field of said projection optical system; and a detecting system for weighting and averaging the measured positions or positional deviations so as to detect a single deviation between an imaging plane of said projection optical system and the substrate surface, along a direction of the optical axis.

25. An apparatus according to claim 24, wherein said detecting system has a device for selecting at least two of the measured positions or positional deviations in accordance with a surface condition of said substrate, and a device for respectively weighting each of the selected positions or positional deviations, said detecting system performing processing to average the weighted positions or positional deviations.

26. An apparatus according to claim 24, wherein said detecting system has a device for selecting at least two of the measured positions or positional deviations in accordance with a surface condition of said substrate, and a device for grouping each of the at least two of the measured positions or positional deviations and for respectively weighting average positions or positional deviations obtained by averaging a sum of the at least two of the measured positions or positional deviations with a number of data at each group, said detecting system performing processing to average the weighted positions or positional deviations.

27. An apparatus according to claim 24, further comprising:

a driving system for relatively moving the imaging plane of said projection optical system and said substrate along the direction of the optical axis in accordance with a detected single deviation so that the imaging plane and the substrate surface are substantially coincident with each other.

28. An apparatus according to claim 27, wherein said driving system comprises a stage capable of holding said substrate and moving together therewith along the direction of the optical axis, and a member for driving said stage so that the imaging plane and the substrate surface are substantially coincident with each other.

29. An apparatus according to claim 24, further comprising:

a stage capable of holding said substrate and moving together therewith along the direction of the optical axis; and a controller for controlling the stage to allow said substrate surface and said imaging plane to be matched in accordance with said single deviation.

* * * * *